United States Patent
Kim et al.

(10) Patent No.: US 12,391,713 B2
(45) Date of Patent: *Aug. 19, 2025

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Sangdong Kim, Seongnam-si (KR); Seungyeon Kwak, Suwon-si (KR); Sungjun Kim, Seongnam-si (KR); Jongsoo Kim, Suwon-si (KR); Aram Jeon, Seoul (KR); Sunggyu Kang, Suwon-si (KR); Hyun Koo, Seongnam-si (KR); Jiwhan Kim, Seoul (KR); Sukekazu Aratani, Hwaseong-si (KR); Kum Hee Lee, Suwon-si (KR); Yongsuk Cho, Hwaseong-si (KR); Yuri Cho, Suwon-si (KR); Byoungki Choi, Hwaseong-si (KR); Jongwon Choi, Yongin-si (KR); Hyeonho Choi, Seoul (KR); Youngki Hong, Anyang-si (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 734 days.

This patent is subject to a terminal disclaimer.

(21) Appl. No.: 16/830,660

(22) Filed: Mar. 26, 2020

(65) Prior Publication Data
US 2020/0308203 A1 Oct. 1, 2020

(30) Foreign Application Priority Data

Mar. 29, 2019 (KR) .................. 10-2019-0037217
Mar. 25, 2020 (KR) .................. 10-2020-0036054

(51) Int. Cl.
| | |
|---|---|
| *C07F 15/00* | (2006.01) |
| *C09K 11/06* | (2006.01) |
| *H10K 50/11* | (2023.01) |
| *H10K 85/30* | (2023.01) |
| *H10K 101/10* | (2023.01) |

(52) U.S. Cl.
CPC .......... *C07F 15/0033* (2013.01); *C09K 11/06* (2013.01); *H10K 85/342* (2023.02); *C09K 2211/185* (2013.01); *H10K 50/11* (2023.02); *H10K 2101/10* (2023.02)

(58) Field of Classification Search
CPC . C07F 15/0033; H01L 51/0085; C09K 11/06; C09K 2211/185; H10K 85/342; H10K 50/11; H10K 2101/10
See application file for complete search history.

(56) References Cited

U.S. PATENT DOCUMENTS

| | | | |
|---|---|---|---|
| 7,776,458 | B2 | 8/2010 | Ragini et al. |
| 8,492,006 | B2 | 7/2013 | Ma et al. |
| 9,142,791 | B2 | 9/2015 | Adamovich et al. |
| 9,466,804 | B2 | 10/2016 | Kishino et al. |
| 9,554,442 | B2 | 1/2017 | Kamatani et al. |
| 9,917,264 | B2 | 3/2018 | Horiuchi et al. |
| 9,960,370 | B2 | 5/2018 | Kishino et al. |
| 10,144,867 | B2 | 12/2018 | Ma et al. |
| 10,741,772 | B2 | 8/2020 | Lee et al. |
| 11,758,802 | B2 * | 9/2023 | Lee .................. C09K 11/06 428/690 |

(Continued)

FOREIGN PATENT DOCUMENTS

| | | |
|---|---|---|
| CN | 107722065 A | 2/2018 |
| CN | 107827933 A | 3/2018 |

(Continued)

OTHER PUBLICATIONS

English Abstract of CN 107722065.

(Continued)

*Primary Examiner* — Dylan C Kershner
(74) *Attorney, Agent, or Firm* — CANTOR COLBURN LLP

(57) ABSTRACT

Disclosed are an organometallic compound represented by Formula 1, an organic light-emitting device including the same, and an electronic device including the organic light-emitting device:

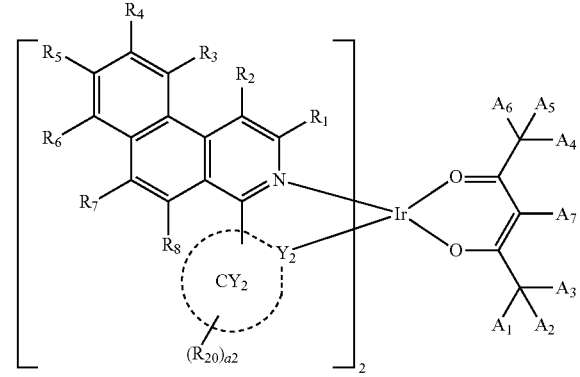

Formula 1

The detailed description of Formula 1 is the same as described in the present specification.

18 Claims, 1 Drawing Sheet

(56) References Cited

U.S. PATENT DOCUMENTS

| | | | |
|---|---|---|---|
| 11,760,769 B2* | 9/2023 | Lee | C07F 15/0033 |
| | | | 428/690 |
| 11,800,788 B2* | 10/2023 | Choi | H10K 85/342 |
| 2006/0228582 A1* | 10/2006 | Ragini | H05B 33/14 |
| | | | 546/10 |
| 2010/0219407 A1* | 9/2010 | Kamatani | H01L 51/0034 |
| | | | 257/E51.026 |
| 2010/0270916 A1* | 10/2010 | Xia | H10K 85/622 |
| | | | 546/10 |
| 2012/0217868 A1* | 8/2012 | Ma | H10K 85/342 |
| | | | 546/4 |
| 2013/0334521 A1 | 12/2013 | Lee et al. | |
| 2014/0197389 A1 | 7/2014 | Adamovich et al. | |
| 2015/0001472 A1* | 1/2015 | Boudreault | H01L 51/0085 |
| | | | 546/4 |
| 2015/0021585 A1 | 1/2015 | Yu et al. | |
| 2015/0295188 A1* | 10/2015 | Kosuge | H01L 51/0054 |
| | | | 345/173 |
| 2015/0357587 A1 | 12/2015 | Kishino et al. | |
| 2015/0357588 A1 | 12/2015 | Kwong et al. | |
| 2016/0240800 A1 | 8/2016 | Ma et al. | |
| 2018/0013078 A1 | 1/2018 | Lee et al. | |
| 2018/0198079 A1 | 7/2018 | Boudreault et al. | |
| 2018/0233679 A1 | 8/2018 | Baik et al. | |
| 2019/0013484 A1 | 1/2019 | Kamatani et al. | |
| 2019/0305230 A1 | 10/2019 | Xia et al. | |
| 2020/0099000 A1* | 3/2020 | Zhang | C07F 15/0033 |
| 2020/0212319 A1* | 7/2020 | Choi | C09B 69/008 |
| 2020/0308201 A1* | 10/2020 | Lee | C09K 11/06 |
| 2020/0313095 A1* | 10/2020 | Lee | C09K 11/06 |
| 2021/0193938 A1* | 6/2021 | Kwak | H10K 85/342 |
| 2021/0355148 A1* | 11/2021 | Choi | C07F 15/0033 |
| 2022/0352476 A1* | 11/2022 | Boudreault | H10K 85/622 |

FOREIGN PATENT DOCUMENTS

| | | |
|---|---|---|
| JP | 2014127688 A | 7/2014 |
| JP | 2014139147 A | 7/2014 |
| KR | 20060108127 A1 | 10/2006 |
| KR | 20120026064 A1 | 3/2012 |
| KR | 20140020277 A | 2/2014 |
| KR | 101468065 B1 | 12/2014 |
| KR | 1020160026744 A | 3/2016 |
| KR | 1020180005128 A | 1/2018 |
| KR | 20180082339 A1 | 7/2018 |
| KR | 1020200083198 A | 7/2020 |
| KR | 1020200115008 A | 10/2020 |
| WO | 2014007564 A1 | 1/2014 |
| WO | 2014104395 A1 | 7/2014 |

OTHER PUBLICATIONS

English Abstract of CN107827933.
English Abstract of KR 10-1468065.
Extended European Search Report issued in EP20165793.9, dated May 27, 2020.
Shiu-Lun Lai, et al., High Efficiency White Organic Light-Emitting Devices Incorporating Yellow Phosphorescent Platinum(II) Complex and Composite Blue Host, Adv. Funct. Mater. 2013, 23, 5168-5176.
XP055694699 "Transition metal coordination compound used as phosphor material, it's preparation method and application in organic electroluminescence device", 3 pages.
English Translation of Office Action dated May 18, 2023, issued in corresponding KR Patent Application No. 10-2020-0036054, 7 pp.
Office Action dated May 18, 2023, issued in corresponding KR Patent Application No. 10-2020-0036054, 8 pp.
English Translation of Office Action dated Mar. 19, 2024, issued in corresponding KR Application No. 10-2020-0036054, 4 pp.
Office Action dated Mar. 19, 2024, issued in corresponding KR Application No. 10-2020-0036054, 5 pp.

* cited by examiner

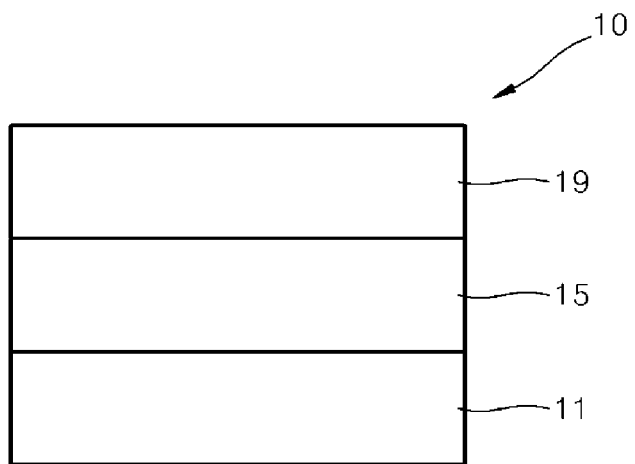

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims the priority and benefit of Korean Patent Applications Nos. 10-2019-0037217, filed on Mar. 29, 2019, and 10-2020-0036054, filed on Mar. 25, 2020, in the Korean Intellectual Property Office, the content of which is incorporated herein in its entirety by reference.

BACKGROUND

1. Field

One or more embodiments relate to an organometallic compound, an organic light-emitting device including the same, and an electronic apparatus including the organic light-emitting device.

2. Description of Related Art

Organic light-emitting devices are self-emission devices, which have improved characteristics in terms of a viewing angle, a response time, brightness, a driving voltage, and a response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

One or more embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

According to one aspect, provided is an organometallic compound represented by Formula 1.

An organometallic compound represented by Formula 1 below.

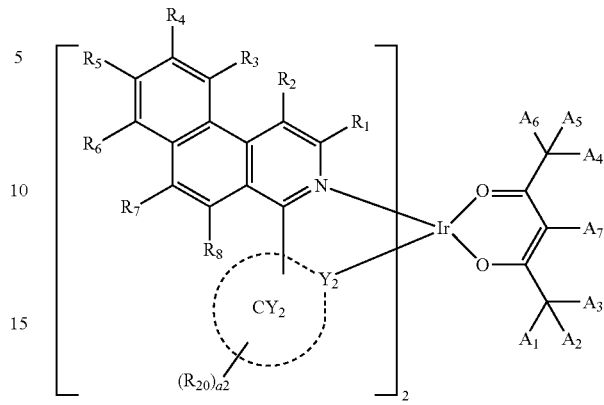

Formula 1

In Formula 1, $Y_2$ may be C, ring $CY_2$ may be a $C_5$-$C_{30}$ carbocyclic group or a $C_1$-$C_{30}$ heterocyclic group, $R_1$ to $R_8$, $R_{20}$, and $A_1$ to $A_7$ may each independently be a group represented by Formula 2-1, a group represented by Formula 2-2, hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$B(Q_6)(Q_7)$, —$P(=O)(Q_8)(Q_9)$, or —$P(Q_8)(Q_9)$, $$*—Si(Z_1)(Z_2)(Z_3) \quad \text{Formula 2-1}$$

$$*—Ge(Z_{11})(Z_{12})(Z_{13}) \quad \text{Formula 2-2}$$

$Z_1$ to $Z_3$ and $Z_{11}$ to $Z_{13}$ in Formulae 2-1 and 2-2 may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$) or —P($Q_8$)($Q_9$), and * indicates a binding site to a neighboring atom, a2 is an integer of 0 to 20, wherein, when a2 is 2 or more, two or more of $R_{20}$(s) are identical to or different from each other, at least one of $R_1$ to $R_8$, at least one of $R_{20}$(s) in the number of a2, or any combination thereof is independently a group represented by Formula 2-1 or a group represented by Formula 2-2, two or more of $R_1$ to $R_8$ are optionally linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more $R_{20}$(s) in the number of a2 are optionally linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $A_1$ to $A_7$ are optionally linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, $R_{1a}$ is the same as described in connection with $A_7$, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof, —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$), or any combination thereof, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group which is unsubstituted or substituted with deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group which is unsubstituted or substituted with deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

According to another aspect, provided is an organic light-emitting device including a first electrode, a second electrode, and an organic layer including an emission layer disposed between the first electrode and the second electrode, wherein the organic layer includes at least one organometallic compound represented by Formula 1.

The organometallic compound may be included in the emission layer of the organic layer, and the organometallic compound included in the emission layer may act as a dopant.

According to another aspect, provided is an electronic apparatus including the organic light-emitting device.

BRIEF DESCRIPTION OF THE DRAWING

The above and other aspects, features, and advantages of certain embodiments of the disclosure will be more apparent from the following description taken in conjunction with FIGURE which shows a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURES It will be understood that relative terms are intended to encompass different orientations of the device in addition to the orientation depicted in the FIGURES For example, if the device in one of the FIGURES is turned over, elements described as being on the "lower" side of other elements would then be oriented on "upper" sides of the other elements The exemplary term "lower," can, therefore, encompasses both an orientation of "lower" and "upper," depending on the particular orientation of the FIGURE Similarly, if the device in one of the FIGURES is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1 below:

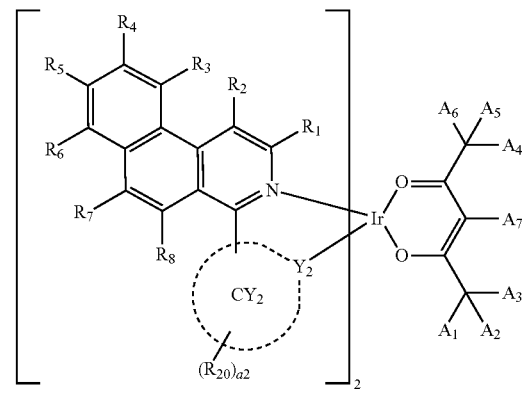

Formula 1

$Y_2$ in Formula 1 may be C.

Ring $CY_2$ in Formula 1 may be a $C_5$-$C_{30}$ carbocyclic group or a $C_1$-$C_{30}$ heterocyclic group.

For example, ring $CY_2$ in Formula 1 may be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, ring $CY_2$ in Formula 1 may be, cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, borole group, phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $CY_2$ in Formula 1 may be a benzene group, a naphthalene group, a 1,2,3,4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group.

In one or more embodiments, ring $CY_2$ in Formula 1 may be a benzene group, a dibenzothiophene group, a dibenzofuran group, a carbazole group, a fluorene group, or a dibenzosilole group.

$R_1$ to $R_8$, $R_{20}$ and $A_1$ to $A_7$ in Formula 1 may each independently be a group represented by Formula 2-1, a group represented by Formula 2-2, hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$):

*—Si($Z_1$)($Z_2$)($Z_3$)  Formula 2-1

*—Ge($Z_{11}$)($Z_{12}$)($Z_{13}$)  Formula 2-2

$Z_1$ to $Z_3$ and $Z_{11}$ to $Z_{13}$ in Formulae 2-1 and 2-2 may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$) or —P($Q_8$)($Q_9$), and * indicates a binding site to a neighboring atom.

$Q_1$ to $Q_9$ are the same as described in the present specification.

$Z_1$ to $Z_3$ in Formula 2-1 may be identical to or different from each other.

$Z_{11}$ to $Z_{13}$ in Formula 2-2 may be identical to or different from each other.

a2 in Formula 1 indicates the number of $R_{20}$(s) and may be an integer from 0 to 20. When a2 is 2 or more, two or more of $R_{20}$(s) may be identical to or different from each other. For example, a2 may be an integer from 0 to 6.

At least one of $R_1$ to $R_8$ in Formula 1 (for example, one or two of $R_1$ to $R_8$), at least one of $R_{20}$(s) in the number of a2, or any combination thereof may independently be a group represented by Formula 2-1 or a group represented by Formula 2-2.

In one or more embodiments, $R_{20}$ in Formula 1 may not include a fluoro group (—F) and a cyano group. For example, $R_{20}$ may be a group that does not include a fluoro group (—F) or a cyano group.

For example, the remaining $R_1$ to $R_8$ which are (is) not the group represented by Formula 2-1 or 2-2, the remaining $R_{20}$(s) which are (is) not the group represented by Formula 2-1 or 2-2, $A_1$ to $A_7$ in Formula 1, and $Z_1$ to $Z_3$ and $Z_{11}$ to $Z_{13}$ in Formulae 2-1 and 2-2 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, $C_1$-$C_{20}$ alkyl group $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or $C_1$-$C_{20}$ alkylthio group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group(bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl)bicyclo[2.1.1] hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N(Q$_1$)(Q$_2$), —B(Q$_6$)(Q$_7$), —P(=O)(Q$_8$)(Q$_9$), or —P(Q$_8$)(Q$_9$), wherein $Q_1$ to $Q_9$ may each independently be:

deuterium, —F, —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, —CD$_2$CDH$_2$, —CF$_3$, —CF$_2$H, —CFH$_2$, —CH$_2$CF$_3$, —CH$_2$CF$_2$H, —CH$_2$CFH$_2$, —CHFCH$_3$, —CHFCF$_2$H, —CHFCFH$_2$, —CHFCF$_3$, —CF$_2$CF$_3$, —CF$_2$CF$_2$H, or —CF$_2$CFH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, $C_1$-$C_{10}$ alkyl group, a phenyl group, or any combination thereof.

In this regard, $R_{20}$ may not include a fluoro group and a cyano group.

In one or more embodiments, the remaining $R_1$ to $R_8$ which are (is) not a group represented by Formulae 2-1 or 2-2, the remaining $R_{20}$(s) which are (is) not a group represented by Formula 2-1 or 2-2, $A_1$ to $A_7$ in Formula 1, and $Z_1$ to $Z_3$ and Z to $Z_{13}$ in Formulae 2-1 and 2-2 may each independently be hydrogen, deuterium, —F, —$CH_3$, —$CD_3$, —$CD_2H$, —$CDH_2$, —$CF_3$, —$CF_2H$, —$CFH_2$, a $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-237, a group represented by one of Formulae 9-201 to 9-237 in which at least one hydrogen is substituted with deuterium, a group represented by one of Formulae 9-201 to 9-237 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, or a group represented by one of Formulae 10-201 to 10-350 in which at least one hydrogen is substituted with —F:

-continued
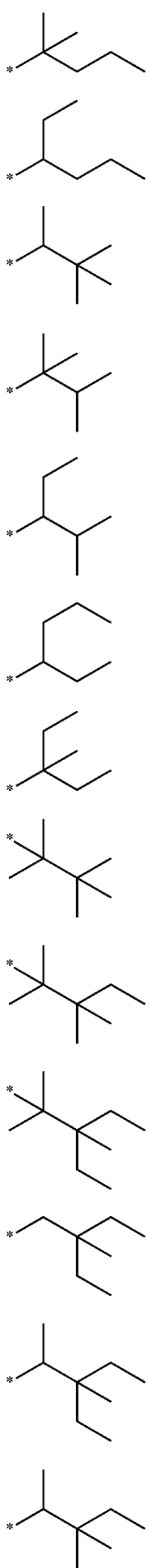
9-27
9-28
9-29
9-30
9-31
9-32
9-33
9-34
9-35
9-36
9-37
9-38
9-39
-continued
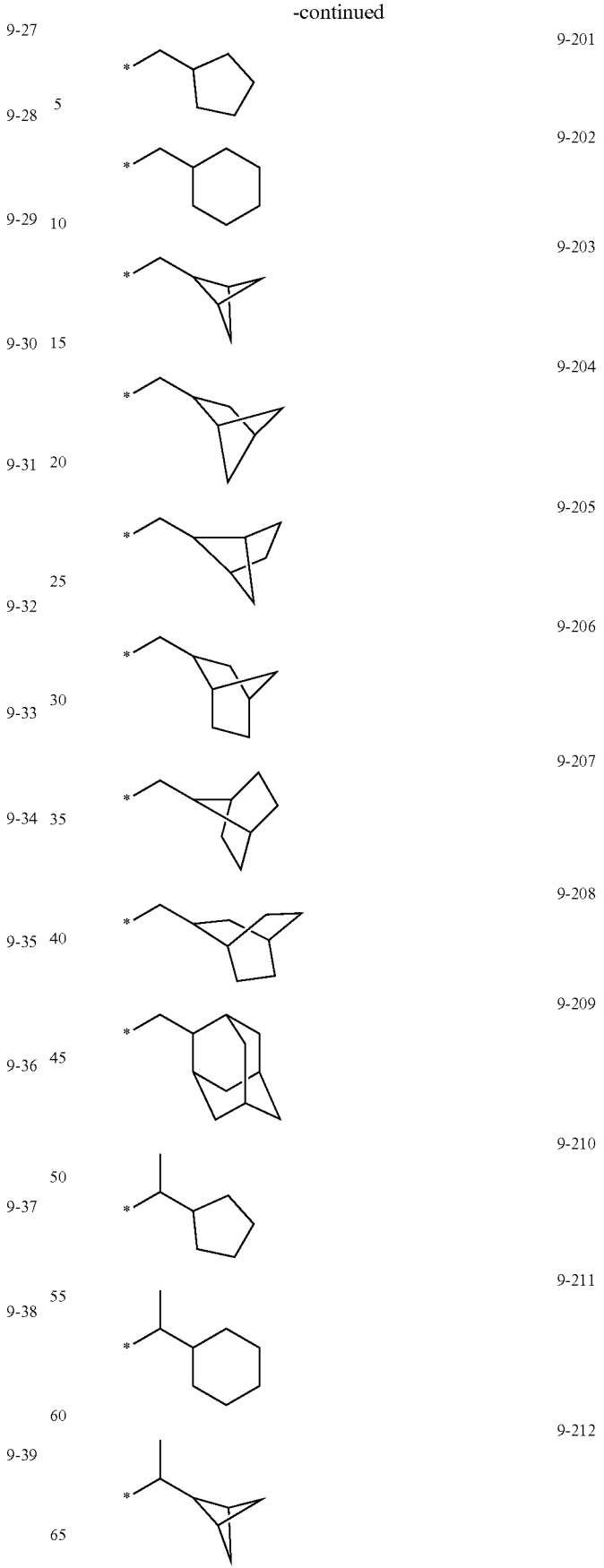
9-201
9-202
9-203
9-204
9-205
9-206
9-207
9-208
9-209
9-210
9-211
9-212

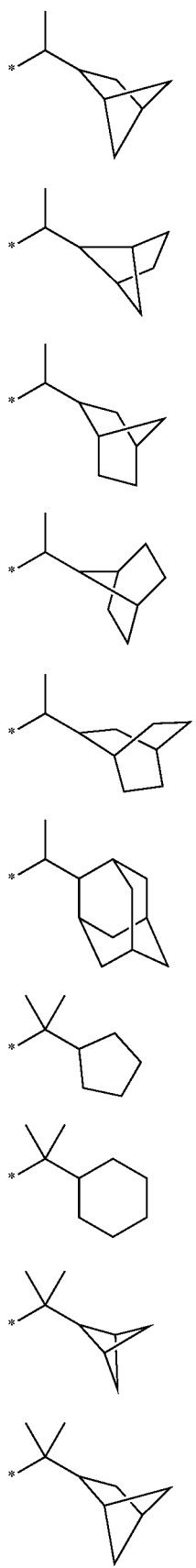
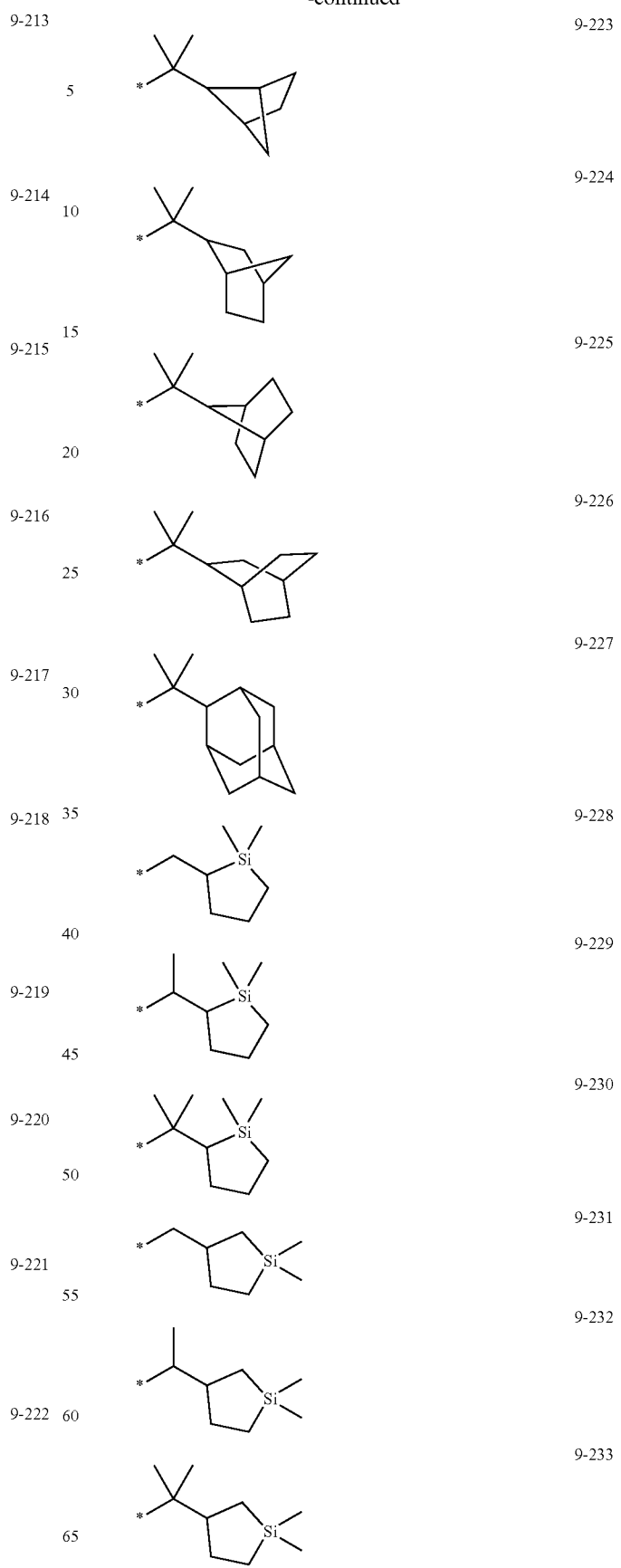

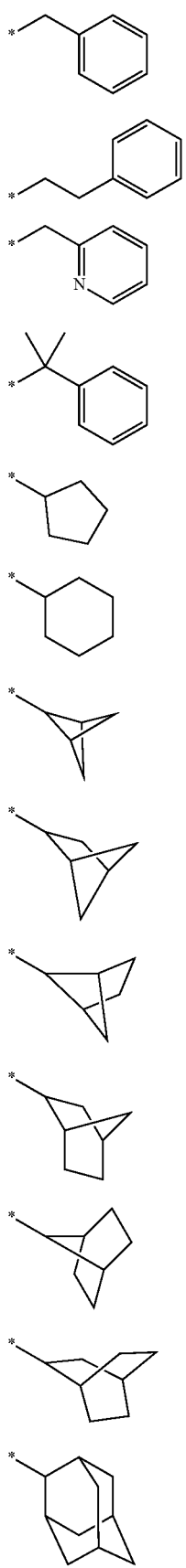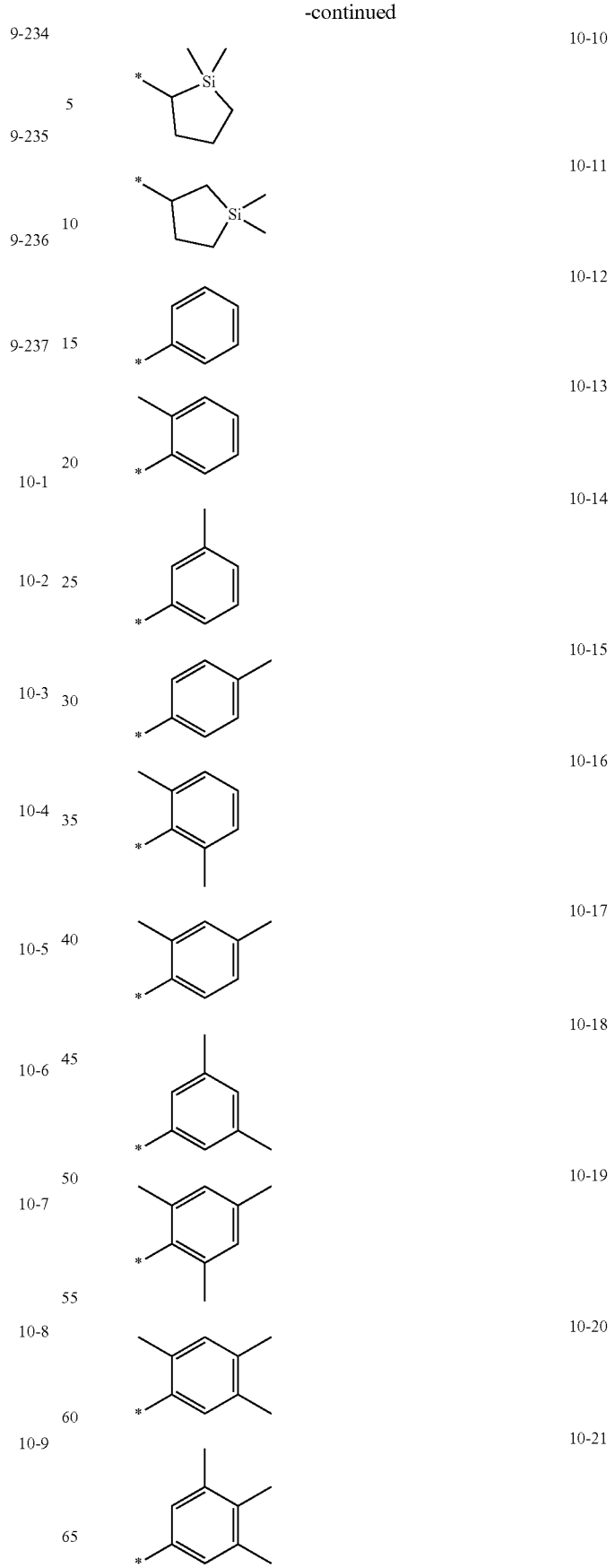

-continued
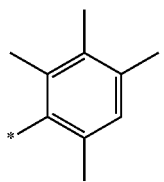
10-22
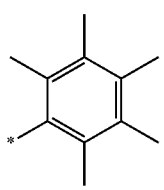
10-23
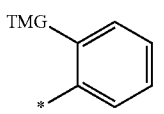
10-24
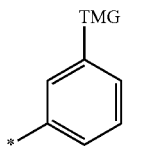
10-25
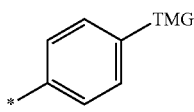
10-26
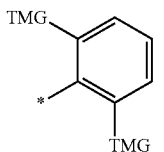
10-27
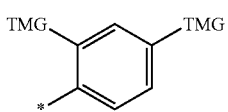
10-28
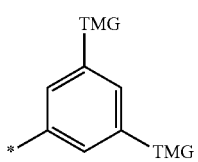
10-29
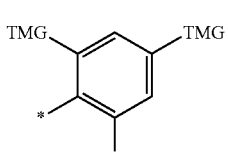
10-30
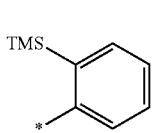
10-31
-continued
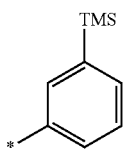
10-32
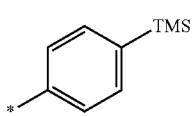
10-33
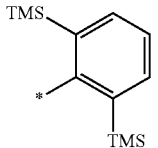
10-34
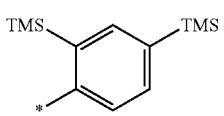
10-35
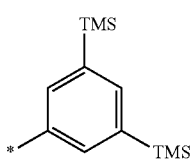
10-36
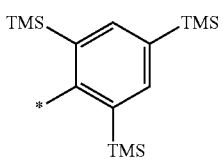
10-37
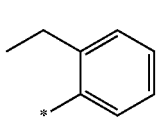
10-38
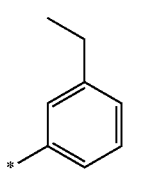
10-39
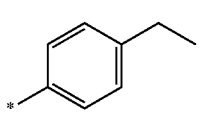
10-40
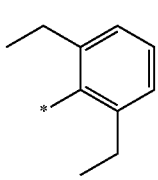
10-41
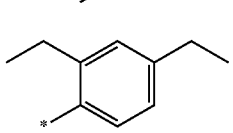
10-42

-continued
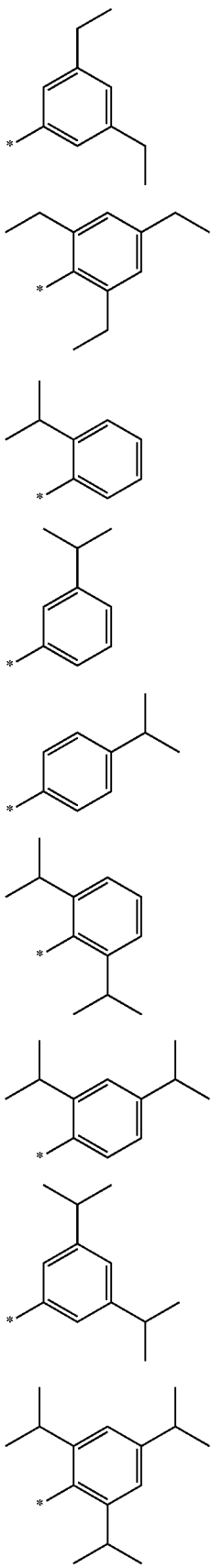
10-43
10-44
10-45
10-46
10-47
10-48
10-49
10-50
10-51
-continued
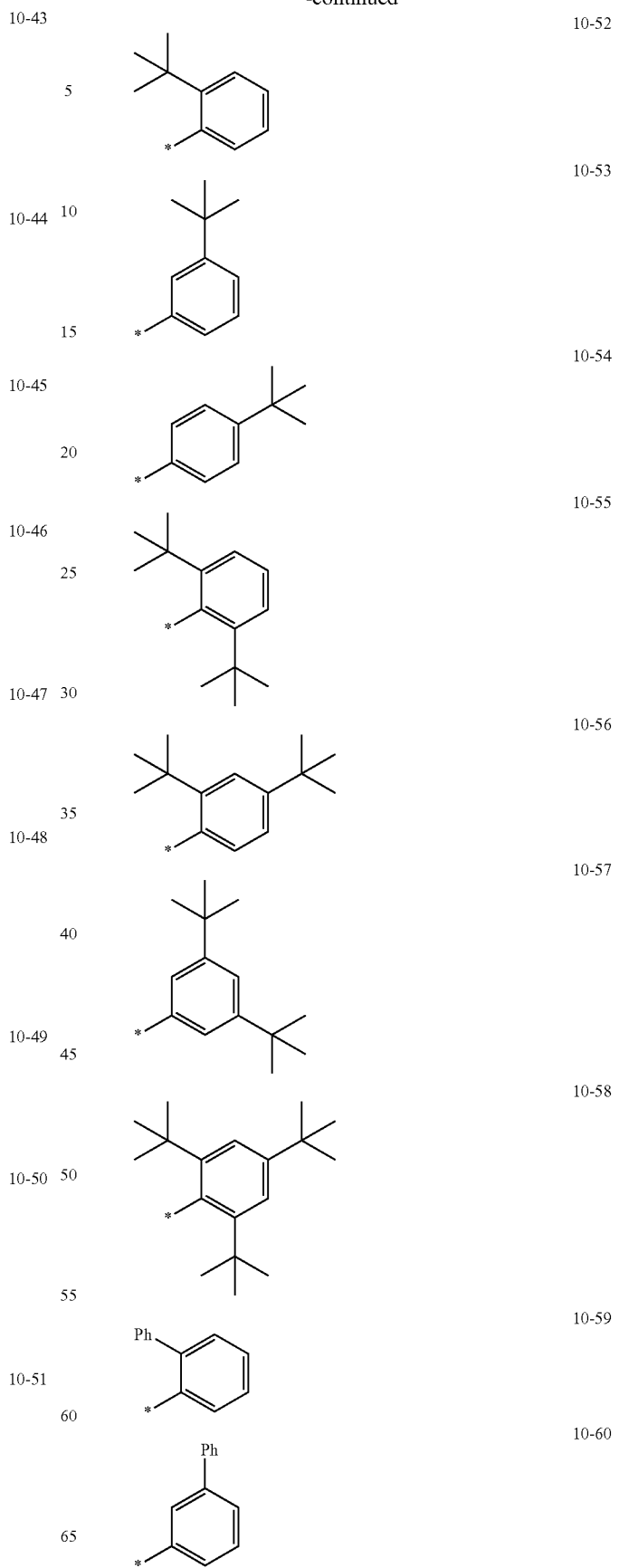
10-52
10-53
10-54
10-55
10-56
10-57
10-58
10-59
10-60

10-61 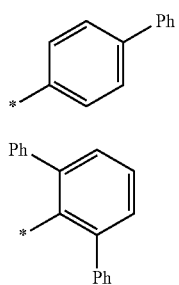
10-62 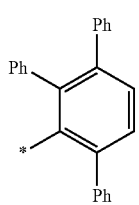
10-63 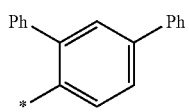
10-64 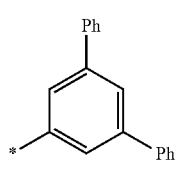
10-65 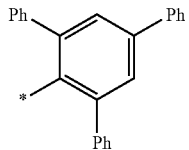
10-66 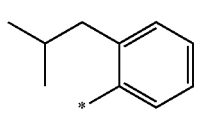
10-67 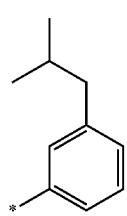
10-68 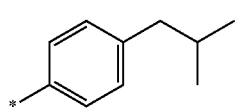
10-69 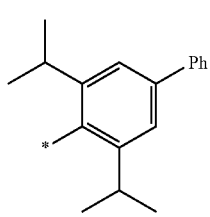
10-70 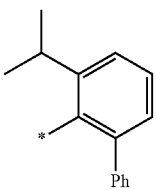
10-71 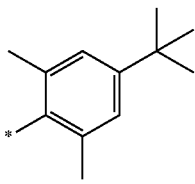
10-72 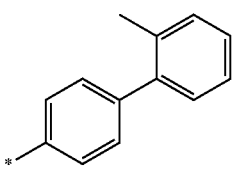
10-73 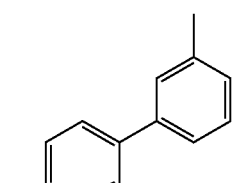
10-74 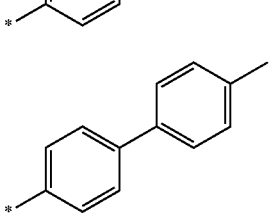
10-75 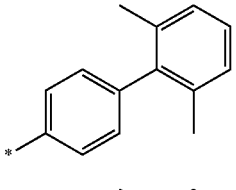
10-76 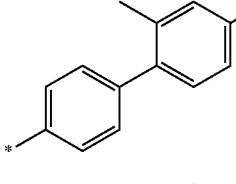
10-77 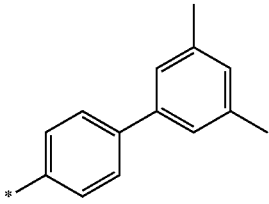
10-78

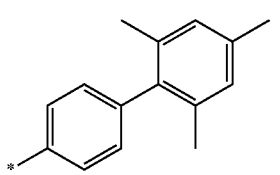
10-79
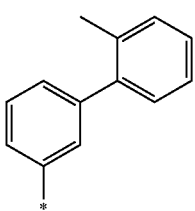
10-80
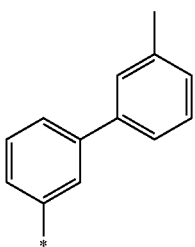
10-81
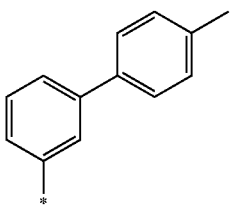
10-82
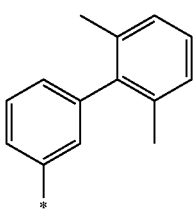
10-83
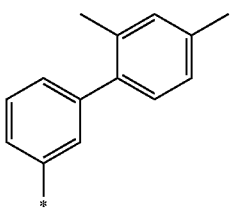
10-84
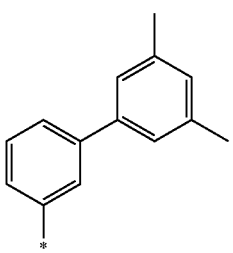
10-85
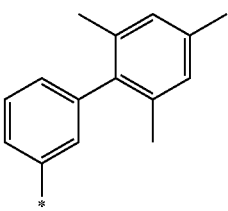
10-86
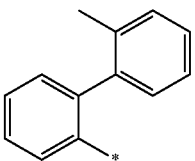
10-87
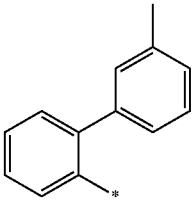
10-88
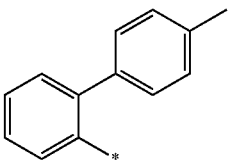
10-89
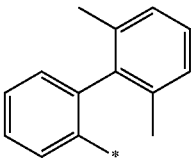
10-90
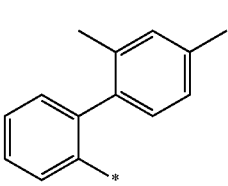
10-91
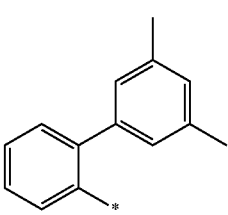
10-92
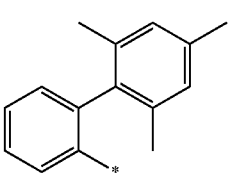
10-93

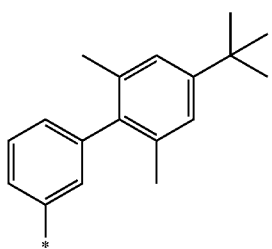
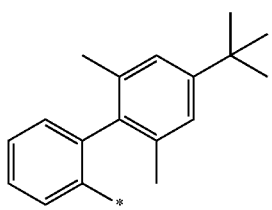
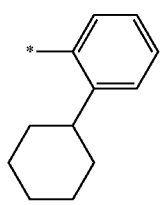
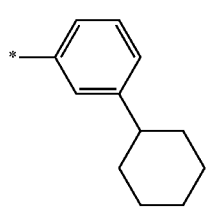
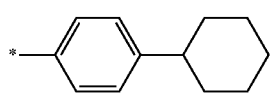
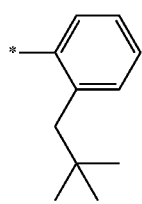
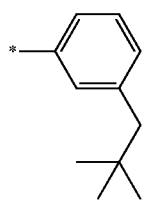
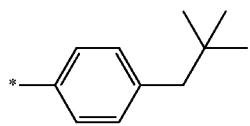
10-94
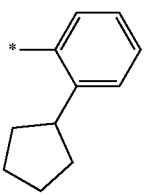
10-95
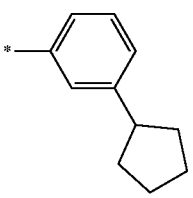
10-96
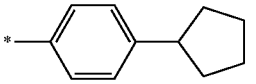
10-97
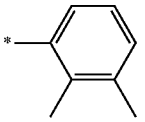
10-98
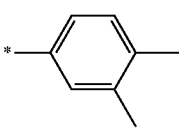
10-99
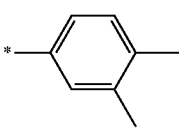
10-100
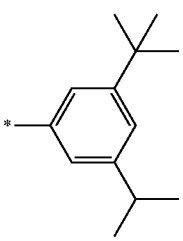
10-101
10-102
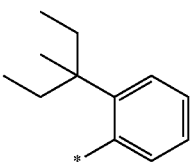
10-103
10-104
10-105
10-106
10-107
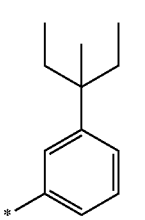
10-108
10-109
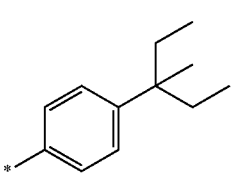
10-110

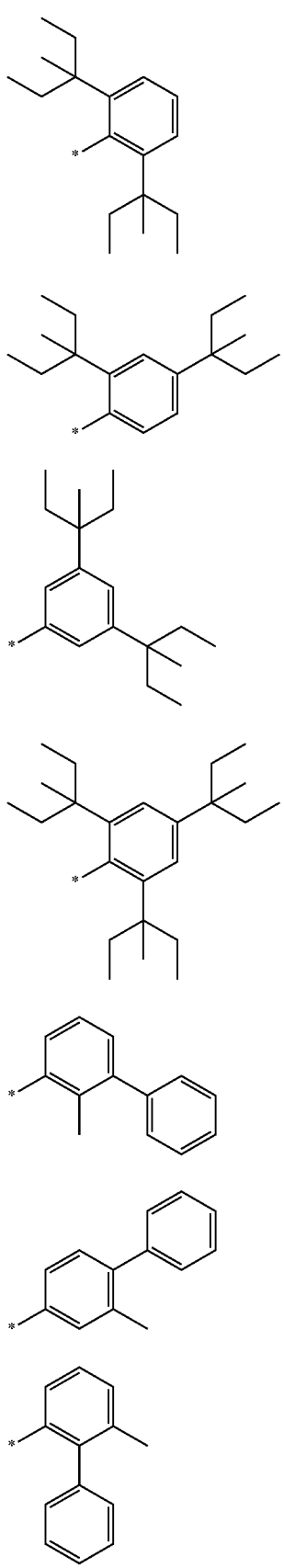
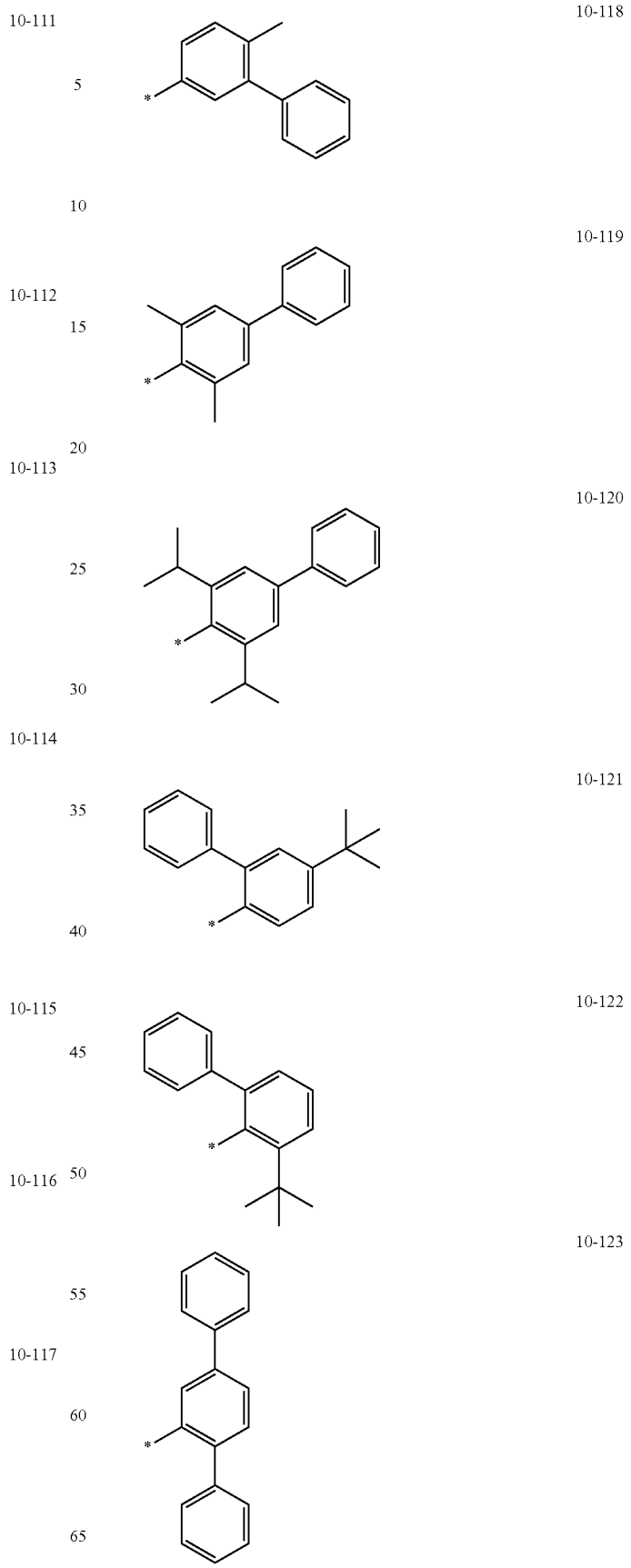

10-124 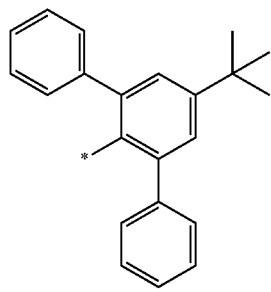
10-125 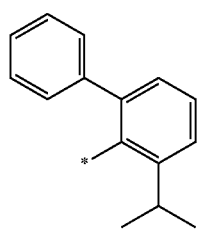
10-126 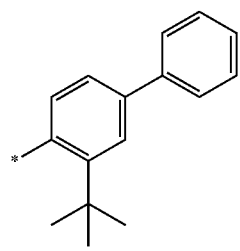
10-127 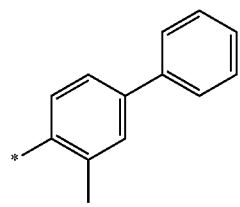
10-128 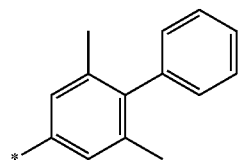
10-129 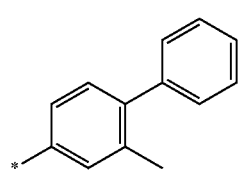
10-201 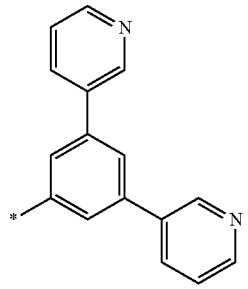
10-202 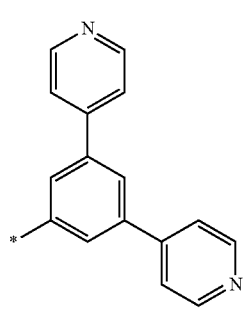
10-203 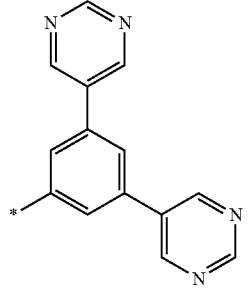
10-204 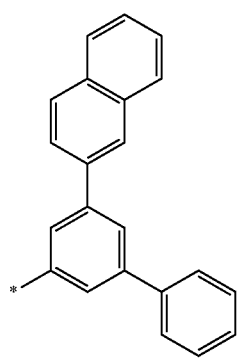
10-205 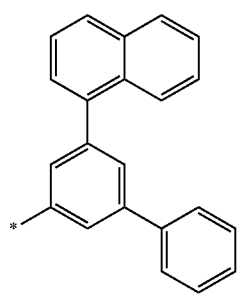

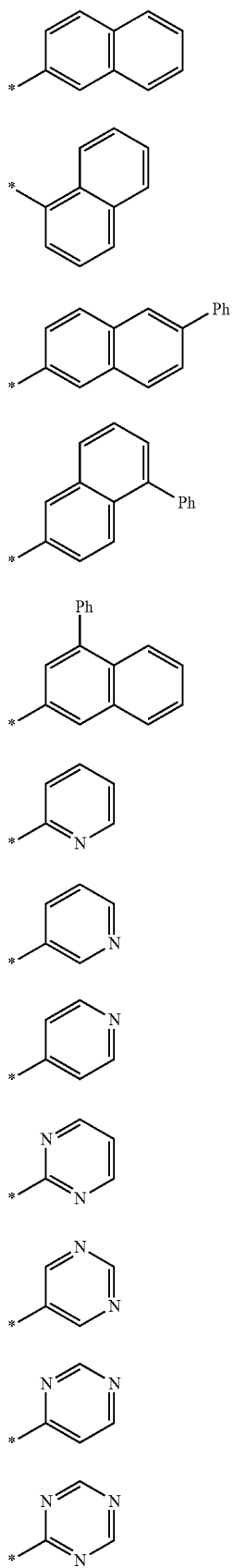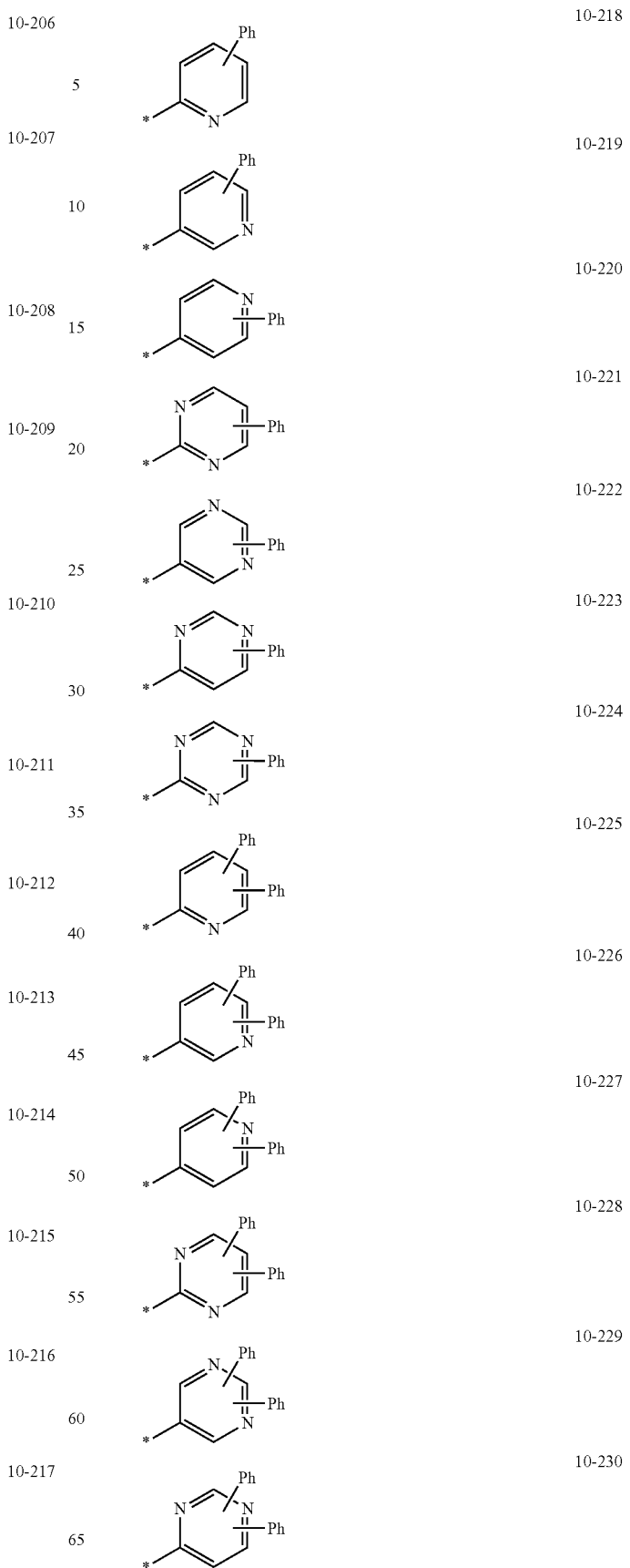

-continued
10-231 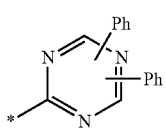
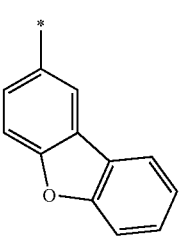 10-240
10-232 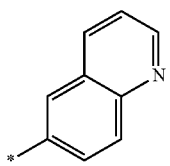
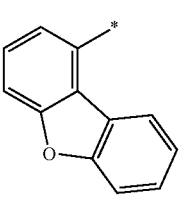 10-241
10-233 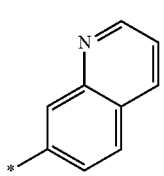
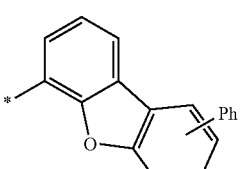 10-242
10-234 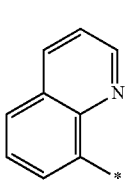
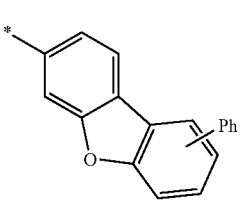 10-243
10-235 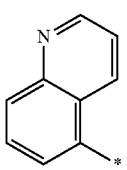
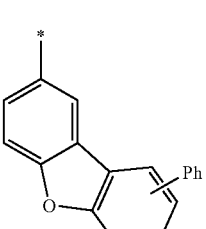 10-244
10-236 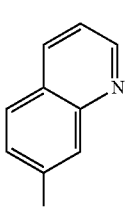
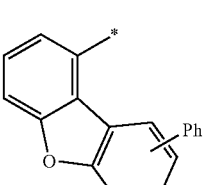 10-245
10-237 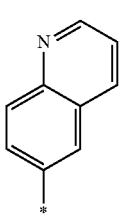
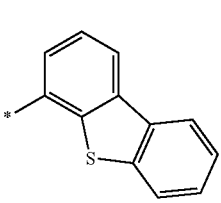 10-246
10-238 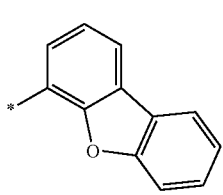
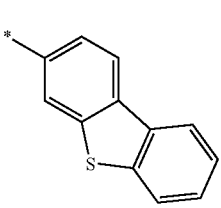 10-247
10-239 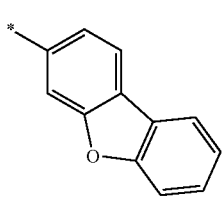

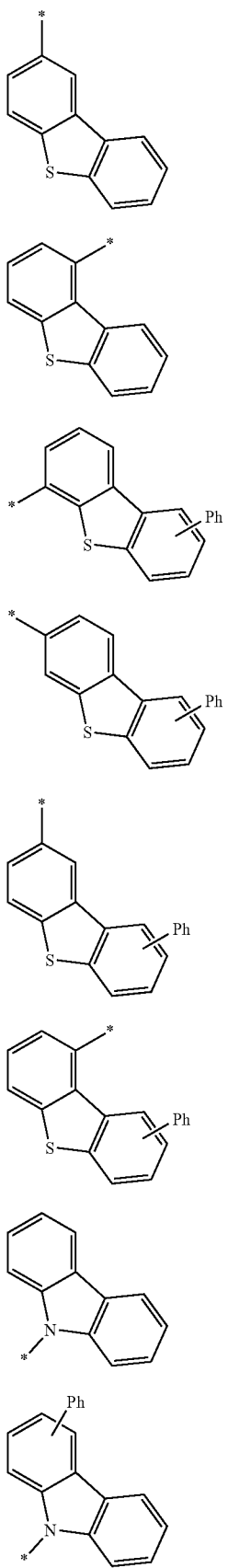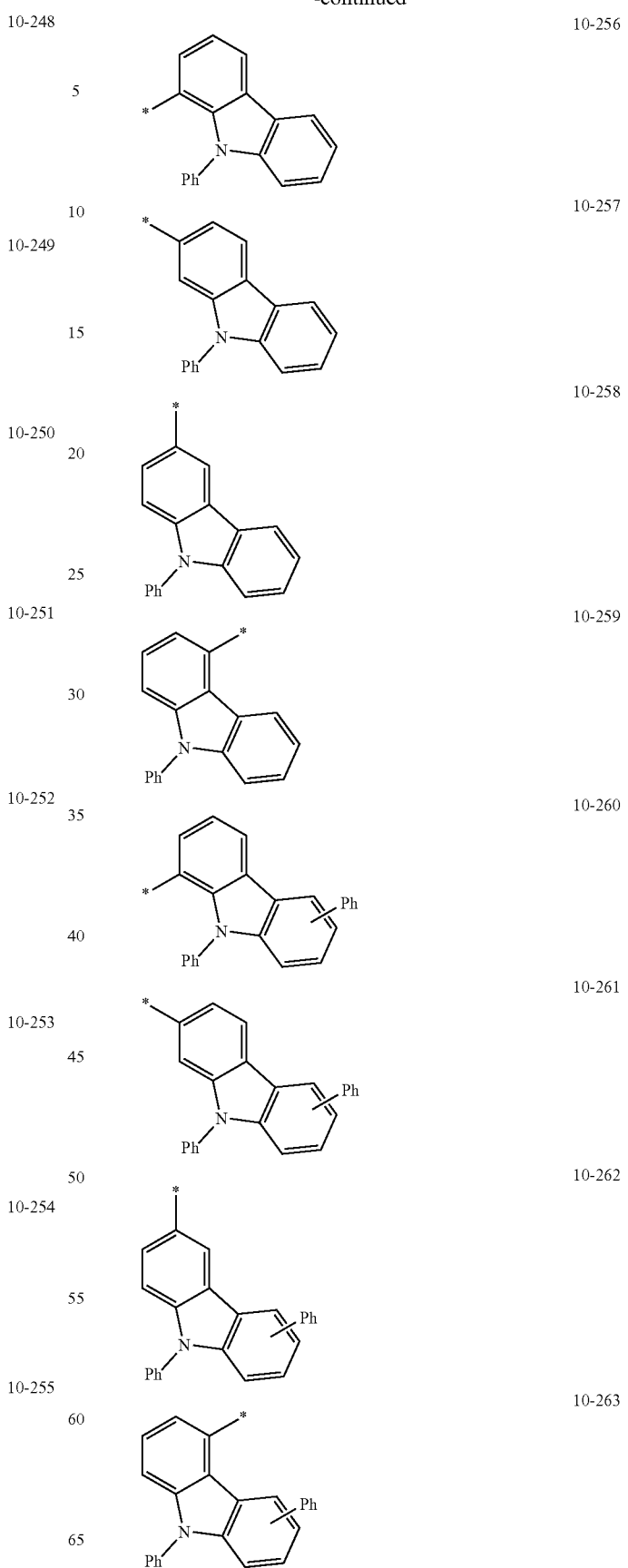

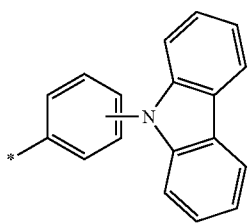
10-264
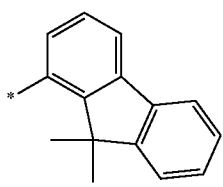
10-265
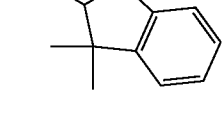
10-266
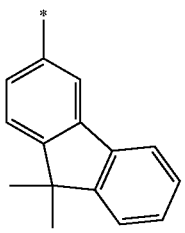
10-267
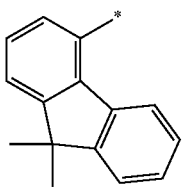
10-268
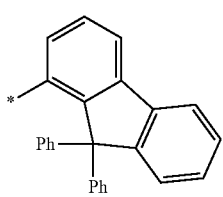
10-269
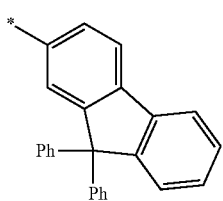
10-270
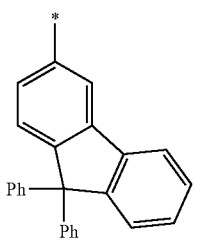
10-271
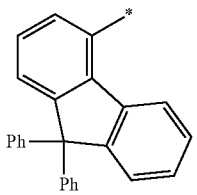
10-272
10-273
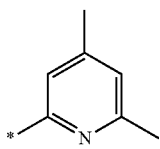
10-274
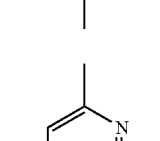
10-275
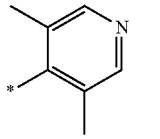
10-276
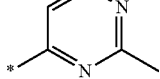
10-277
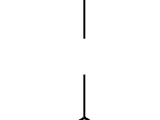
10-278
10-279
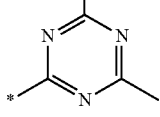

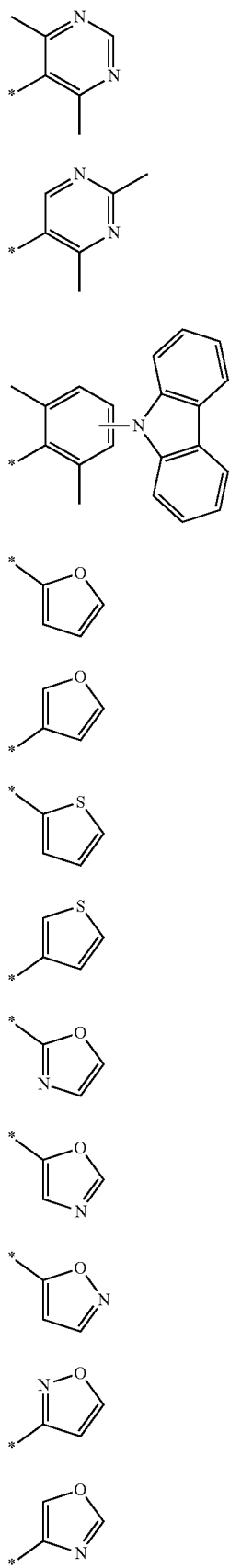

10-305 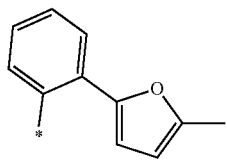
10-306 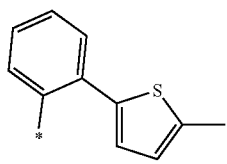
10-307 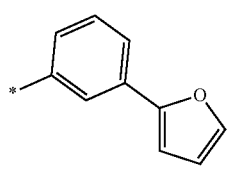
10-308 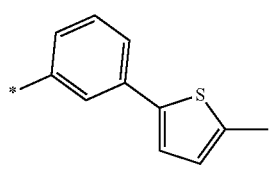
10-309 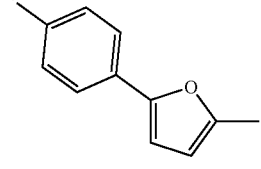
10-310 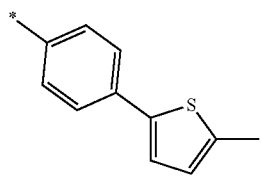
10-311 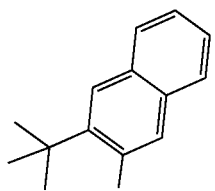
10-312 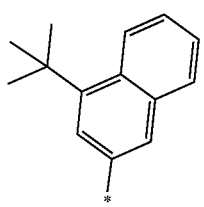
10-313 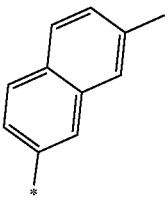
10-314
10-315
10-316
10-317
10-318
10-319

| | |
|---|---|
| 10-320 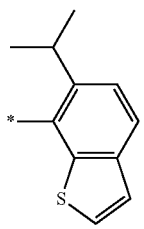 | 10-327 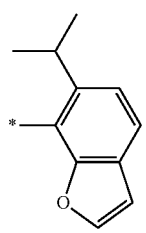 |
| 10-321 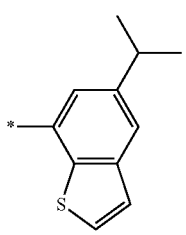 | 10-328 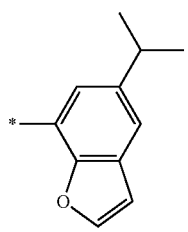 |
| 10-322 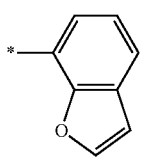 | 10-329 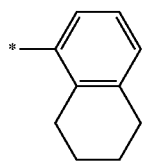 |
| 10-323 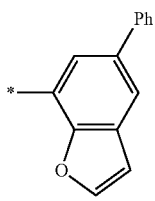 | 10-330 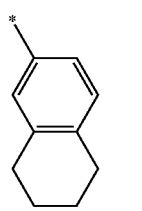 |
| 10-324 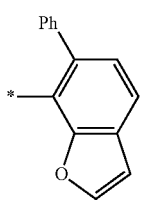 | 10-331 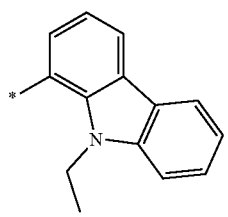 |
| 10-325 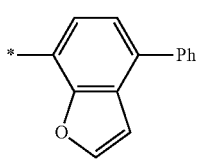 | 10-332 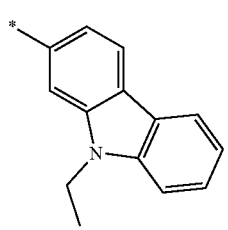 |
| 10-326 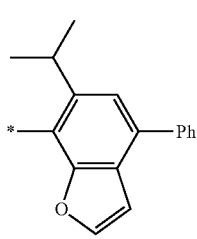 | 10-333 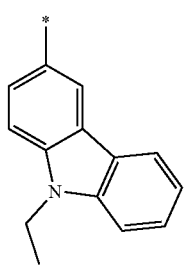 |

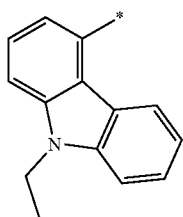
10-334

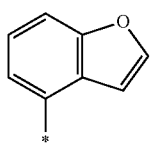
10-335

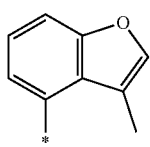
10-336

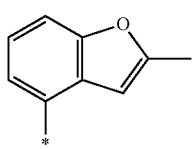
10-337

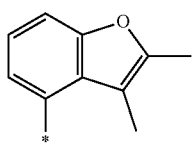
10-338

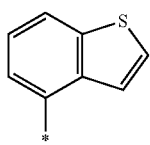
10-339

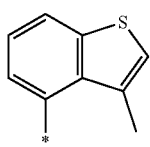
10-340

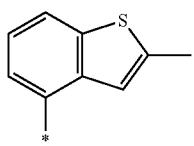
10-341

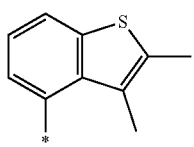
10-342

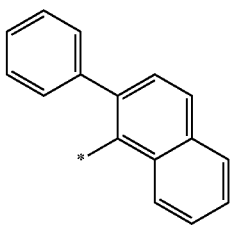
10-343

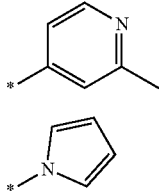
10-344

10-345

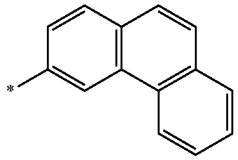
10-346

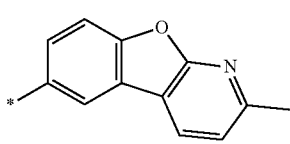
10-347

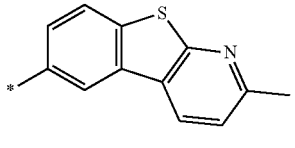
10-348

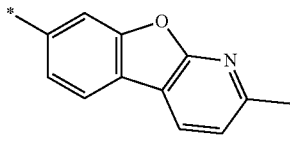
10-349

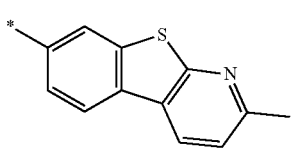
10-350

In Formulae 9-1 to 9-39, 9-201 to 9-237, 10-1 to 10-129, and 10-201 to 10-350, * indicates a binding site to a neighboring atom, Ph is a phenyl group, TMS is a trimethylsilyl group, and TMG is a trimethylgermyl.

The "group represented by one of Formulae 9-1 to 9-39 in which at least one hydrogen is substituted with deuterium" and the "group represented by one of Formulae 9-201 to 9-237 in which at least one hydrogen is substituted with deuterium" may be, for example, a group represented by one of Formulae 9-501 to 9-514 and 9-601 to 9-636:

9-501

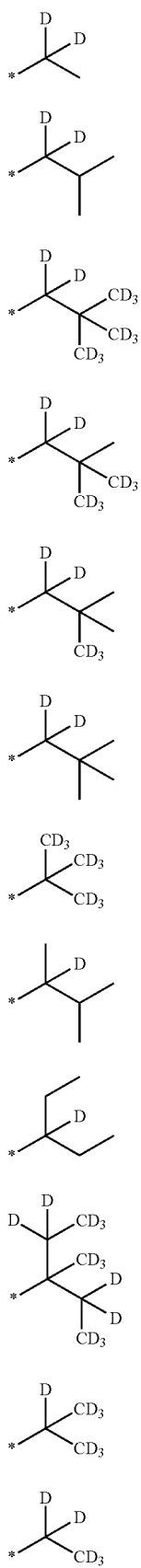
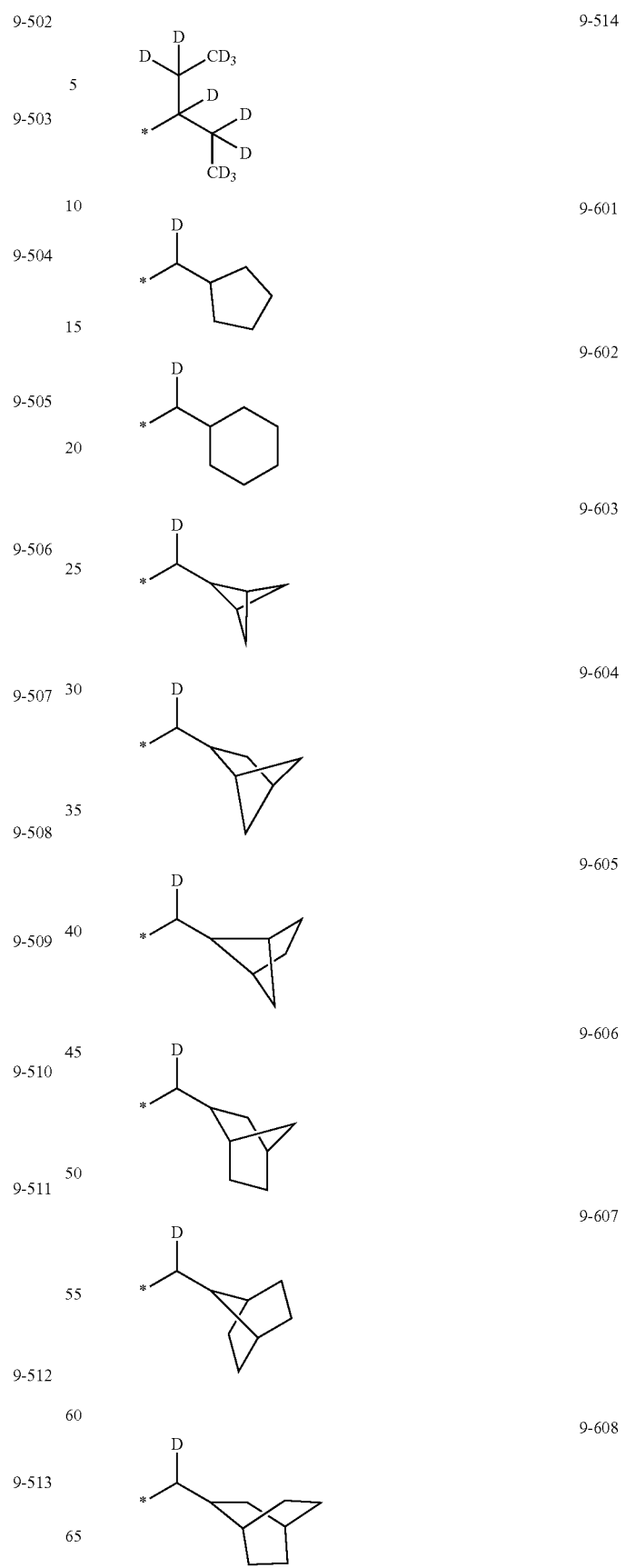

9-609 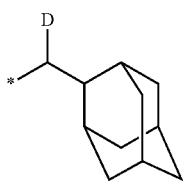
9-610 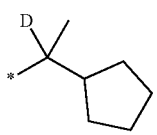
9-611 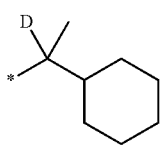
9-612 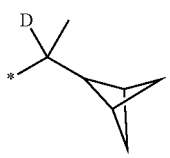
9-613 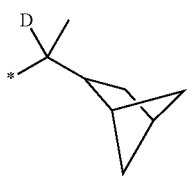
9-614 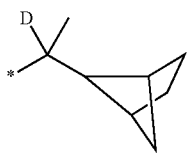
9-615 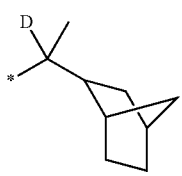
9-616 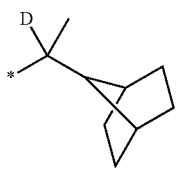
9-617 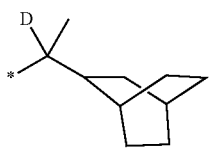
9-618 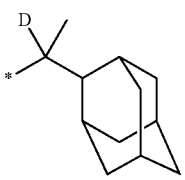
9-619 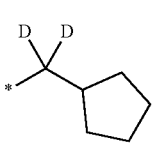
9-620 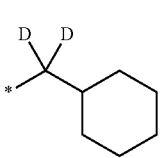
9-621 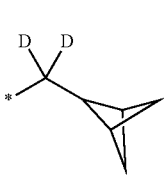
9-622 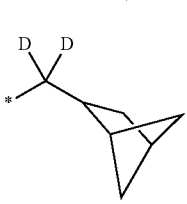
9-623 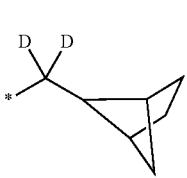
9-624 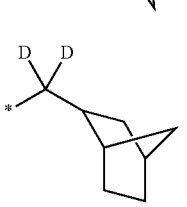
9-625 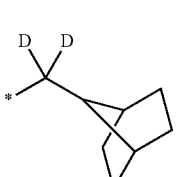
9-626 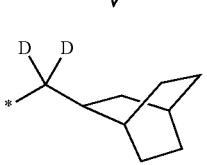

-continued 9-627 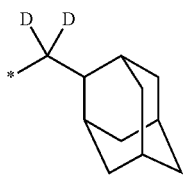

9-628 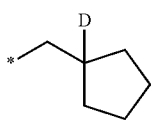

9-629 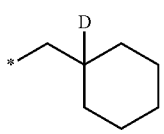

9-630 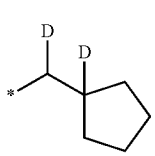

9-631 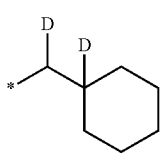

9-632 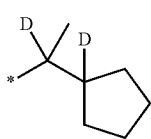

9-633 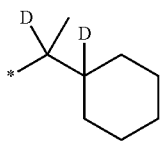

9-634 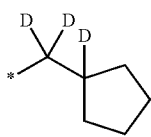

9-635 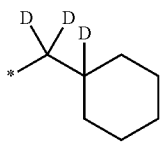

9-636 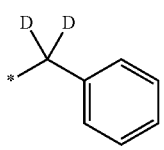

The "group represented by one of Formulae 9-1 to 9-39 in which at least one hydrogen is substituted with —F" and the "group represented by one of Formulae 9-201 to 9-237 in which at least one hydrogen is substituted with —F" may be, for example, a group represented by one of Formulae 9-701 to 9-710:

9-701 

9-702 

9-703 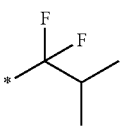

9-704 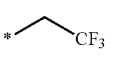

9-705 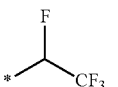

9-706 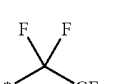

9-707 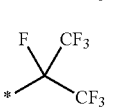

9-708 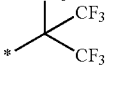

9-709 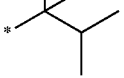

9-710 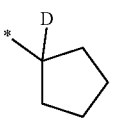

The "group represented by one of Formulae 10-1 to 10-129 in which at least one hydrogen is substituted with deuterium" and the "group represented by one of Formulae 10-201 to 10-350 in which at least one hydrogen is substituted with deuterium" may be, for example, a group represented by one of Formulae 10-501 to 10-553:

10-501 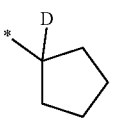

10-502 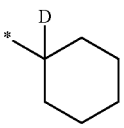

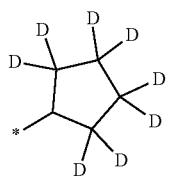
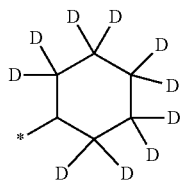
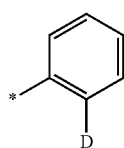
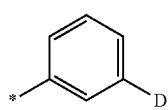
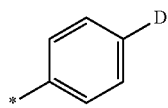
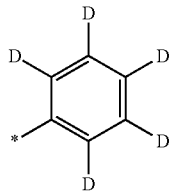
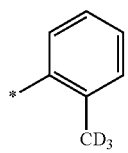
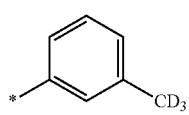
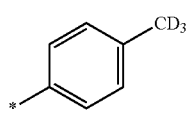
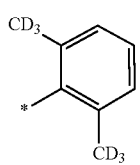
10-503
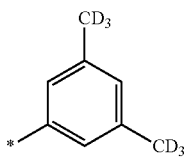
10-504
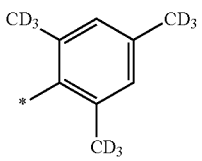
10-505
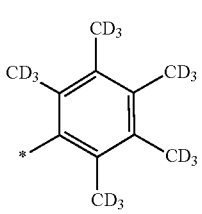
10-506
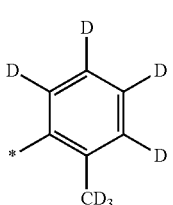
10-507
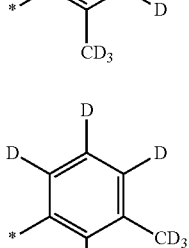
10-508
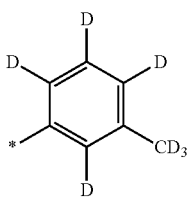
10-509
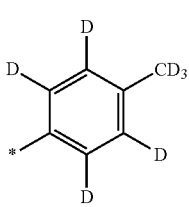
10-510
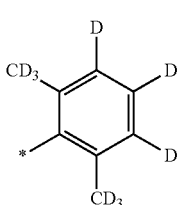
10-511
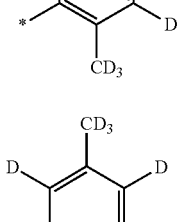
10-512
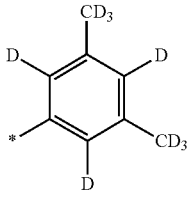
10-513
10-514
10-515
10-516
10-517
10-518
10-519
10-520

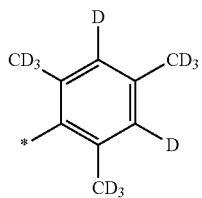
10-521 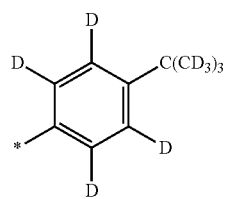
10-530
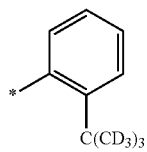
10-522 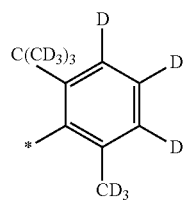
10-531
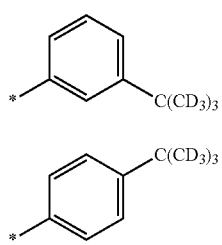
10-523
10-524 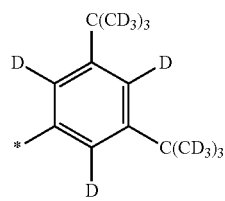
10-532
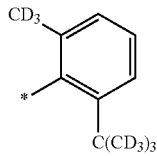
10-525
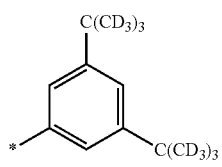
10-526 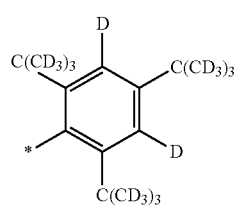
10-533
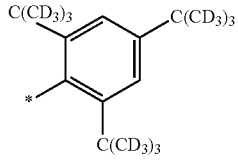
10-527 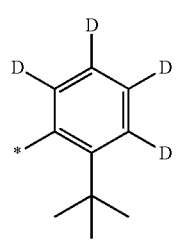
10-534
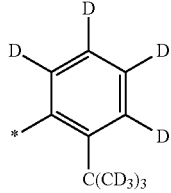
10-528 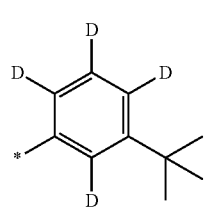
10-535
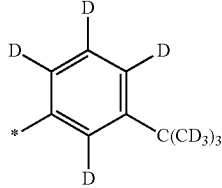
10-529 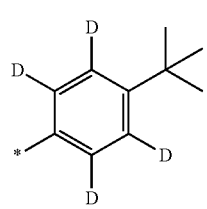
10-536

10-537 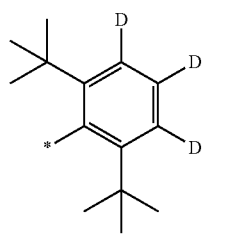
10-538 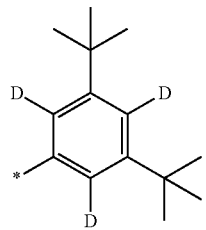
10-540 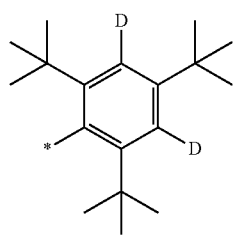
10-541 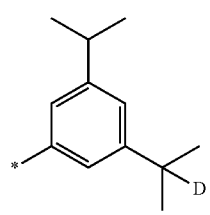
10-542 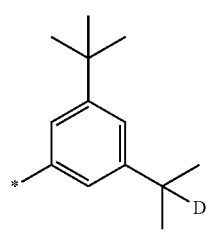
10-543 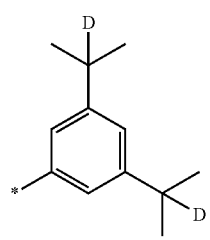
10-544 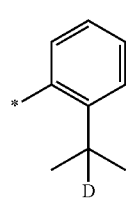
10-545 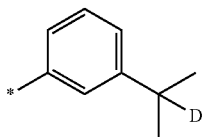
10-546 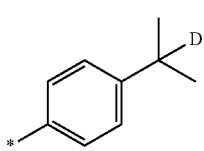
10-547 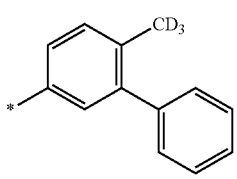
10-548 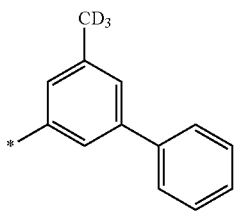
10-549 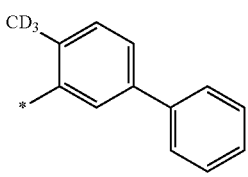
10-550 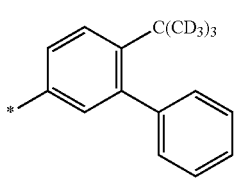
10-551 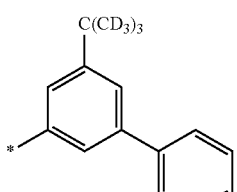
10-552

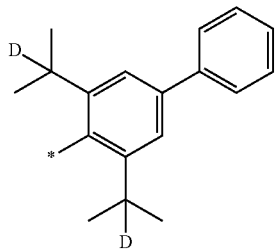
10-553
The "group represented by one of Formulae 10-1 to 10-129 in which at least one hydrogen is substituted with —F" and the "group represented by Formulae 10-201 to 10-350 in which at least one hydrogen is substituted with —F" may be, for example, a group represented by one of Formulae 10-601 to 10-617:
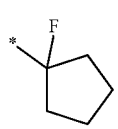
10-601
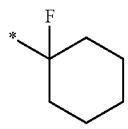
10-602
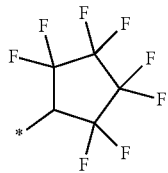
10-603
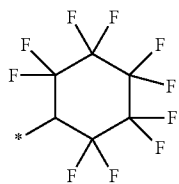
10-604
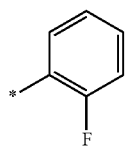
10-605
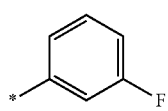
10-606
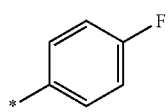
10-607
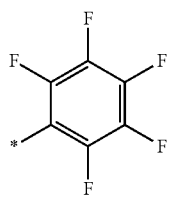
10-608
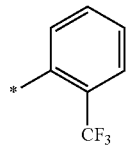
10-609
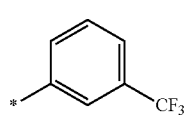
10-610
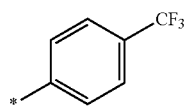
10-611
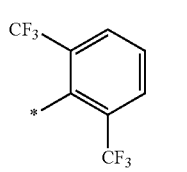
10-612
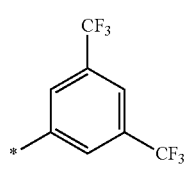
10-613
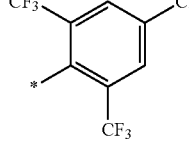
10-614
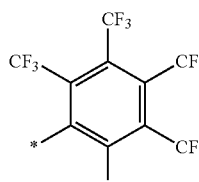
10-615
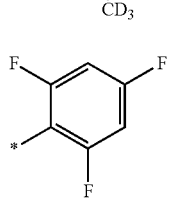
10-616

10-617

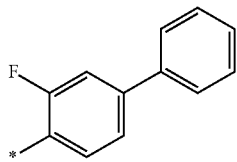

In Formula 1, i) two or more of $R_1$ to $R_8$ may optionally be linked to form a $C_5$-$C_{30}$ carbocyclic group that is unsubstituted or substituted with at least one $R_{1a}$ or a $C_1$-$C_{30}$ heterocyclic group that is unsubstituted or substituted with at least one $R_{1a}$, ii) two or more $R_{20}$(s) in the number of a2 may optionally be linked to form a $C_5$-$C_{30}$ carbocyclic group that is unsubstituted or substituted with at least one $R_{1a}$ or a $C_1$-$C_{30}$ heterocyclic group that is unsubstituted or substituted with at least one $R_{1a}$, and iii) two or more of $A_1$ to $A_7$ may optionally be linked to form a $C_5$-$C_{30}$ carbocyclic group that is unsubstituted or substituted with at least one $R_{1a}$ or a $C_1$-$C_{30}$ heterocyclic group that is unsubstituted or substituted with at least one $R_{1a}$.

$R_{1a}$ is the same as described in connection with $A_7$.

In one or more embodiments, $R_1$ to $R_8$, $R_{20}$ and $A_7$ in Formula 1 may each independently be a group represented by Formula 2-1, a group represented by Formula 2-2, hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted phenyl group, or a substituted or unsubstituted biphenyl group.

In one or more embodiments, $Z_1$ to $Z_3$ and $Z_{11}$ to $Z_{13}$ in Formulae 2-1 and 2-2 may each independently be hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted phenyl group, or a substituted or unsubstituted biphenyl group.

In one or more embodiments, $R_1$ to $R_8$ and $A_7$ in Formula 1 may each independently be:

a group represented by Formula 2-1 or a group represented by Formula 2-2;

hydrogen, deuterium, or —F; or a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, —F, $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a fluorinated a phenyl group, a ($C_1$-$C_{20}$ alkyl)phenyl group, a biphenyl group, a deuterated a biphenyl group, a fluorinated a biphenyl group, a ($C_1$-$C_{20}$ alkyl)biphenyl group, or any combination thereof.

In one or more embodiments, $R_{20}$ in Formula 1 may be:
a group represented by Formula 2-1 or a group represented by Formula 2-2;
hydrogen or deuterium; or
a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated a biphenyl group, a ($C_1$-$C_{20}$ alkyl)biphenyl group, or any combination thereof.

In one or more embodiments, at least one of $R_1$ to $R_8$ in Formula 1 may independently be a group represented by Formula 2-1 or a group represented by Formula 2-2.

In one or more embodiments, at least one of $R_3$ and $R_5$ in Formula 1 may independently be a group represented by Formula 2-1 or a group represented by Formula 2-2.

In one or more embodiments, at least one of remaining $R_1$ to $R_8$ which are (is) not the group represented by Formula 2-1 or 2-2, at least one of remaining $R_{20}$(s) which are (is) not the group represented by Formulae 2-1 or 2-2, or any combination thereof may each independently be i) an electron withdrawing group, ii) an electron donating group, iii) a soluble group, or iv) a polymer, oligomer or dendrimer forming moiety-containing group. When at least one of the remaining $R_1$ to $R_8$ which are (is) not the group represented by Formula 2-1 or 2-2, at least one of the remaining $R_{20}$(s) which are (is) not the group represented by Formulae 2-1 or 2-2, or any combination thereof are each independently i) an electron-withdrawing group, ii) electron-donating group, iii) a soluble group, or iv) a polymer, oligomer or dendrimer forming moiety-containing group, then the organometallic compound represented by Formula 1 may have excellent electron transport capability and hole transport capability, and solubility with respect to water and/or an organic solvent, or may form a polymer, a oligomer, or a dendrimer by an additional reaction. Accordingly, the organometallic compound represented by Formula 1 can be used as a material for use in an electronic device, for example, a material for use in an organic layer of organic light-emitting device.

The electron-withdrawing group is a group that can withdraw electrons, and an example thereof is:
—F, —Cl, —Br, —I, a cyano group, or a nitro group; or
a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group or monovalent non-aromatic condensed heteropolycyclic group, each substituted —F, —Cl, —Br, —I, a cyano group, a nitro group, or any combination thereof.

For example, the electron-withdrawing group may be a fluoro group or a fluorinated $C_1$-$C_{60}$ alkyl group.

In one or more embodiments, the electron-withdrawing group may be:
—F; or
a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each substituted with at least one —F.

The electron-donating group is a group that is able to donate electrons, and may be, for example, a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a cyclooctenyl group, a bicyclo[1.1.1]pentyl group, a bicyclo[2.1.1]hexyl group, a bicyclo[2.2.2]octyl group, a phenyl group, a biphenyl group, a terphenyl group, a naphthyl group, a carbazolyl group, a fluorenyl group, a dibenzosilolyl group, a dibenzofuranyl group, or a dibenzothiophenyl group, each unsubstituted or substituted with deuterium, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a cyclooctenyl group, a bicyclo[1.1.1]pentyl group, a bicyclo[2.1.1]hexyl group, a bicyclo[2.2.2]octyl group, a phenyl group, a biphenyl group, a terphenyl group, a naphthyl group, a carbazolyl group, a fluorenyl group, a dibenzosilolyl group, a dibenzofuranyl group, a dibenzothiophenyl group, or any combination thereof.

The soluble group may be a group that improves the solubility of the organometallic compound represented by Formula 1 with respect to water and/or various organic solvents, and may be, for example:

a $C_1$-$C_{60}$ alkyl group, a $C_1$-$C_{60}$ alkoxy group, a $C_1$-$C_{60}$ alkylthio group, $C_1$-$C_{60}$ carboxy group, $C_1$-$C_{60}$ oxycarbonyl group, a $C_1$-$C_{60}$ amide group, a $C_1$-$C_{60}$ carbamate group, or a $C_1$-$C_{60}$ urea group; or a fluorenyl group, each unsubstituted or substituted with a $C_1$-$C_{60}$ alkyl group, a $C_1$-$C_{60}$ alkoxy group, a $C_1$-$C_{60}$ alkylthio group, a $C_1$-$C_{60}$ carboxy group, a $C_1$-$C_{60}$ oxycarbonyl group, a $C_1$-$C_{60}$ amide group, a $C_1$-$C_{60}$ carbamate, a $C_1$-$C_{60}$ urea group, or any combination thereof.

The polymer, oligomer or dendrimer forming moiety-containing group may be a group that includes at least one moiety that can form a polymer, an oligomer, or a dendrimer by an additional reaction, and the polymer, oligomer or dendrimer forming moiety may be a vinyl group or a cyclopropanyl group.

For example, the polymer, oligomer or dendrimer forming moiety-containing group may be a phenyl group substituted with at least one vinyl group.

In one or more embodiments, at least one of $R_3$, $R_4$, $R_6$, $R_7$, and $A_7$ (for example, one, two, or three of $R_3$, $R_4$, $R_6$, $R_7$, and $A_7$) may independently be an electron-withdrawing group.

In one or more embodiments, at least one of $R_4$, $R_6$ and $A_7$ may independently be an electron-withdrawing group.

In one or more embodiments, at least one of $R_{20}$(s) in the number of a2 may independently be an electron-donating group or a soluble group.

In one or more embodiments, at least one of remaining $R_1$ to $R_8$ which are (is) not the group represented by Formula 2-1 or 2-2 may each independently be:

—F; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, or a fluorinated a biphenyl group, each unsubstituted or substituted with deuterium, —F, $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a fluorinated a phenyl group, a ($C_1$-$C_{20}$ alkyl)phenyl group, a biphenyl group, a deuterated a biphenyl group, a fluorinated a biphenyl group, a ($C_1$-$C_{20}$ alkyl)biphenyl group, or any combination thereof.

In one or more embodiments, at least one of remaining $R_1$ to $R_8$ which are (is) not the group represented by Formula 2-1 or 2-2 among $R_1$ to $R_8$ in Formula 1 may each independently be:

deuterium; or a deuterated $C_1$-$C_{20}$ alkyl group, a deuterated $C_3$-$C_{10}$ cycloalkyl group, a deuterated $C_1$-$C_{10}$ heterocycloalkyl group, a deuterated a phenyl group, or a deuterated a biphenyl group, each unsubstituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated a biphenyl group, a ($C_1$-$C_{20}$ alkyl)biphenyl group, or any combination thereof.

In one or more embodiments, at least one of remaining $R_1$ to $R_8$ which are (is) not the group represented by Formula 2-1 or 2-2 may each independently be:

hydrogen; or a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with a $C_1$-$C_{20}$ alkyl group, a $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a ($C_1$-$C_{20}$ alkyl)$C_1$-$C_{10}$ heterocycloalkyl group, a phenyl group, a ($C_1$-$C_{20}$ alkyl)phenyl group, a biphenyl group, a ($C_1$-$C_{20}$ alkyl)biphenyl group, or any combination thereof.

In one or more embodiments, at least one of $A_1$ to $A_6$ in Formula 1 may not be hydrogen.

In one or more embodiments, $A_7$ in Formula 1 may not be hydrogen.

In one or more embodiments, $A_7$ in Formula 1 may be an electron-withdrawing group.

In one or more embodiments, a group represented by *—C($A_1$)($A_2$)($A_3$) and a group represented by *—C($A_4$)($A_5$)($A_6$) in Formula 1 may be identical to each other.

In one or more embodiments, a group represented by *—C($A_1$)($A_2$)($A_3$) and a group represented by *—C($A_4$)($A_5$)($A_6$) in Formula 1 may be different from each other.

In one or more embodiments, the organometallic compound represented by Formula 1 may satisfy at least one of Condition 1 to Condition 3:

Condition 1

A$_1$ to A$_6$ in Formula 1 may each independently be a substituted or unsubstituted C$_1$-C$_{60}$ alkyl group, a substituted or unsubstituted C$_3$-C$_{10}$ cycloalkyl group, a substituted or unsubstituted C$_2$-C$_{10}$ heterocycloalkyl group, a substituted or unsubstituted C$_6$-C$_{60}$ aryl group, a substituted or unsubstituted C$_2$-C$_{60}$ heteroaryl group, a substituted or unsubstituted monovalent non-aromatic condensed polycyclic group, or a substituted or unsubstituted monovalent non-aromatic condensed heteropolycyclic group, Condition 2 at least one of A$_1$ to A$_6$ in Formula 1 may be a substituted or unsubstituted C$_2$-C$_{60}$ alkyl group, a substituted or unsubstituted C$_3$-C$_{10}$ cycloalkyl group, a substituted or unsubstituted C$_2$-C$_{10}$ heterocycloalkyl group, a substituted or unsubstituted C$_6$-C$_{60}$ aryl group, a substituted or unsubstituted C$_2$-C$_{60}$ heteroaryl group, a substituted or unsubstituted monovalent non-aromatic condensed polycyclic group, or a substituted or unsubstituted monovalent non-aromatic condensed heteropolycyclic group, and Condition 3

A$_7$ in Formula 1 may be deuterium, —F, a substituted or unsubstituted C$_1$-C$_{60}$ alkyl group, a substituted or unsubstituted C$_3$-C$_{10}$ cycloalkyl group, a substituted or unsubstituted C$_2$-C$_{10}$ heterocycloalkyl group, a substituted or unsubstituted C$_6$-C$_{60}$ aryl group, a substituted or unsubstituted C$_2$-C$_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, the organometallic compound represented by Formula 1 may satisfy Condition 1. When Condition 1 is satisfied, two advantages can be obtained:

(1) Although not intended to be limited by a specific theory, since an α-proton has about 105 times greater chemical reactivity than a β-proton, the α-proton may form various forms of intermediates during synthesis of compounds and/or storage, causing side reactions. However, since A$_1$ to A$_6$ in Formula 1 are defined as in Condition 1, the carbons linked to A$_1$ to A$_6$ in Formula 1 may not include α-protons. Accordingly, the organometallic compound represented by Formula 1 may have a stable chemical structure that minimizes the occurrence of side reactions before and after synthesis, and at the same time, may minimize the interaction between the organometallic compound molecules during operation of the electronic device (for example, an organic light emitting device) including the same.

(2) Furthermore, since Formula 1 contains an ancillary ligand (O^O ligand in Formula 1) that is structurally bulky and has a strong electron-donating capability, the interaction between the ancillary ligand and a main ligand (N^C in Formula 1) may be enhanced, and thus, the rigidity of the organometallic compound represented by Formula 1 may be improved. Thus, the full width at half maximum (FWHM) of the emission peak in the photoluminescence (PL) spectrum or electroluminescence (EL) spectrum of the organometallic compound represented by Formula 1 may be decreased, and the vibronic state of the molecule of the organometallic compound represented by Formula 1 may be reduced and thus, emission transition and photoalignment ability can be improved.

In one or more embodiments, the organometallic compound represented by Formula 1 may satisfy at least one of Condition 4 and Condition 5

Condition 4 two or more of A$_1$ to A$_3$ in Formula 1 may be linked together, and thus a group represented by *—C(A$_1$)(A$_2$)(A$_3$) becomes (or, is) a C$_5$-C$_{30}$ carbocyclic group that is unsubstituted or substituted with at least one R$_{1a}$ or a C$_1$-C$_{30}$ heterocyclic group that is unsubstituted or substituted with at least one R$_{1a}$;

Condition 5 two or more of A$_4$ to A$_6$ in Formula 1 may be linked together, and thus a group represented by *—C(A$_4$)(A$_5$)(A$_6$) becomes (or, is) a C$_5$-C$_{30}$ carbocyclic group unsubstituted or substituted with at least one R$_{1a}$ or a C$_1$-C$_{30}$ heterocyclic group unsubstituted or substituted with at least one R$_{1a}$.

In one or more embodiments, the organometallic compound represented by Formula 1 may include at least one deuterium.

In one or more embodiments, at least one of R$_1$ to R$_8$ in Formula 1 may include at least one deuterium.

In one or more embodiments, at least one of R$_{20}$(s) in the number of a2 of Formula 1 may include deuterium.

In one or more embodiments, a group represented by

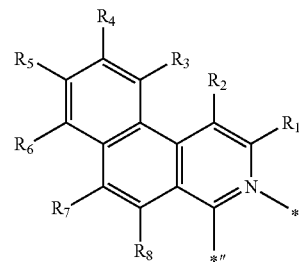

in Formula 1 may be a group represented by one of Formulae CY1 to CY108:

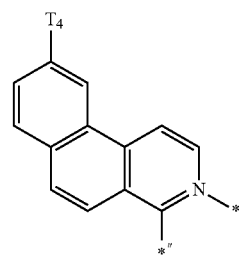

CY1

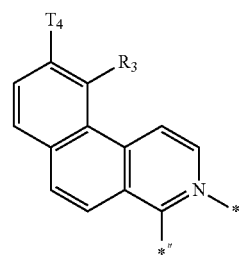

CY2

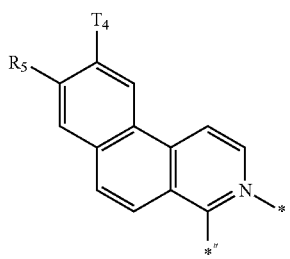
CY3
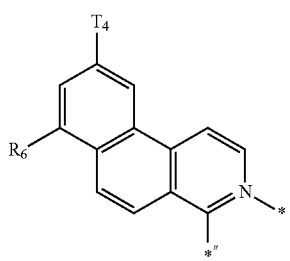
CY4
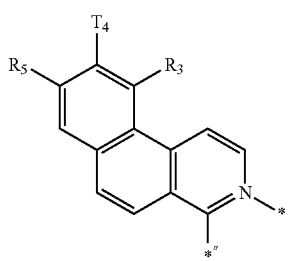
CY5
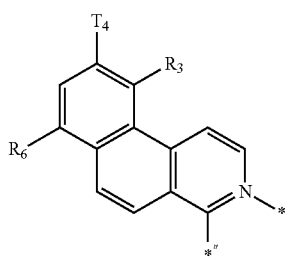
CY6
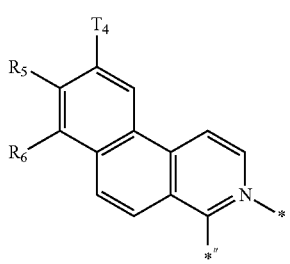
CY7
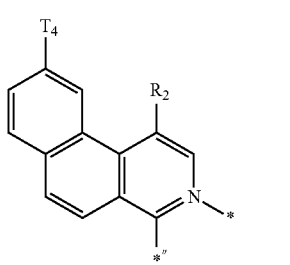
CY8
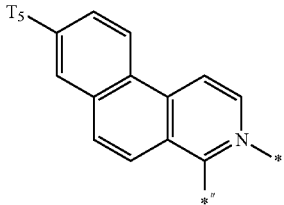
CY9
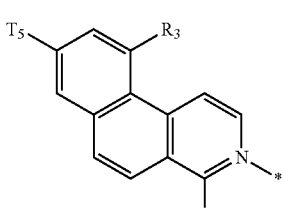
CY10
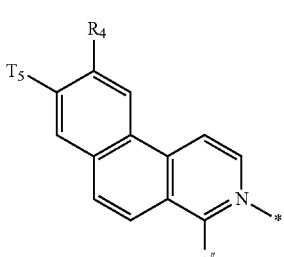
CY11
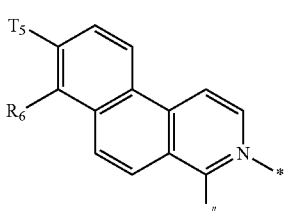
CY12
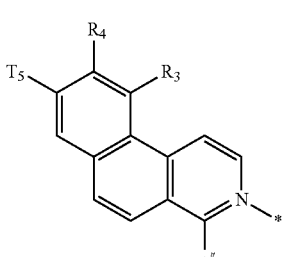
CY13
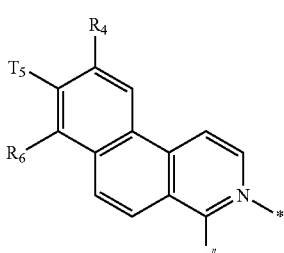
CY14
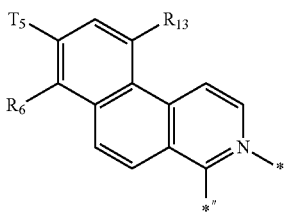
CY15

-continued
CY16
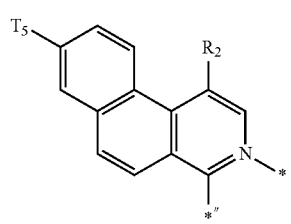
CY17
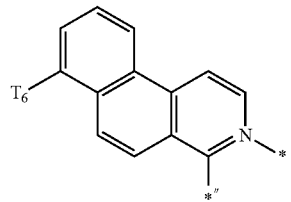
CY18
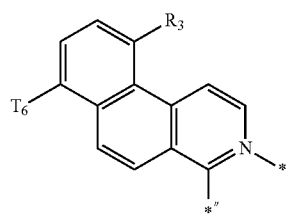
CY19
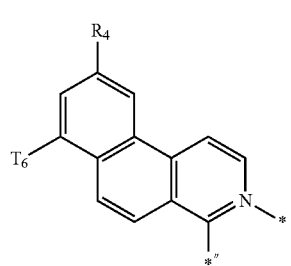
CY20
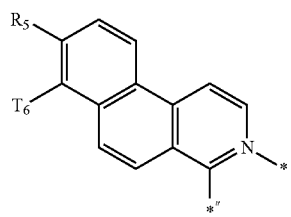
CY21
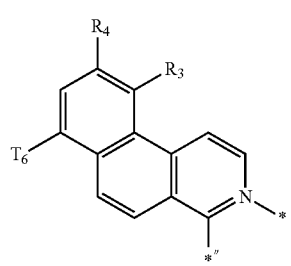
CY22
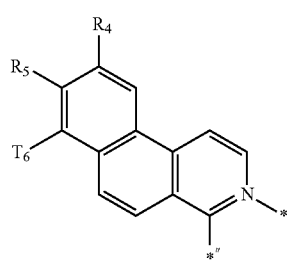
-continued
CY23
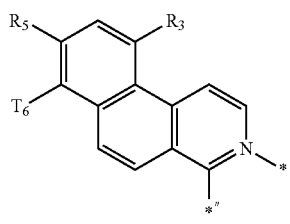
CY24
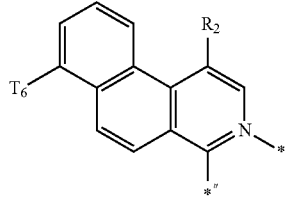
CY25
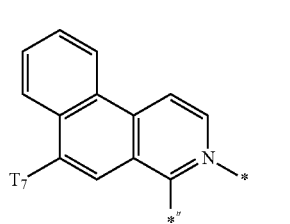
CY26
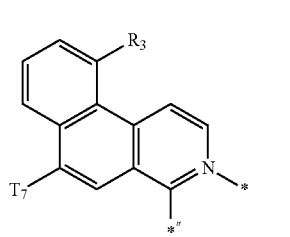
CY27
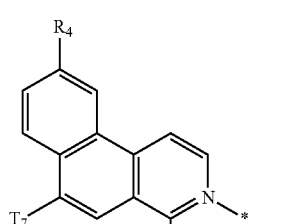
CY28
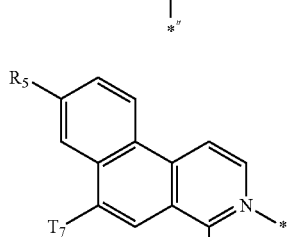
CY29
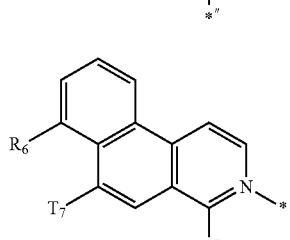

-continued
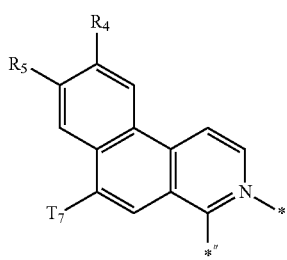
CY30
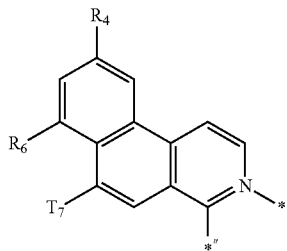
CY31
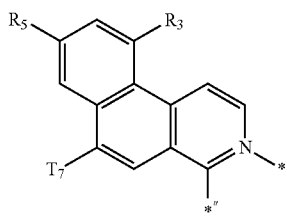
CY32
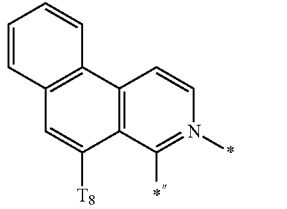
CY33
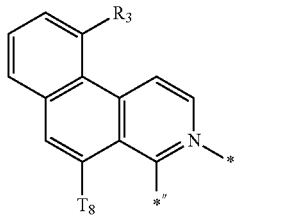
CY34
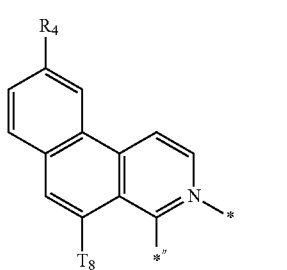
CY35
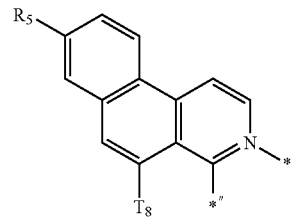
CY36
CY37
CY38
CY39
CY40
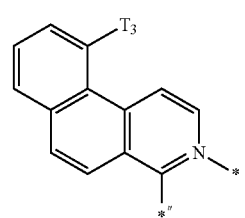
CY41

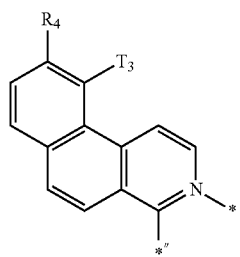
CY42
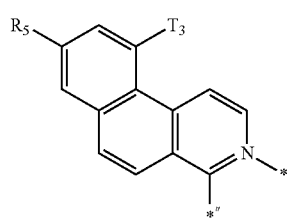
CY43
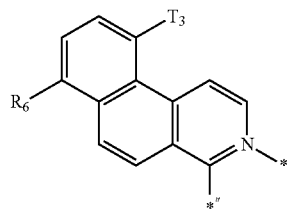
CY44
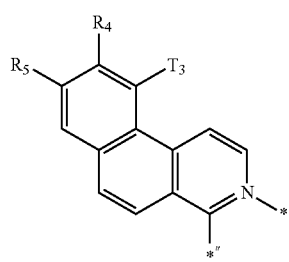
CY45
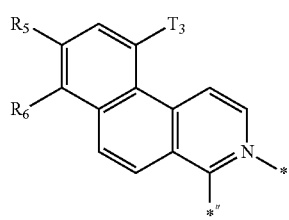
CY46
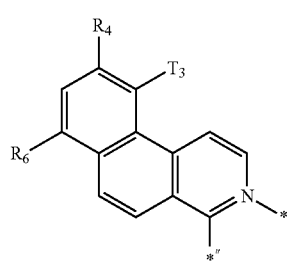
CY47
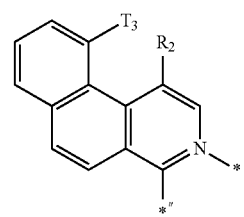
CY48
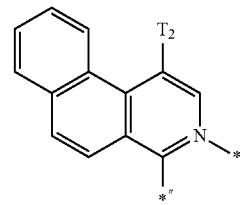
CY49
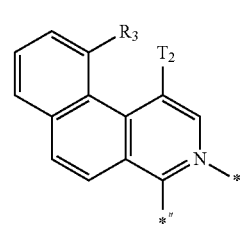
CY50
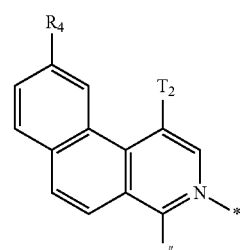
CY51
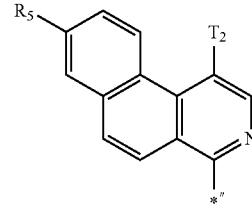
CY52
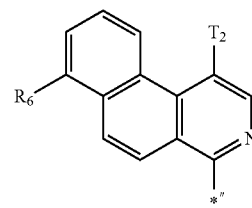
CY53
CY54

-continued
CY55
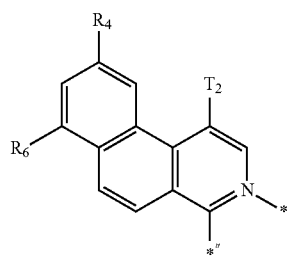
CY56
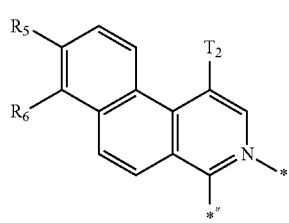
CY57
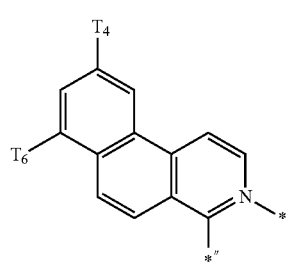
CY58
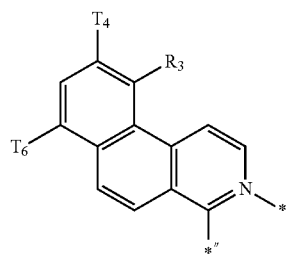
CY59
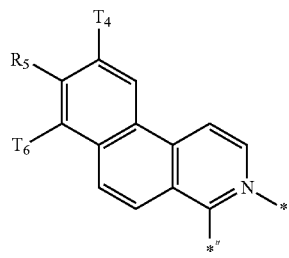
CY60
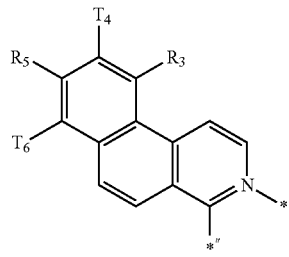
-continued
CY61
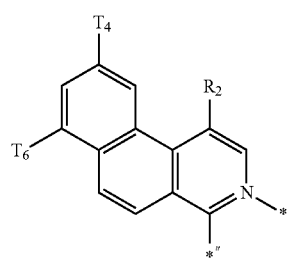
CY62
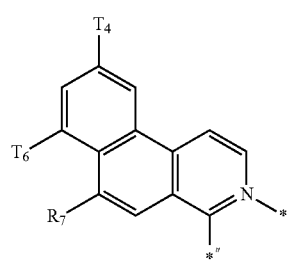
CY63
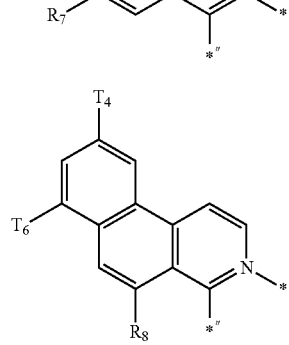
CY64
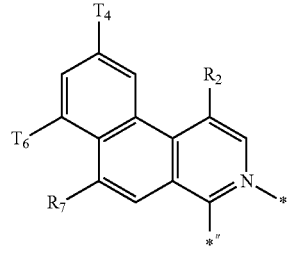
CY65
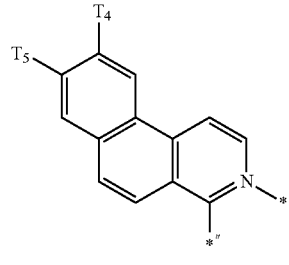
CY66
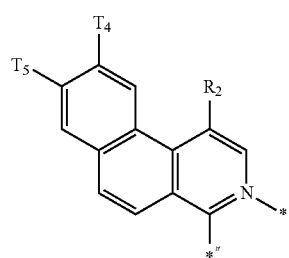

CY67 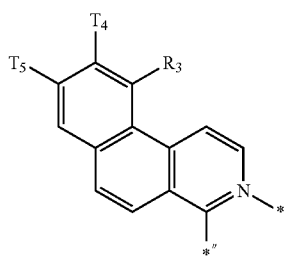
CY68 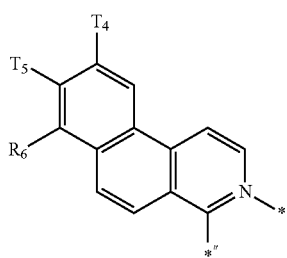
CY69 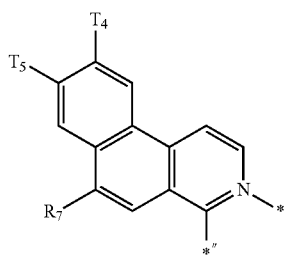
CY70 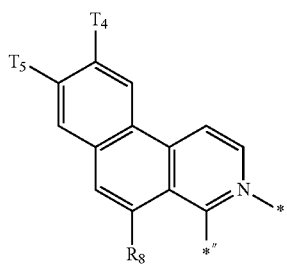
CY71 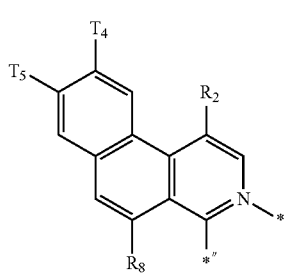
CY72 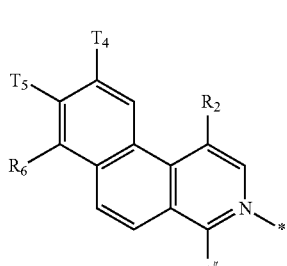
CY73 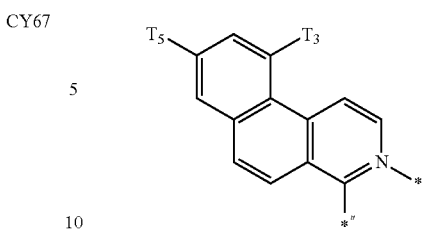
CY74 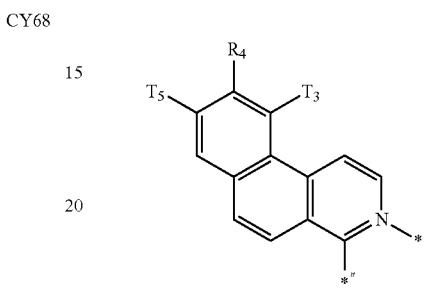
CY75 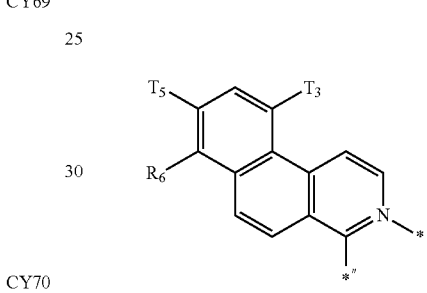
CY76 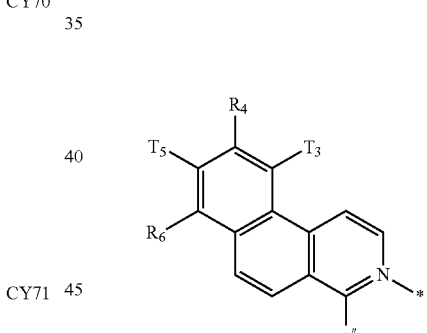
CY77 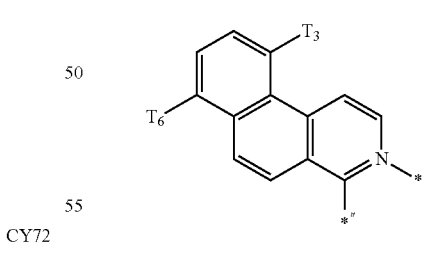
CY78 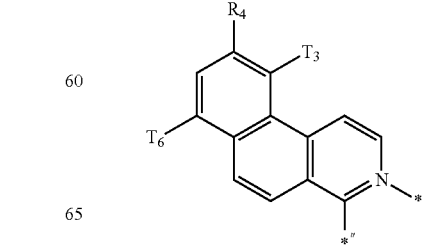

CY79 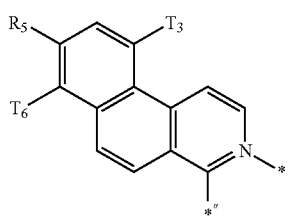
CY80 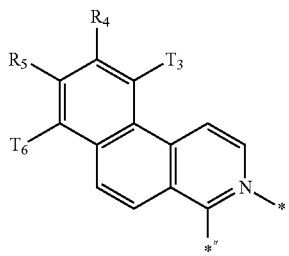
CY81 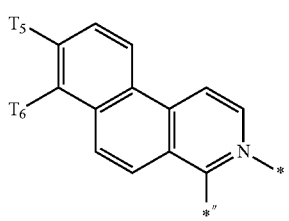
CY82 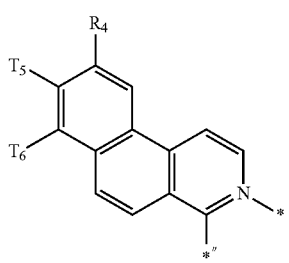
CY83 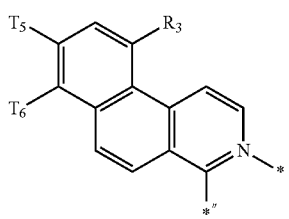
CY84 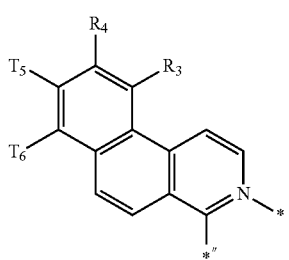
CY85 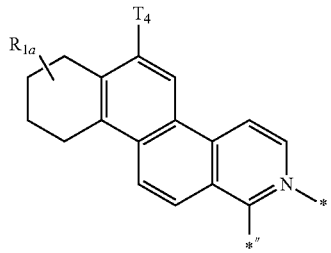
CY86 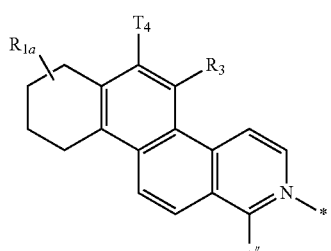
CY87 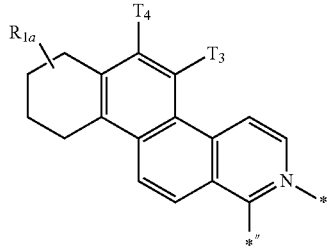
CY88 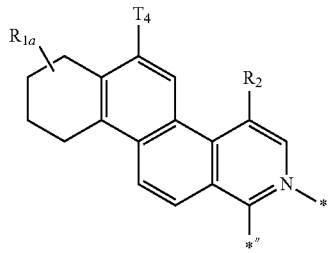
CY89 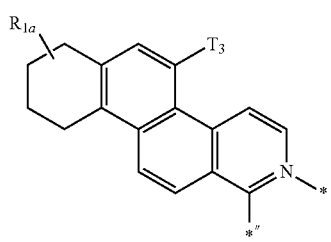
CY90 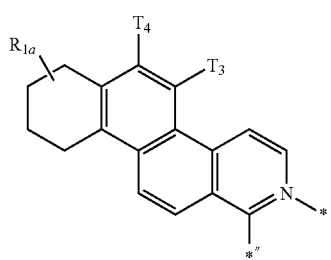

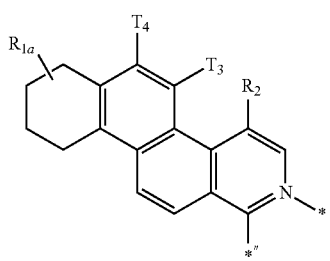 CY91
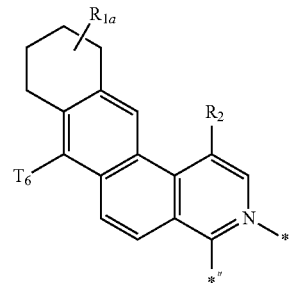 CY96
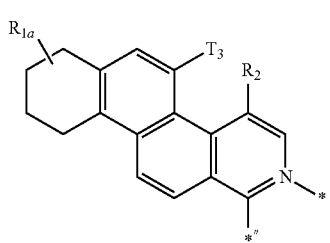 CY92
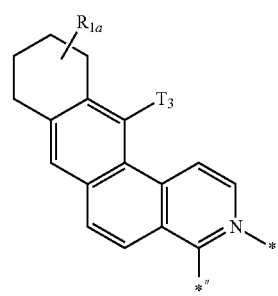 CY97
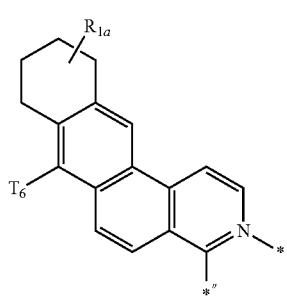 CY93
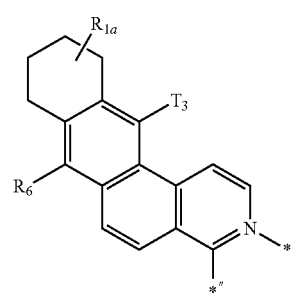 CY98
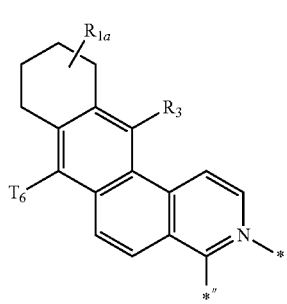 CY94
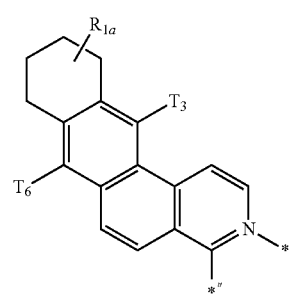 CY99
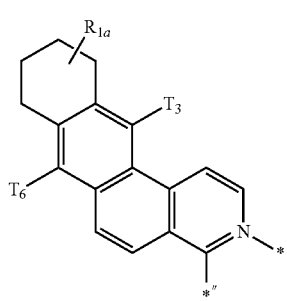 CY95
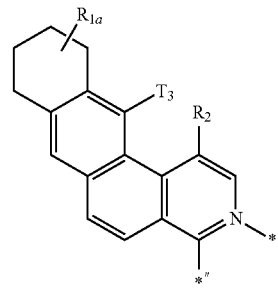 CY100

CY101 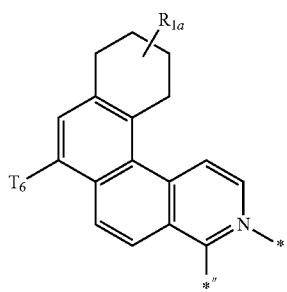

CY102 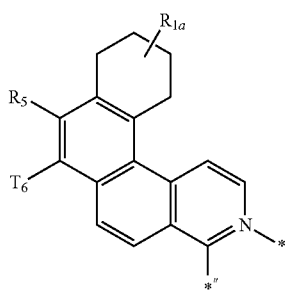

CY103 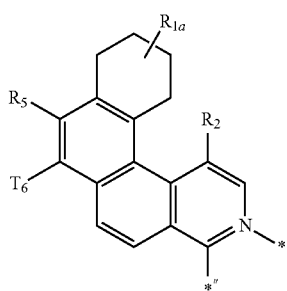

CY104 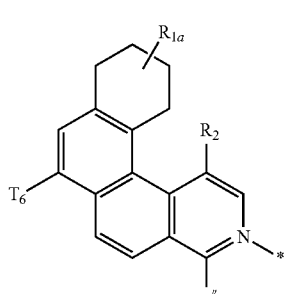

CY105 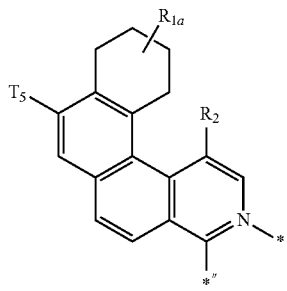

CY106 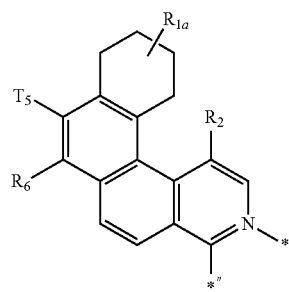

CY107 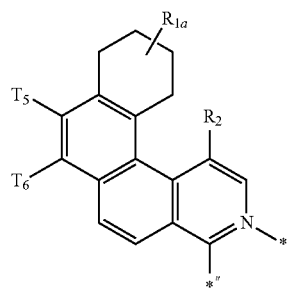

CY108 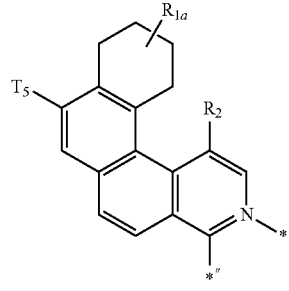

In Formulae CY1 to CY108, $T_2$ to $T_8$ may each independently be a group represented by Formula 2-1 or a group represented by Formula 2-2, $R_2$ to $R_8$ and $R_{1a}$ are the same as described in the present specification, and $R_2$ to $R_8$ are not hydrogen,

* is a binding site to Ir in Formula 1, and

*" is a binding site to a neighboring atom in Formula 1.

For example, a group represented by

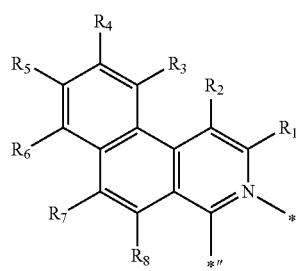

in Formula 1 may be a group represented by Formula CY9, CY11, CY12, CY14, or CY76.

In one or more embodiments, a group represented by

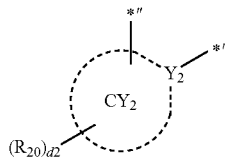

in Formula 1 may be a group represented by one of Formulae A(1) to A(10):

A(1)
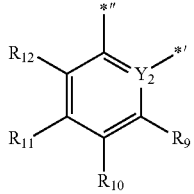

A(2)
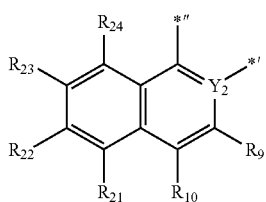

A(3)
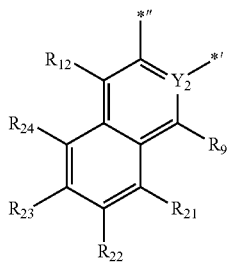

A(4)
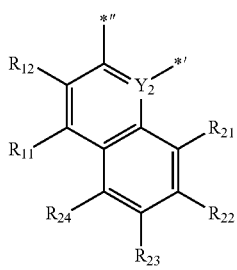

A(5)
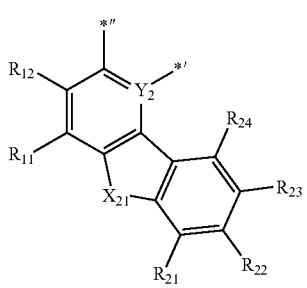

A(6)
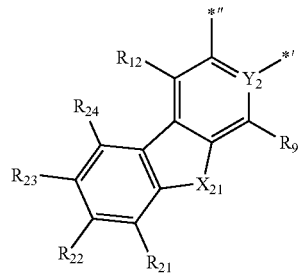

A(7)
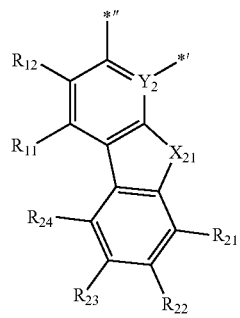

A(8)
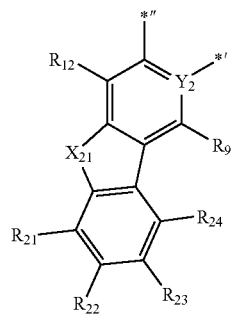

A(9)
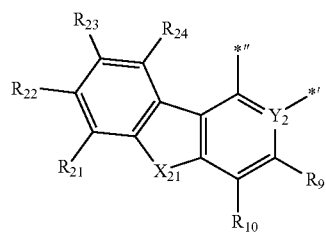

A(10)
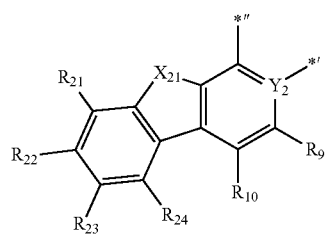

In Formulae A(1) to A(10), $Y_2$ is C, $X_2$ is O, S, N($R_{25}$), C($R_{25}$)($R_{26}$), or Si($R_{25}$)($R_{26}$), $R_9$ to $R_{12}$ and $R_{21}$ to $R_{26}$ are the same as described in connection with $R_{20}$,

*' is a binding site to Ir in Formula 1, and

*" is a binding site to a neighboring atom in Formula 1.

In one or more embodiments, $R_9$ and $R_{11}$ in Formula A(1) may not be hydrogen.

In one or more embodiments, $R_{10}$ and $R_{12}$ in Formula A(1) may each independently be hydrogen or deuterium.

In one or more embodiments, $R_9$ and $R_{11}$ in Formula A(1) may not be hydrogen, and $R_{10}$ and $R_{12}$ may each be hydrogen.

In one or more embodiments, $R_9$ and $R_{11}$ in Formula A(1) may be identical to each other.

In one or more embodiments, $R_9$ and $R_{11}$ in Formula A(1) may be different from each other.

In one or more embodiments, $R_9$ and $R_{11}$ in Formula A(1) may be different from each other, and the number of carbons included in $R_9$ may be different from the number of carbons included in $R_{11}$.

In one or more embodiments, $R_9$ and $R_{11}$ in Formula A(1) may be different from each other, and the number of carbons included in $R_{11}$ may be greater than the number of carbons included in $R_9$.

In one or more embodiments, $R_9$ and $R_{11}$ in Formula A(1) may each independently be:
deuterium; or
a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated a biphenyl group, a ($C_1$-$C_{20}$ alkyl)biphenyl group, or any combination thereof.

In one or more embodiments, i) at least one of $R_9$ to $R_{12}$ in Formula A(1), ii) $R_9$, $R_{10}$, one of $R_{21}$ to $R_{26}$, or any combination thereof in Formulae A(2), A(9), and A(10), iii) $R_9$, $R_{12}$, one of $R_{21}$ to $R_{26}$, or any combination thereof in Formulae A(3), A(6), and A(8), and iv) $R_{11}$, $R_{12}$, one of $R_{21}$ to $R_{26}$, or any combination thereof in Formulae A(4), A(5), and A(7) may each independently be deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, or deuterated biphenyl group, each unsubstituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated biphenyl group, a ($C_1$-$C_{20}$ alkyl)biphenyl group, or any combination thereof.

In one or more embodiments, at least one of $R_9$ and $R_{11}$ in Formula A(1) (for example, $R_9$ and $R_{11}$ in Formula A(1)) may independently be deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, or a deuterated a biphenyl group, each optionally substituted with a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated a biphenyl group, a ($C_1$-$C_{20}$ alkyl)biphenyl group, or any combination thereof.

In the present specification, TMS represents *—Si(CH$_3$)$_3$, and TMG represents *—Ge(CH$_3$)$_3$.

The organometallic compound represented by Formula 1 may be one of Compounds 1 to 16:

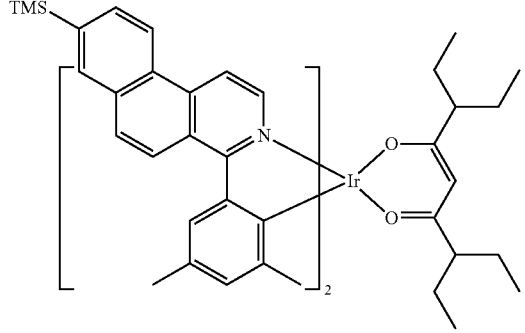

1

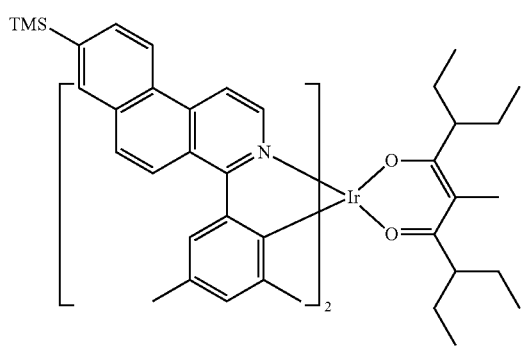

2

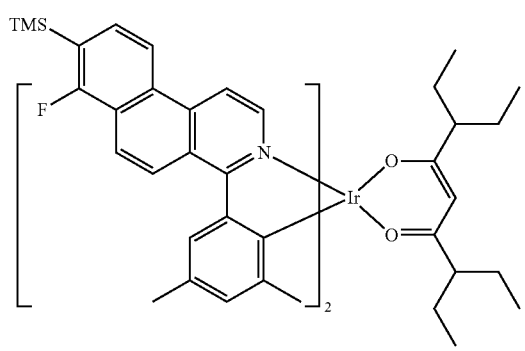

3

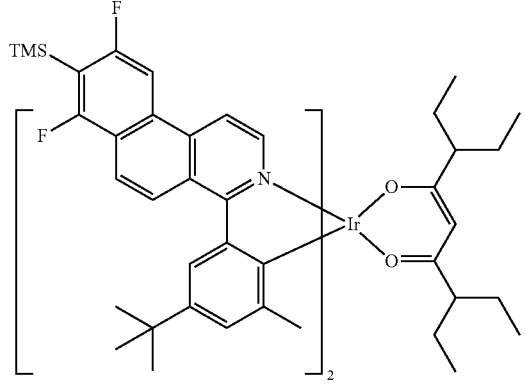

4

5
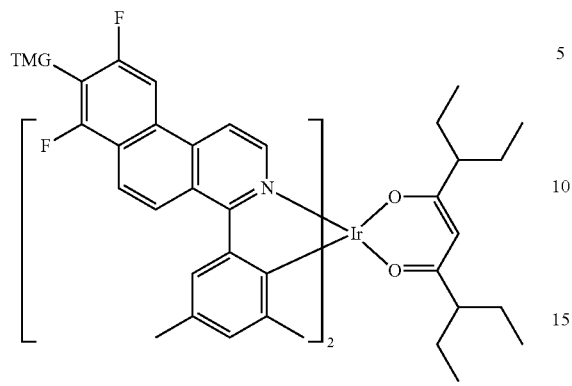
6
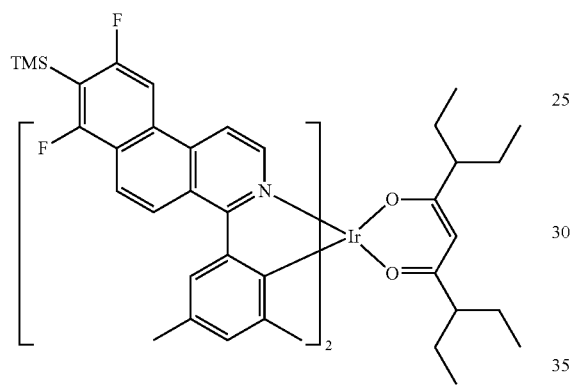
7
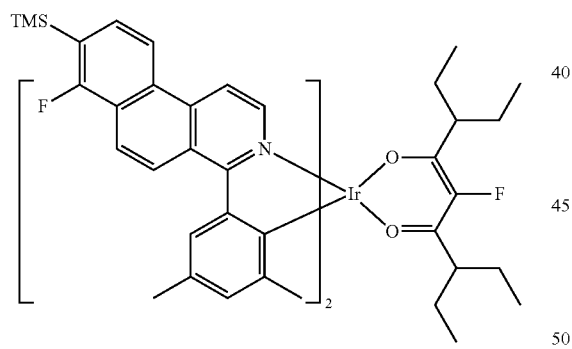
8
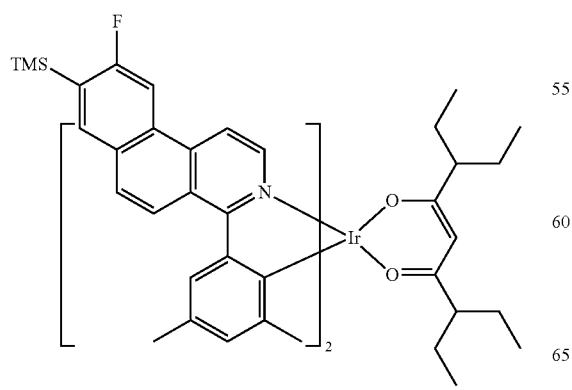
9
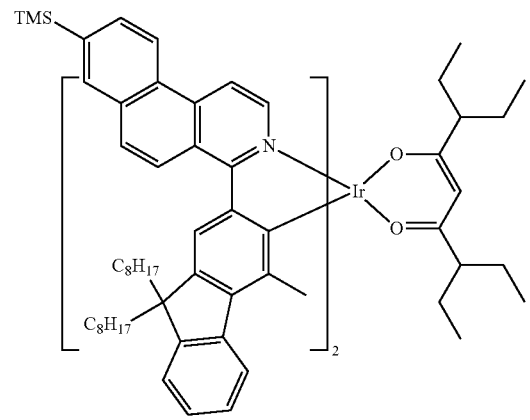
10
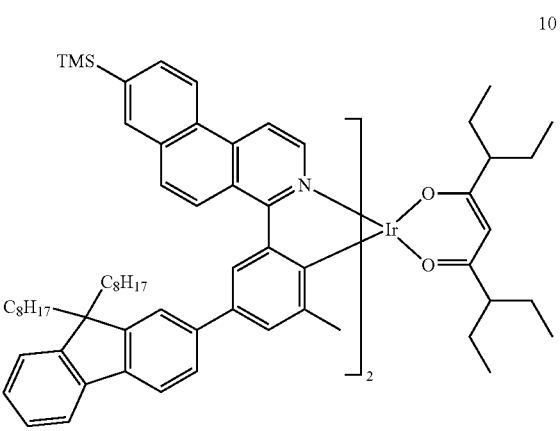
11
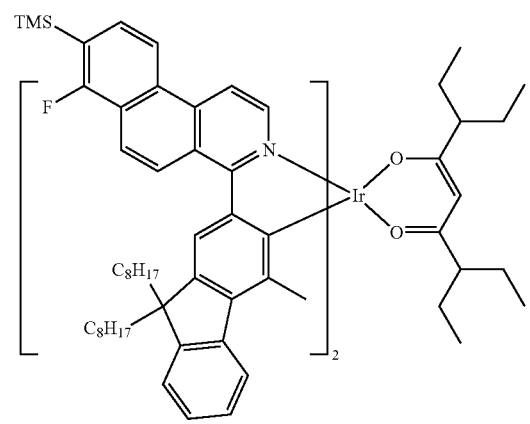

12

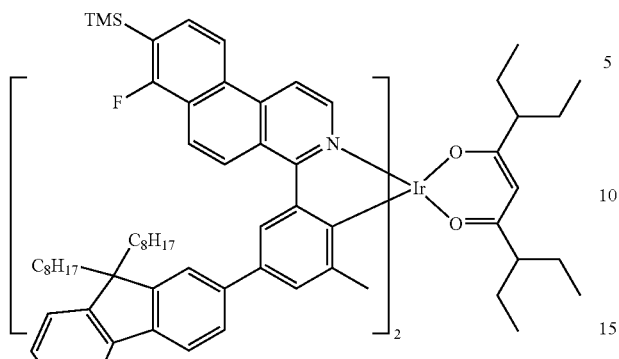

13

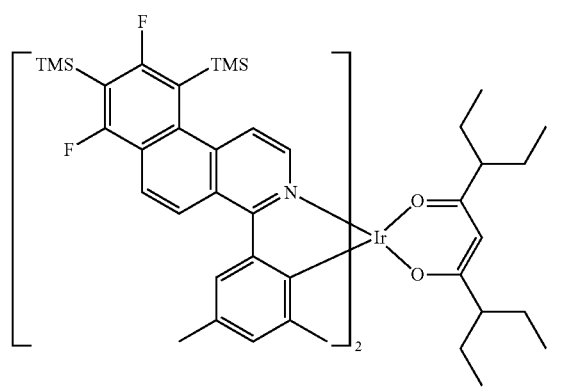

14

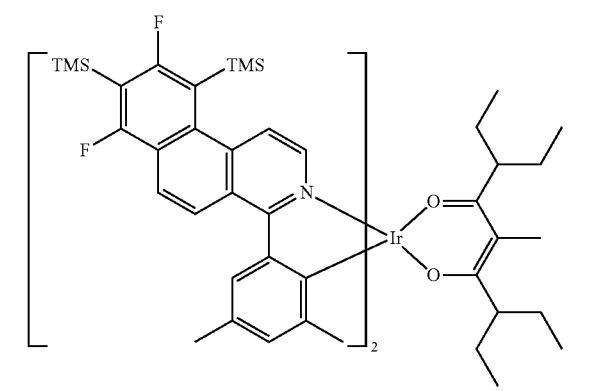

15

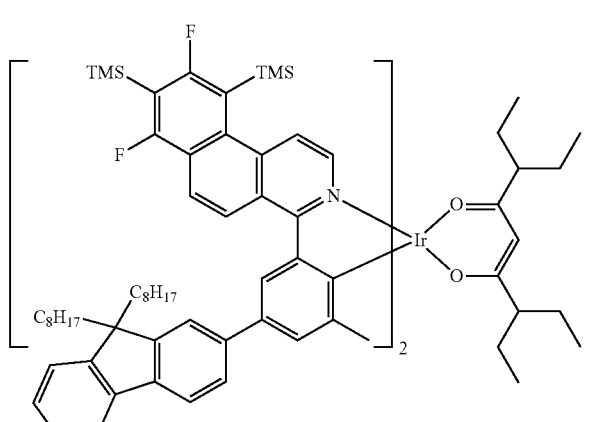

16

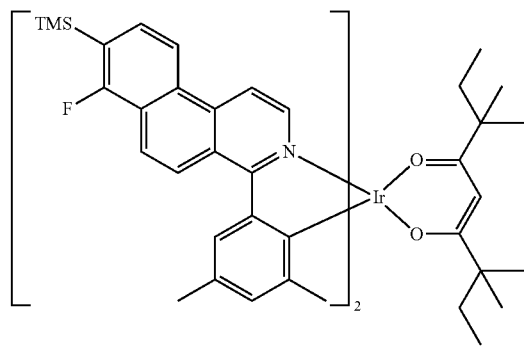

At least one of $R_1$ to $R_8$ in Formula 1, at least one of $R_{20}$(s) in the number of a2, or any combination thereof may independently be a group represented by Formula 2-1 or a group represented by Formula 2-2.

As such, electronic devices, such as organic light-emitting devices, including organometallic compounds represented by Formula 1 may have high luminescence efficiency. Although not limited to a particular theory, at least one of $R_1$ to $R_8$ in Formula 1, at least one of $R_{20}$(s) in the number of a2 of Formula 1, or any combination thereof may be a group represented by Formula 2-1 or a group represented by Formula 2-2. Accordingly, since the oscillation strength of the Sn excitation level (n>3) of the organometallic compound represented by Formula 1 is, for example, 0.1 or more (and/or), the oscillation strength of Sn is greater than the oscillation strength corresponding to S1, S2, and S3 (and/or), and the Sn-T1 energy gap is less than 1 eV, the organic light-emitting device using the organometallic compounds represented by Formula 1 may have high luminescence efficiency.

Accordingly, an electronic device using the organometallic compound represented by Formula 1, for example, an organic light-emitting device using the organometallic compound represented by Formula 1 may have high luminescence efficiency and/or long lifespan.

The highest occupied molecular orbital (HOMO) energy level, lowest unoccupied molecular orbital (LUMO) energy level, energy gap, $T_1$ energy level, $S_1$ energy level, gap between $S_5$ and $T_1$, and $S_5$ oscillation strength of the organometallic compound represented by Formula 1 were evaluated using the Gaussian 09 program with the molecular structure optimization obtained by B3LYP-based density functional theory (DFT), and results thereof are shown in Table 1.

TABLE 1

| Compound No. | HOMO (eV) | LUMO (eV) | Energy gap (eV) | $T_1$ (eV) | $S_1$ (eV) | $S_5 - T_1$ Gap (eV) | $S_5$ Oscillation Strength |
|---|---|---|---|---|---|---|---|
| 1 | −4.61 | −1.70 | 2.91 | 2.05 | 2.29 | 0.80 | 0.2424 |
| 2 | −4.57 | −1.69 | 2.88 | 2.02 | 2.26 | 0.71 | 0.1742 |
| 3 | −4.69 | −1.82 | 2.87 | 2.02 | 2.25 | 0.80 | 0.2437 |
| 4 | −4.77 | −1.93 | 2.84 | 2.01 | 2.23 | 0.79 | 0.2426 |
| 5 | −4.74 | −1.90 | 2.84 | 2.00 | 2.23 | 0.80 | 0.2476 |
| 6 | −4.76 | −1.94 | 2.82 | 1.99 | 2.21 | 0.80 | 0.2464 |
| 7 | −4.67 | −1.75 | 2.92 | 2.06 | 2.31 | 0.75 | 0.1123 |
| 8 | −4.63 | −1.77 | 2.87 | 2.01 | 2.26 | 0.84 | 0.1848 |
| 9 | −4.70 | −1.85 | 2.84 | 1.97 | 2.25 | 0.82 | 0.1434 |
| 10 | −4.68 | −1.87 | 2.81 | 2.00 | 2.23 | 0.82 | 0.1257 |

From Table 1, it is confirmed that the organometallic compound represented by Formula 1 has such electric characteristics that are suitable for use as a dopant for an electric device, for example, an organic light-emitting device.

In one or more embodiments, the full width at half maximum (FWHM) of the emission peak of the emission spectrum or the electroluminescence spectrum of the organometallic compound may be 55 nm or less. For example, the FWHM of the emission peak of the emission spectrum or the electroluminescence spectrum of the organometallic compound may be from about 30 nm to about 55 nm, about 40 nm to about 53 nm, or about 45 nm to about 52 nm.

In one or more embodiments, the maximum emission wavelength (emission peak wavelength, $\lambda_{max}$) of the emission peak of the emission spectrum or the electroluminescence spectrum of the organometallic compound may be from about 610 nm to about 640 nm.

In one or more embodiments, the HOMO energy level of the organometallic compound represented by Formula 1 may be from about −5.200 eV to about −5.000 eV. The HOMO energy level may be measured by using cyclic voltammetry. For example, the HOMO energy level may be measured using the method described in Table 2 below.

In one or more embodiments, the LUMO energy level of the organometallic compound represented by Formula 1 may be from about −2.700 eV to about −2.300 eV. The LUMO energy level may be measured by using cyclic voltammetry. For example, the HOMO energy level may be measured using the method described in Table 2 below.

In one or more embodiments, the decay time of the organometallic compound represented by Formula 1 may be 0.8 μs or less, for example, from about 0.6 μs to about 0.8 μs. The decay time may be estimated from the time-resolved photoluminescence (TRPL) spectrum of the organometallic compound. For example, the decay time evaluation method of the organometallic compound may refer to the method described in Evaluation Example 2 herein.

In one or more embodiments, the horizontal orientation ratio of the transition dipole moment of the organometallic compound represented by Formula 1 may be from about 90% to about 100%.

For example, the horizontal orientation ratio of the transition dipole moment of the organometallic compound may be, for example, from about 90% to about 100%, from about 91% to 100%, from about 92% to about 100%, from about 93% to about 100%, from about 94% to about 100%, from about 95% to about 100%, from about 96% to about 100%, from about 97% to about 100%, from about 98% to about 100%, or from about 99% to about 100%, or 100%.

The horizontal orientation ratio of the transition dipole moment may be evaluated using an angle-dependent PL measurement apparatus. For a description of the angle-dependent PL measurement apparatus may refer to, for example, the angle-dependent PL measurement apparatus described in KR Application No. 2013-0150834, herein incorporated by reference.

As described above, since the horizontal orientation ratio of the transition dipole moment of the organometallic compound is high, when an organic light-emitting device including the organometallic compound is driven, an electric field is emitted in a direction that is substantially parallel with respect to the film containing the organometallic compound, and thus, the light loss due to the waveguide mode and/or surface plasmon polariton mode can be reduced. The light emitted according to this mechanism may have high external extraction efficiency (that is, the external extraction efficiency of light emitted from the organometallic compound from a device (for example, an organic light-emitting device) including a film (for example, an emission layer to be described later) containing the organometallic compound). Accordingly, an electronic device including the organometallic compound, for example, an organic light-emitting device including the organometallic compound may have high luminescence efficiency.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode and includes an emission layer, wherein the organic layer includes at least one organometallic compound represented by Formula 1.

Since the organic light-emitting device has an organic layer containing the organometallic compound represented by Formula 1 as described above, excellent characteristics may be obtained with respect to driving voltage, current efficiency, external quantum efficiency, a roll-off ratio, and lifespan, and the FWHM of the emission peak of the EL spectrum is relatively narrow.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 in the emission layer is smaller than an amount of the host).

In one or more embodiments, the emission layer may emit red light.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist only in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer may further include a hole transport region between the first electrode and the emission layer and an electron transport region between the emission layer and the second electrode, and the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may be m-MTDATA, TDATA, 2-TNATA, NPB, β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), TFB(Poly[(9,9-dioctylfluorenyl-2,7-diyl)-co-(4,4'-(N-(4-sec-butylphenyl) diphenylamine)]), a compound represented by Formula 201 below, a compound represented by Formula 202 below, or any combination thereof:

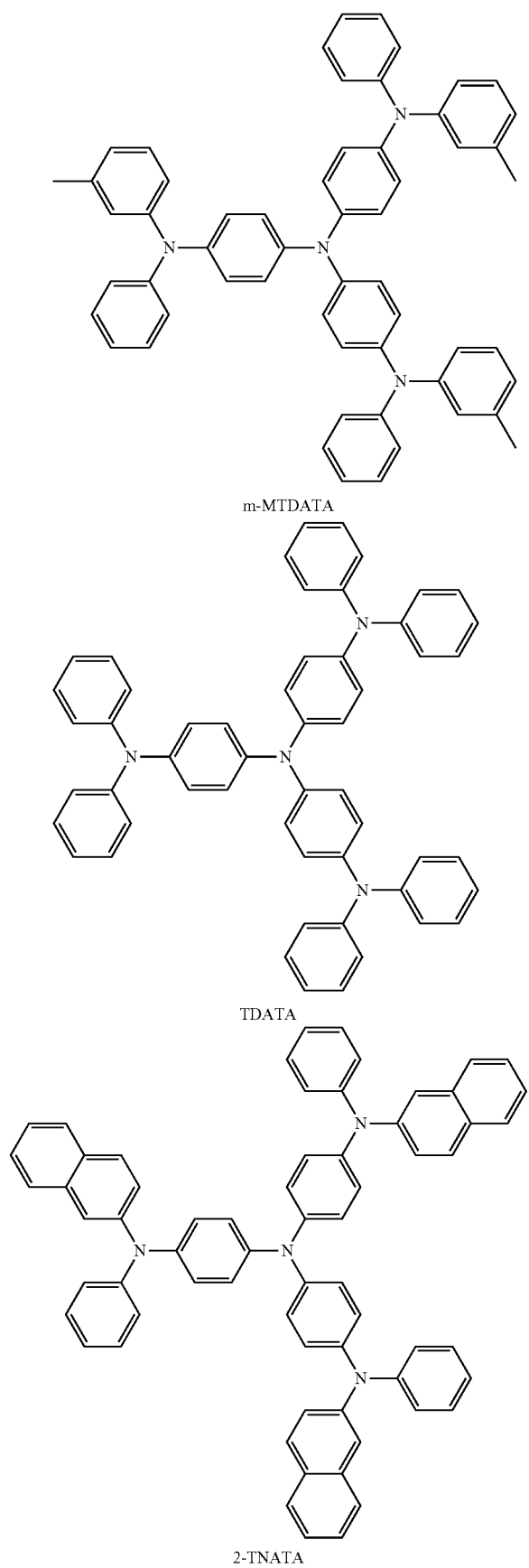
m-MTDATA
TDATA
2-TNATA
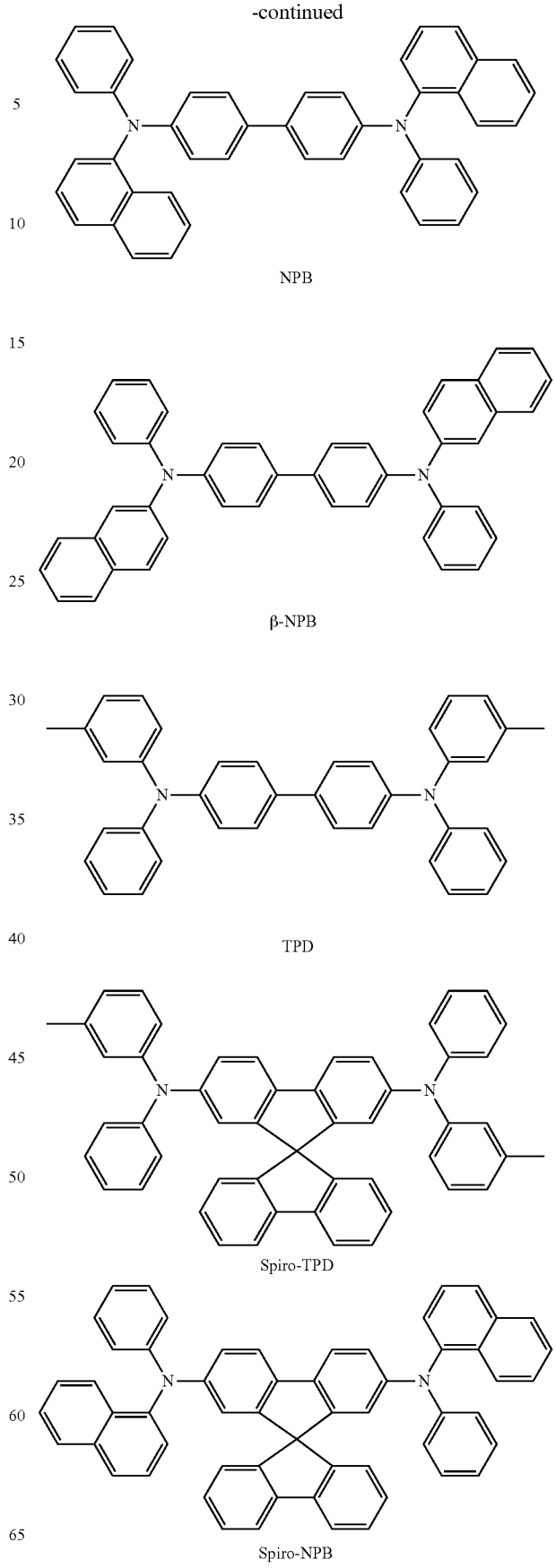
NPB
β-NPB
TPD
Spiro-TPD
Spiro-NPB -continued

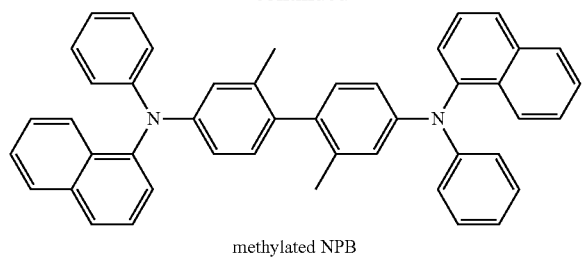

methylated NPB

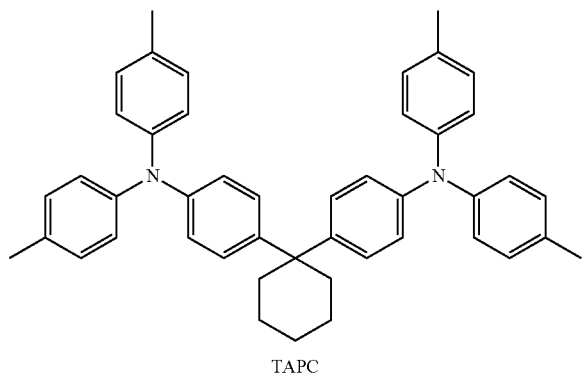

TAPC

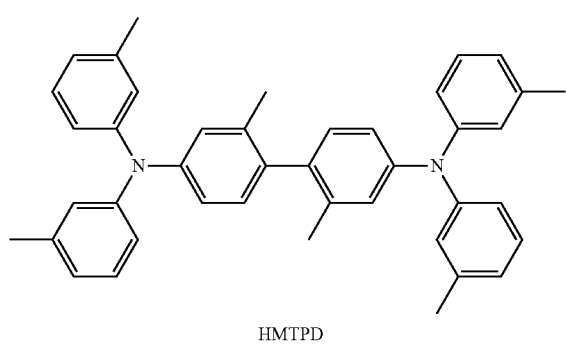

HMTPD

Formula 201

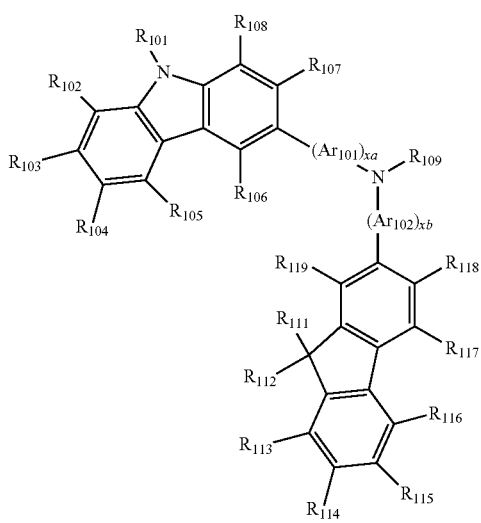

-continued

Formula 202

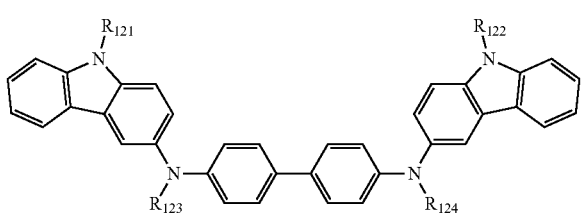

Ar$_{101}$ and Ar$_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

The designations xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like) or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A:

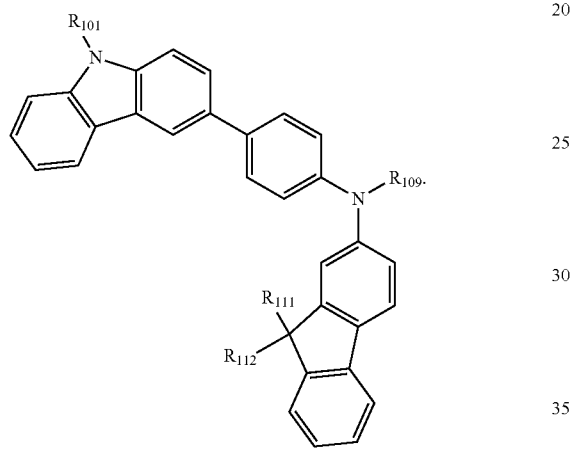

Formula 201A $R_{101}$, $R_{111}$, $R_{112}$, and $R_{109}$ in Formula 201A may be understood by referring to the description provided herein.

For example, the hole transport region may include one of Compounds HT1 to HT21 or any combination thereof:

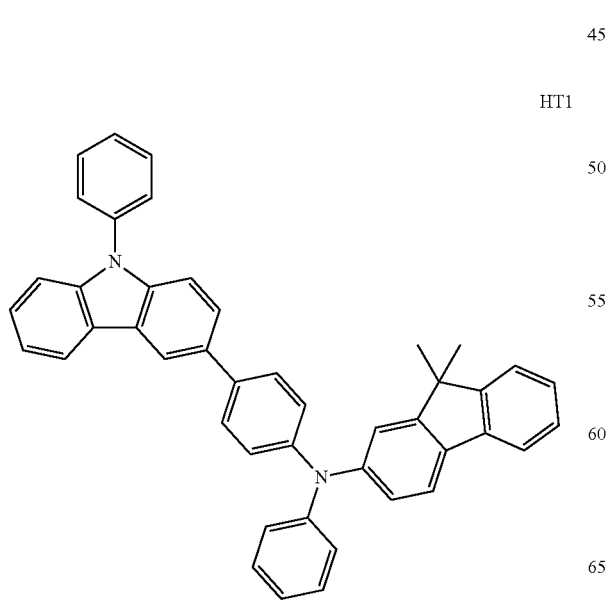

HT1

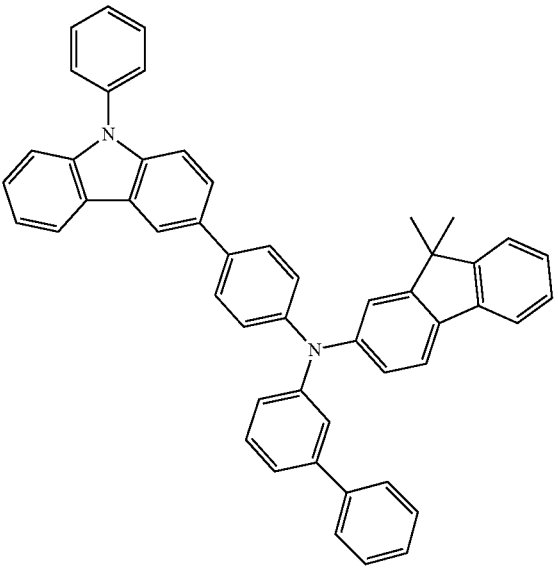

HT2

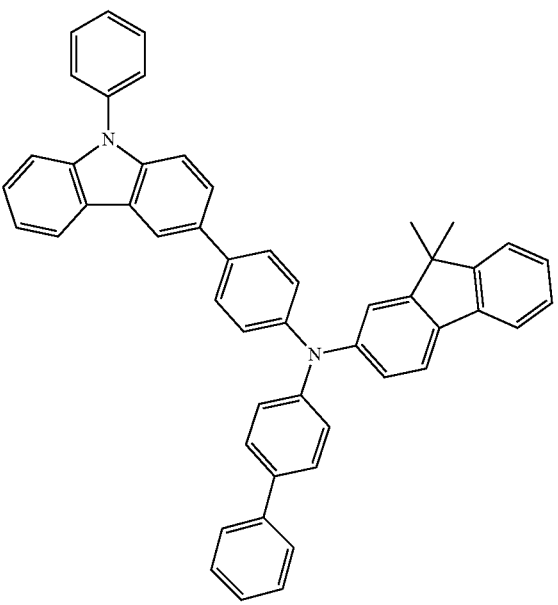

HT3

HT4
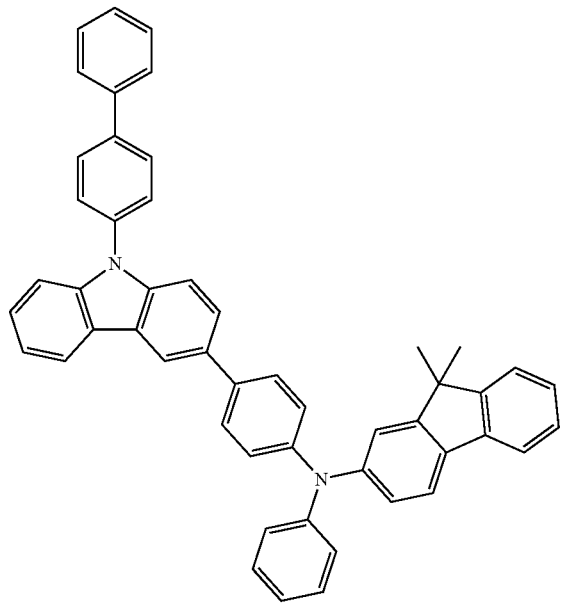
HT6
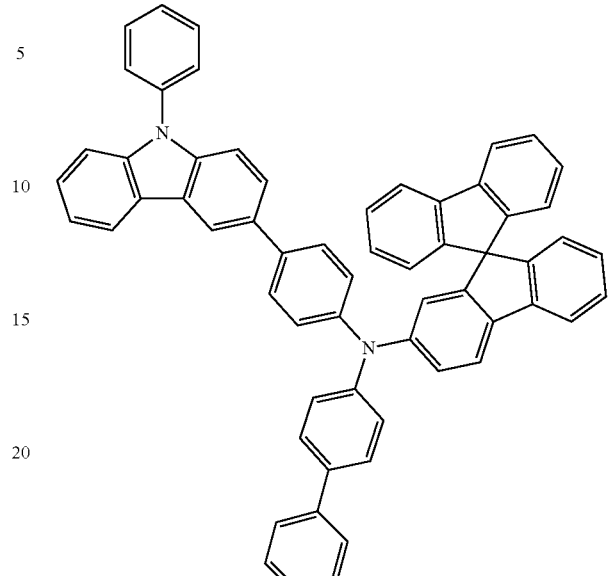
HT5
HT7
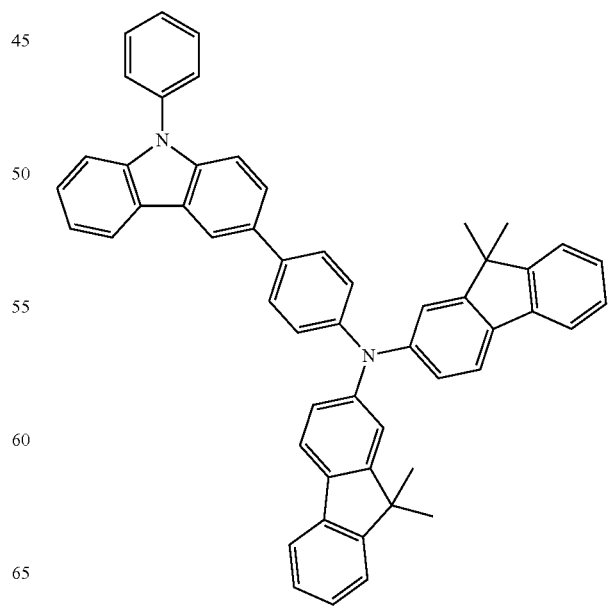

HT8
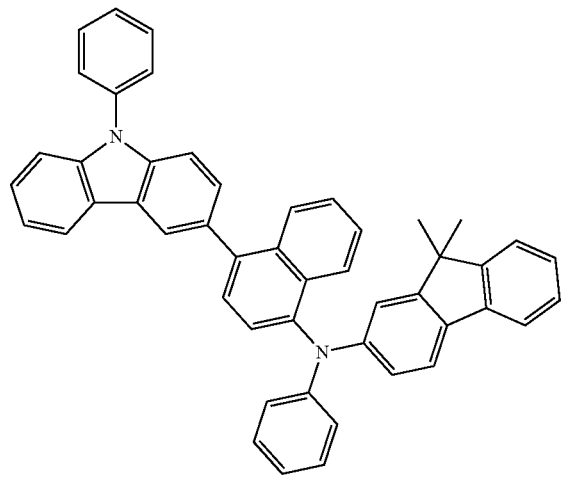
HT9
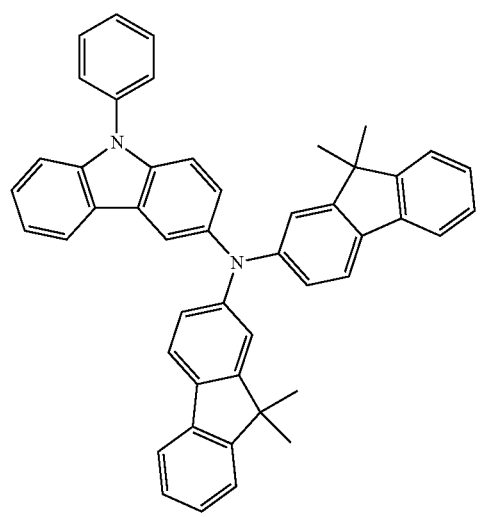
HT10
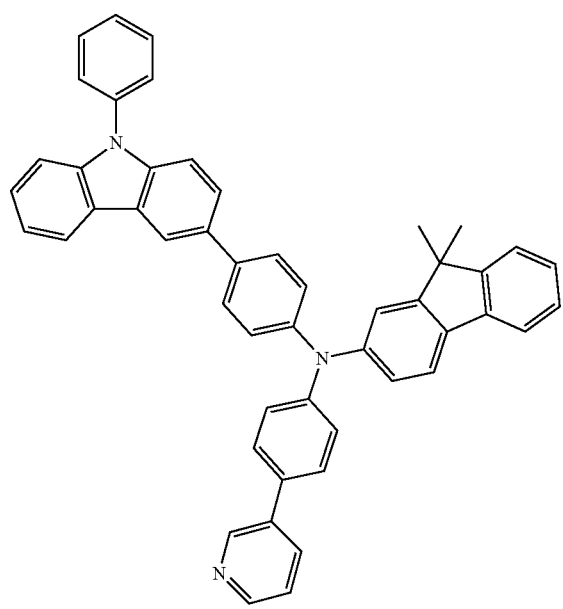
HT11
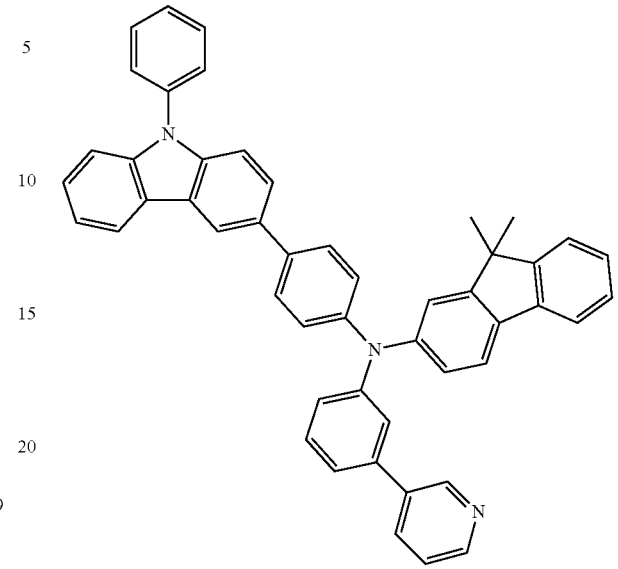
HT12
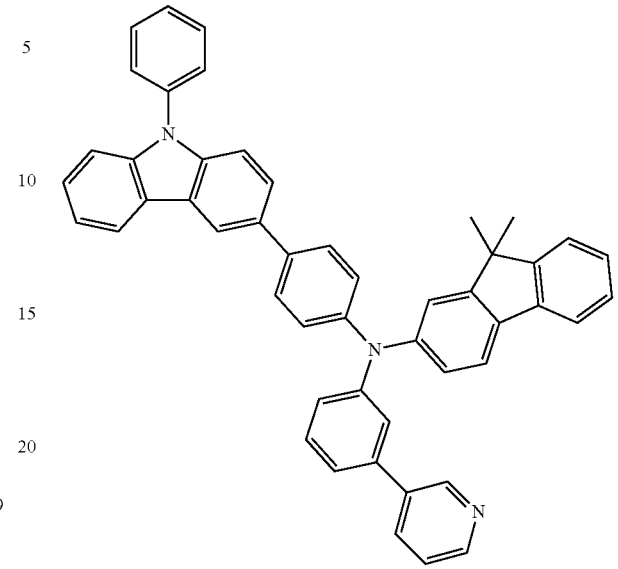
HT13
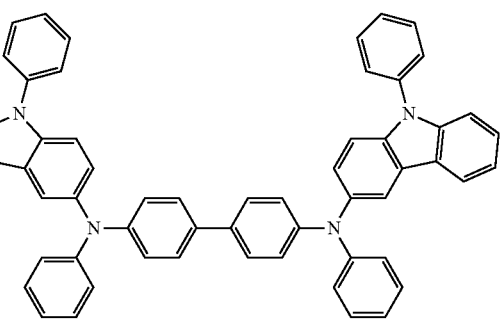

HT14
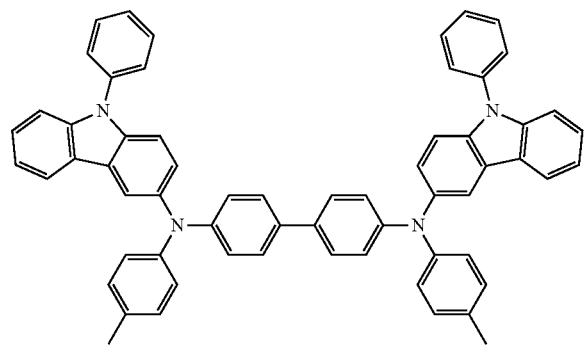
HT18
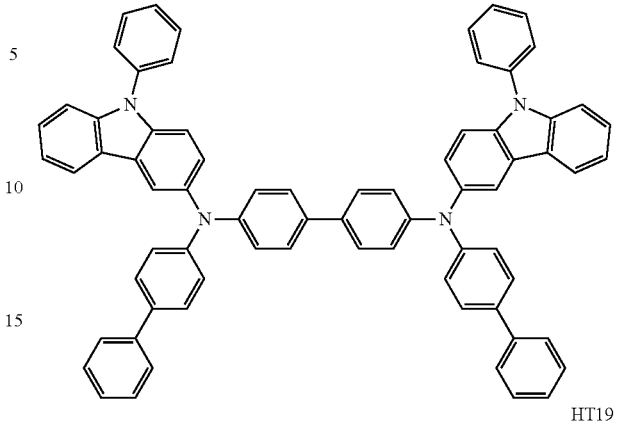
HT15
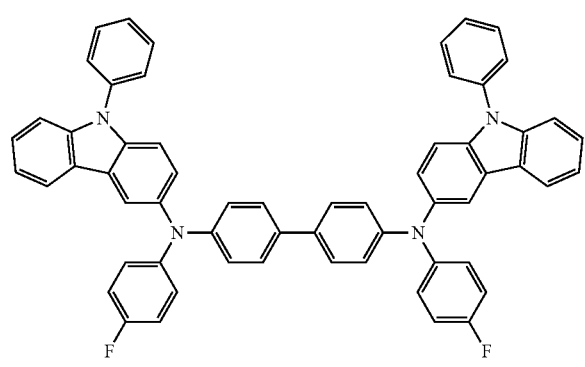
HT19
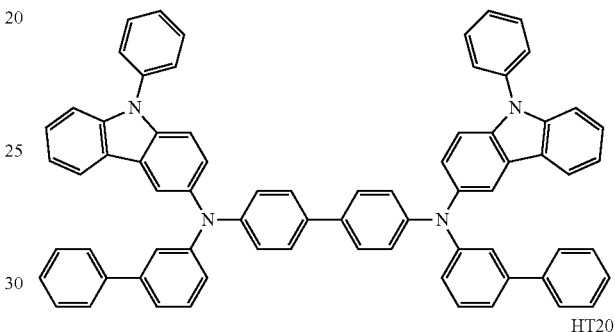
HT16
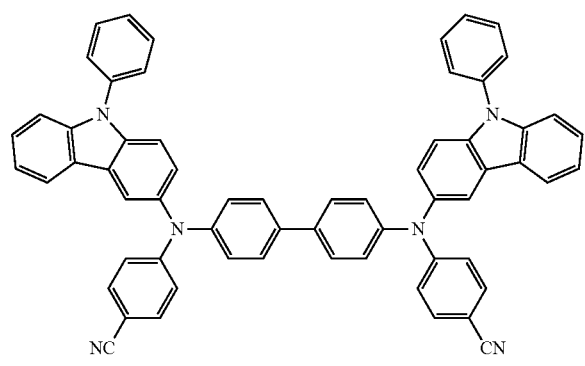
HT20
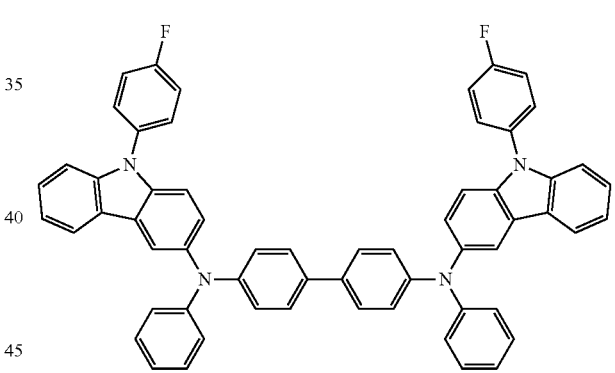
HT17
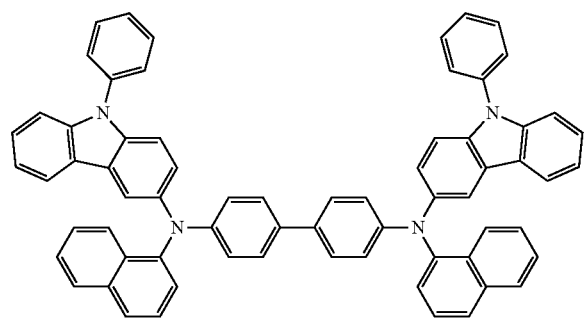
HT21
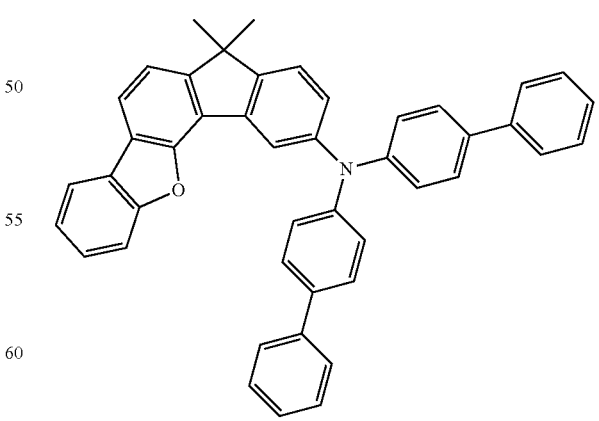
A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or any combination particular, but embodiments of the present disclosure are not limited thereto. For example, the p-dopant may be: a quinone derivative such as tetracyanoquinonedimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or any combination thereof.

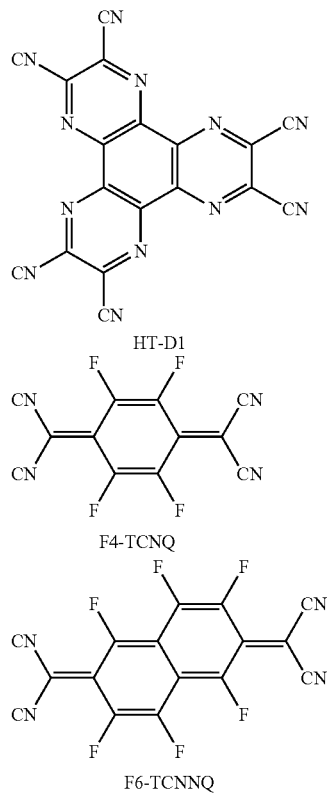

HT-D1

F4-TCNQ

F6-TCNNQ

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for forming the electron blocking layer may include a material that is used in the hole transport region as described above, a host material described below, or any combination thereof. For example, when the hole transport region includes an electron blocking layer, mCP, the Compound HT21, or any combination described below may be used as the material for forming an electron blocking layer.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

The emission layer may include a host and a dopant, and the dopant may include the organometallic compound represented by Formula 1 as described herein.

The host may include TPBi, TBADN, ADN (also referred to as "DNA"), CBP, CDBP, TCP, mCP, Compound H50, Compound H51, Compound H52, Compound H53, Compound H54, or any combination thereof:

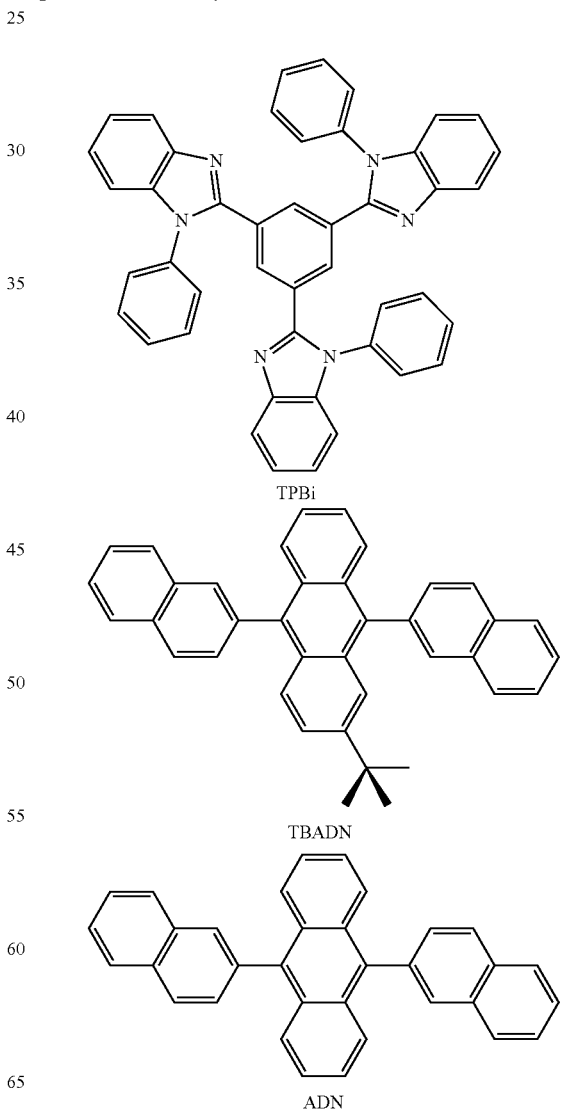

TPBi

TBADN

ADN

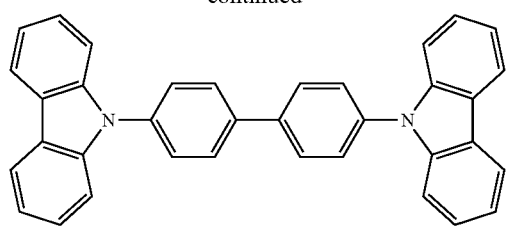
CBP
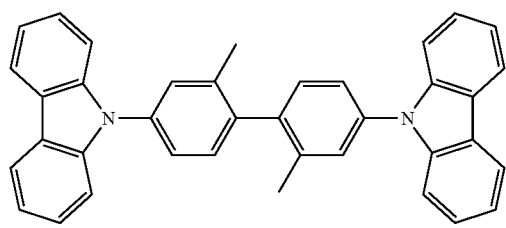
CDBP
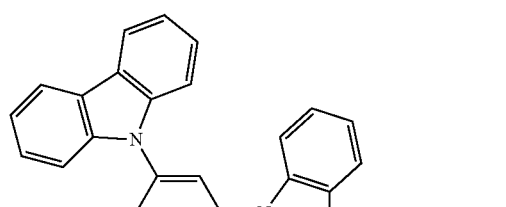
TCP
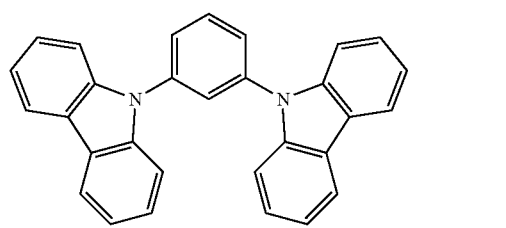
mCP
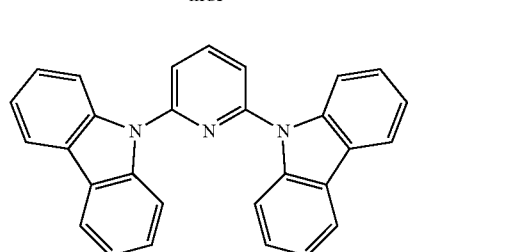
H50
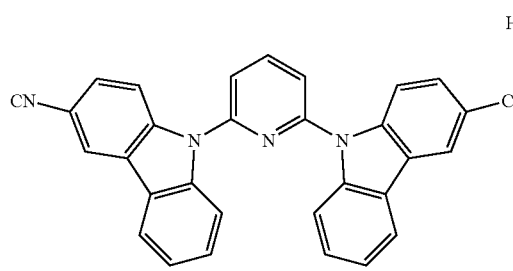
H51
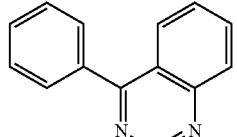
H52
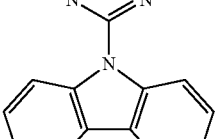
H53
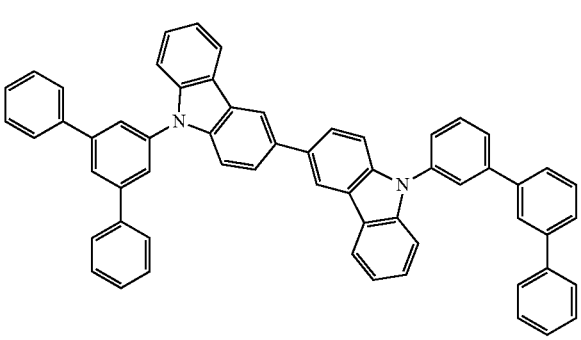
H54
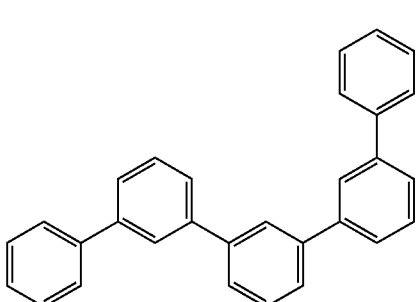
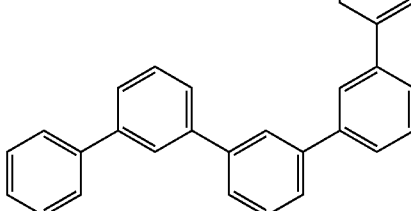
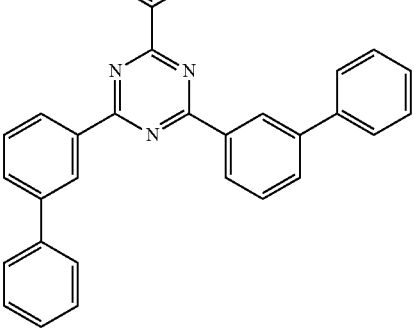
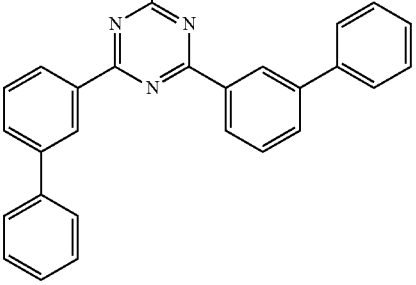
When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq.

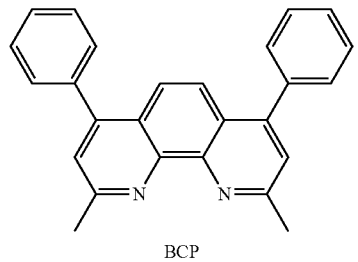

BCP

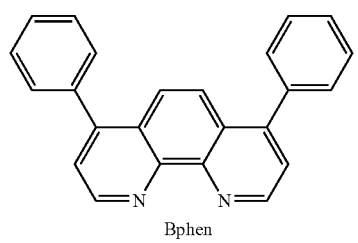

Bphen

In one or more embodiments, the hole blocking layer may include the host, a material for forming an electron transport layer, a material for forming an electron injection layer, which will be described later, or any combination thereof.

A thickness of the hole blocking layer may be in a range of about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, TPBi, Alq$_3$, BAlq, TAZ, NTAZ, or any combination thereof:

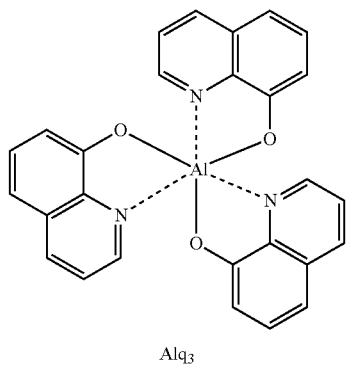

Alq$_3$

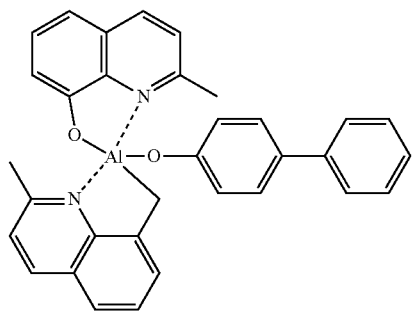

BAlq

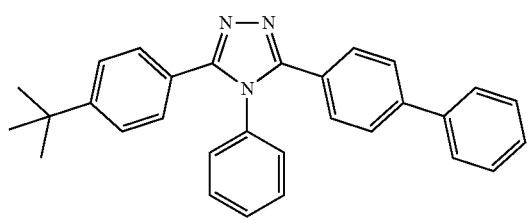

TAZ

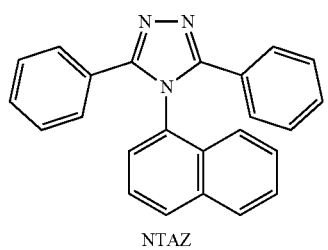

NTAZ

In one or more embodiments, the electron transport layer may include at least one of Compounds ET1 to ET25 or any combination thereof:

ET1
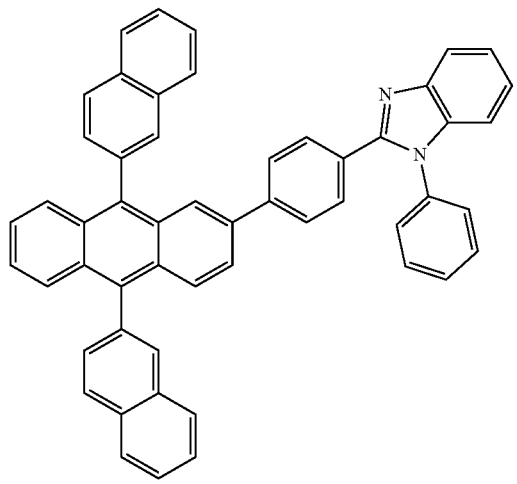
ET2
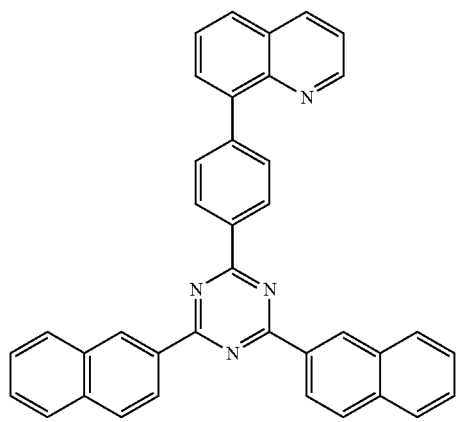
ET3
ET4
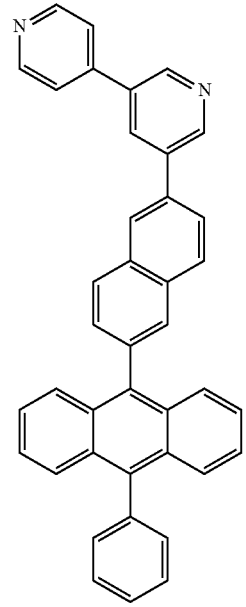
ET5
ET6
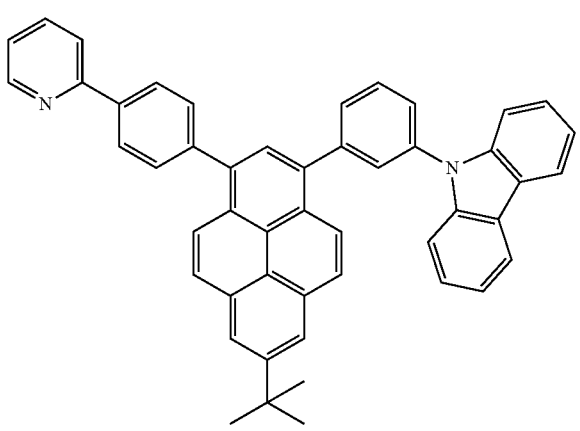

-continued
ET7
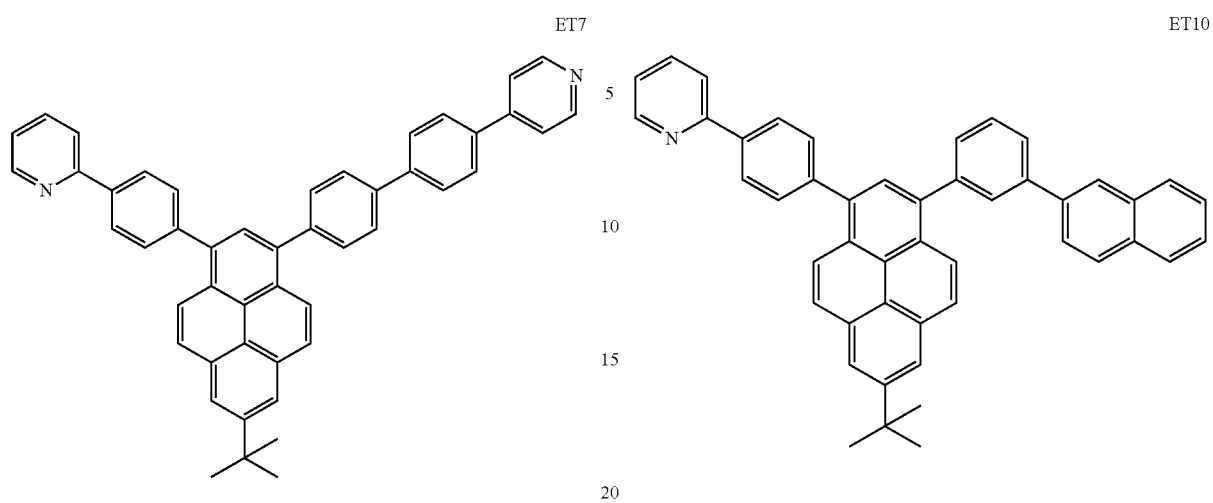
ET8
ET9
-continued
ET10
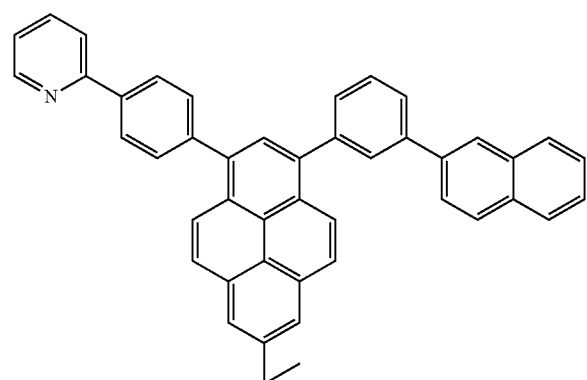
ET11
ET12
ET13

ET14
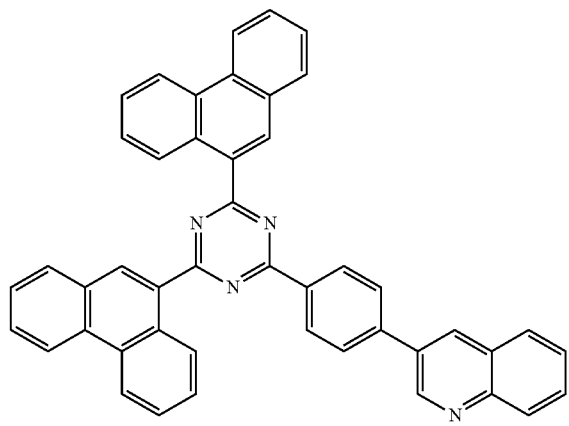
ET15
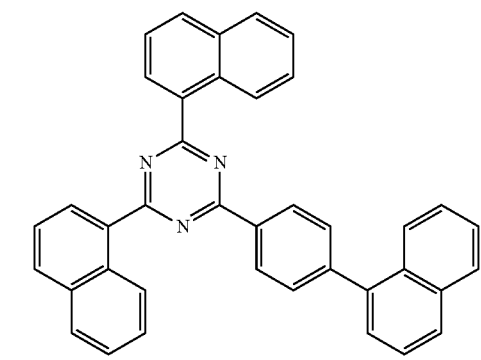
ET16
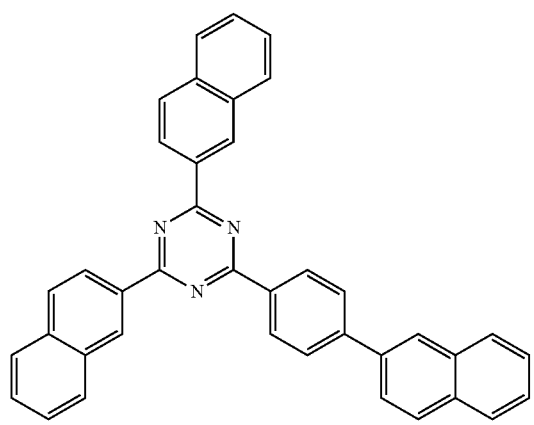
ET17
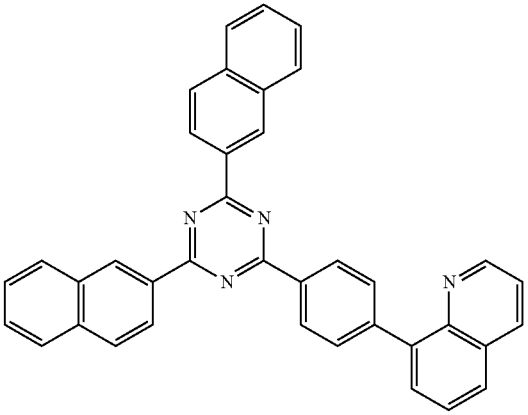
ET18
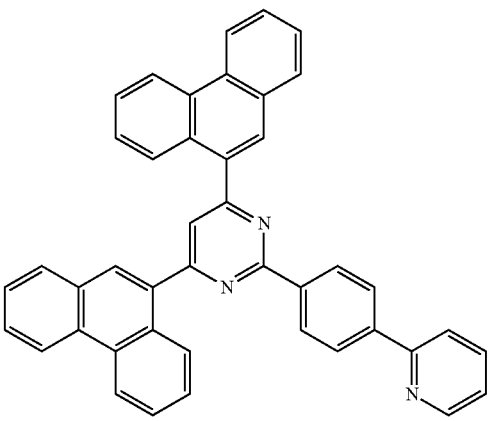
ET19
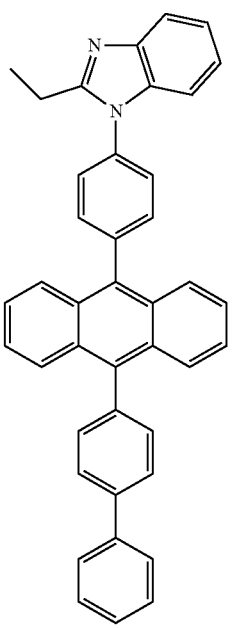

ET20
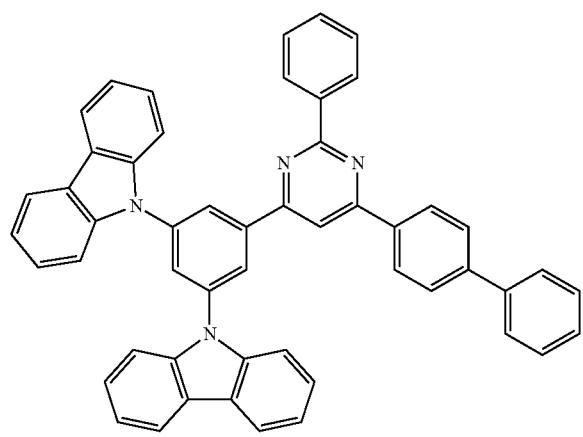
ET23
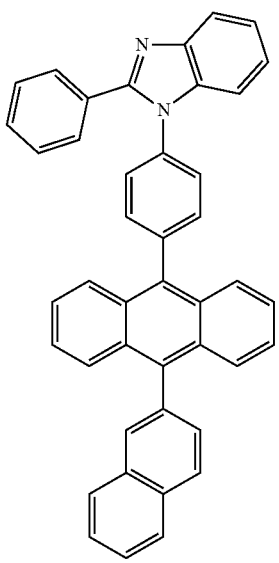
ET21
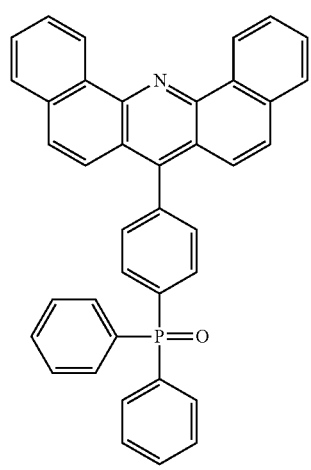
ET24
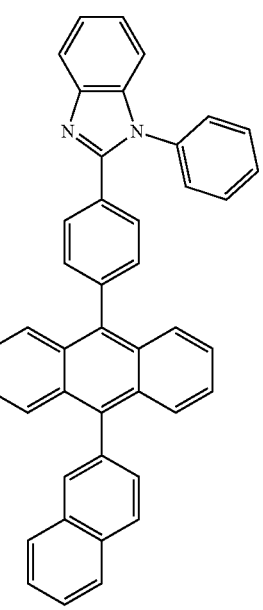
ET22
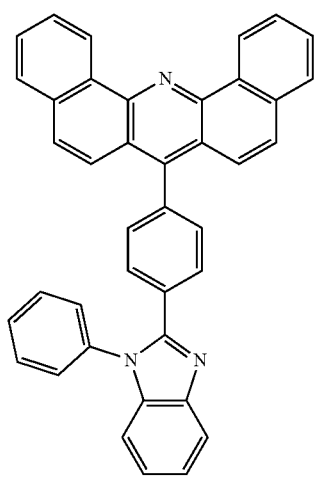
ET25
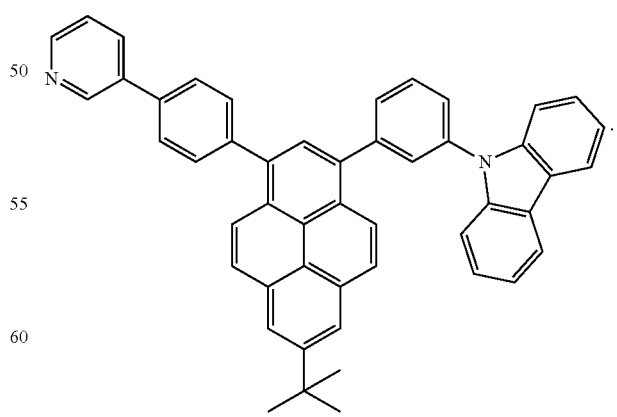
A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 or ET-D2:

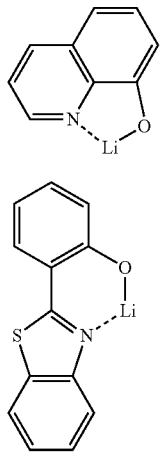

ET-D1

ET-D2

The electron transport region may include an electron injection layer (EIL) that promotes the flow of electrons from the second electrode 19 thereinto.

The electron injection layer may include LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, and the like.

Another aspect provides a diagnostic composition including at least one of the organometallic compound represented by Formula 1.

The organometallic compound represented by Formula 1 provides high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$, (wherein $A_{101}$, is the $C_1$-$C_{60}$ alkyl group), and examples thereof are a methoxy group, an ethoxy group, a propoxy group, a butoxy group, and a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and the $C_3$-$C_{10}$ cycloalkylene group is a divalent group having the same structure as the $C_3$-$C_{10}$ cycloalkyl group.

The term "$C_3$-$C_{10}$ cycloalkyl group" as used herein may include a cyclopropyl group, a cyclobutyl group, a cyclopentyl group, a cyclohexyl group, a cycloheptyl group, a cyclooctyl group, an adamantanyl group, a bicyclo[1.1.1]pentyl group, a bicyclo[2.1.1]hexyl group, a bicyclo[2.2.1]heptyl(norbornanyl) group, a bicyclo[2.2.2]octyl group, and the like.

The term "$C_1$-$C_{10}$ heterocycloalkyl group" as used herein refers to a monocyclic group that includes at least one N, O, P, Si, B, Se, Ge, S. or any combination thereof as a ring-forming atom and 1 to 10 carbon atoms, and the $C_1$-$C_{10}$ heterocycloalkylene group refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, a tetrahydrothiophenyl group, and the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one N, O, P, Si, B, Se, Ge, S, or any combination thereof as a ring-forming atom, 1 to 10 carbon atoms, and at least one carbon-carbon double bond in its ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The $C_7$-$C_{60}$ alkylaryl group used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having at least one hetero atom selected from N, O, P, Si, and S as a ring-forming atom and a cyclic aromatic system having 1 to 60 carbon atoms, and the term "$C_1$-$C_{60}$ heteroarylene group" as used herein refers to a divalent group having at least one N, O, P, Si, B, Se, Ge, S, or any combination thereof as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The $C_2$-$C_{60}$ alkyl heteroaryl group used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the $C_6$-$C_{60}$ arylthio group indicates —$SA_{103}$ (wherein $A_{103}$ indicates the $C_6$-$C_{60}$ aryl group), and the $C_1$-$C_{60}$ alkylthio group indicates —$SA_{104}$ (wherein $A_{104}$ indicates the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, at least one N, O, P, Si, B, Se, Ge, S, or any combination thereof other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{1a}$)" are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, a fluorene group (each unsubstituted or substituted with at least one $R_{1a}$).

The term "$C_1$-$C_{30}$ heterocyclic group" as used herein refers to a saturated or unsaturated cyclic group having, as a ring-forming atom, at least one N, O, P, Si, Se, Ge, B, S, or any combination thereof other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{1a}$)" may be, for example, a thiophene group, a furan group, a pyrrole group, a silole group, borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{1a}$).

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the "fluorinated $C_1$ alkyl group (that is, the fluorinated methyl group)" may include —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein are not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene group, and a 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene group, and a 5,5-dioxide group," in which, in each group, at least one carbon selected from ring-forming carbons is substituted with nitrogen.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof.

$Q_1$ to $Q_9$, $Q_{11}$ to $Q_{19}$, $Q_{21}$ to $Q_{29}$, and $Q_{31}$ to $Q_{39}$ described herein may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ described herein may each independently be:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 1)

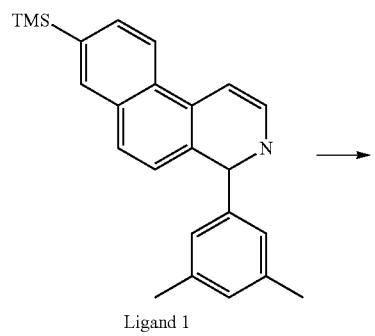

Ligand 1

-continued

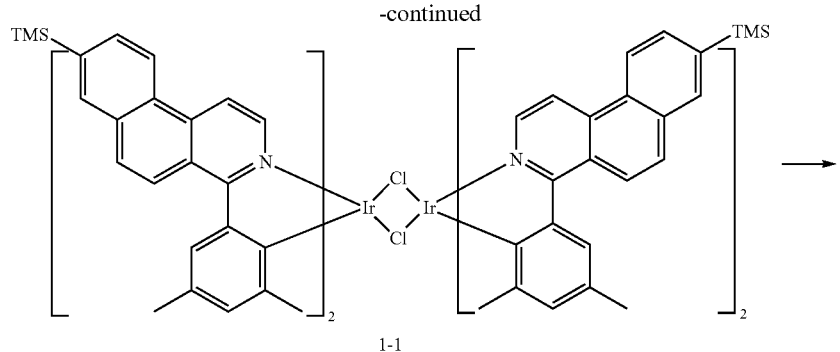

1-1

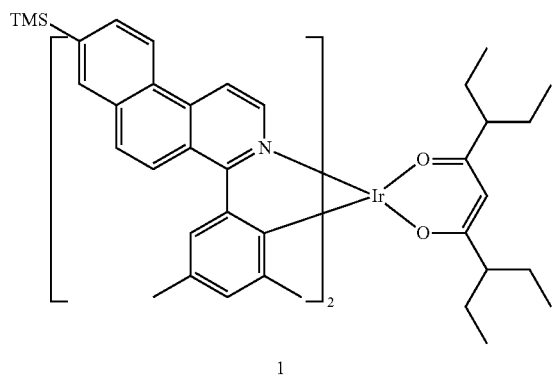

1

Synthesis of Intermediate 1-1

Ligand 1 (1.1 g, 3.1 mmol) and 0.5 g (1.5 mmol) of iridium chloride were mixed with 30 mL of ethoxyethanol and 10 mL of distilled water, and then the mixture was heated and refluxed for 16 hours. When the reaction was completed, the temperature was cooled to room temperature, and a solid material formed therefrom was filtered and washed thoroughly with water, methanol, and hexane in the stated order. An obtained solid was recrystallized, and then filtered and dried in a vacuum oven to obtain 0.72 g of Intermediate 1-1.

Synthesis of Compound 1

0.72 g (0.38 mmol) of Intermediate 1-1, 0.5 g (2.3 mmol) of 3,7-diethylnonane-4,6-dione, and 0.24 g (2.3 mmol) of $Na_2CO_3$ were mixed with 25 mL of ethoxyethanol, and then refluxed at 90° C. for 18 hours for reaction. When the reaction is completed, the temperature was cooled to room temperature, and a solid material formed therefrom was filtered and purified by liquid chromatography to obtain 0.7 g (yield of 82%) Compound 1. Compound 1 was identified by LC-MS.

LC-MS m/z=1114(M$^+$H)$^+$

Synthesis Example 2 (Compound 2)

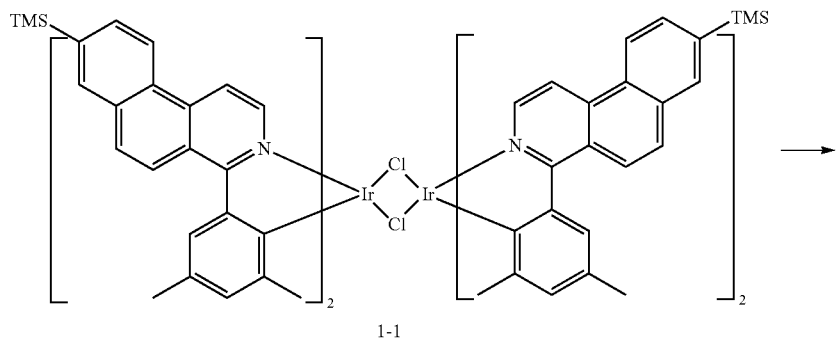

1-1

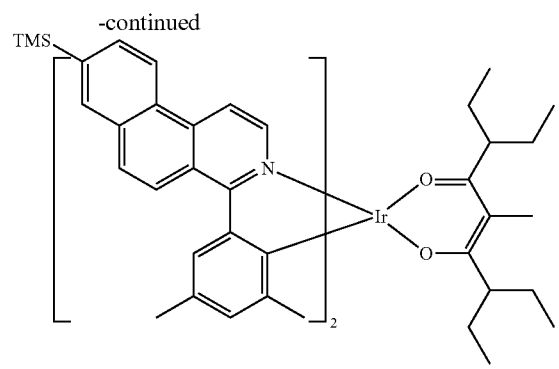
2
0.4 g (yield of 47%) of Compound 2 was obtained by using the same method as the synthesis method of Compound 1 of Synthesis Example 1, except that 3,7-diethyl-5-methylnonane-4,6-dione was used instead of 3,7-diethyl-nonane-4,6-dione. Compound 2 was identified by LC-MS.
LC-MS m/z=1128(M$^+$H)$^+$
Synthesis Example 3 (Compound 3)
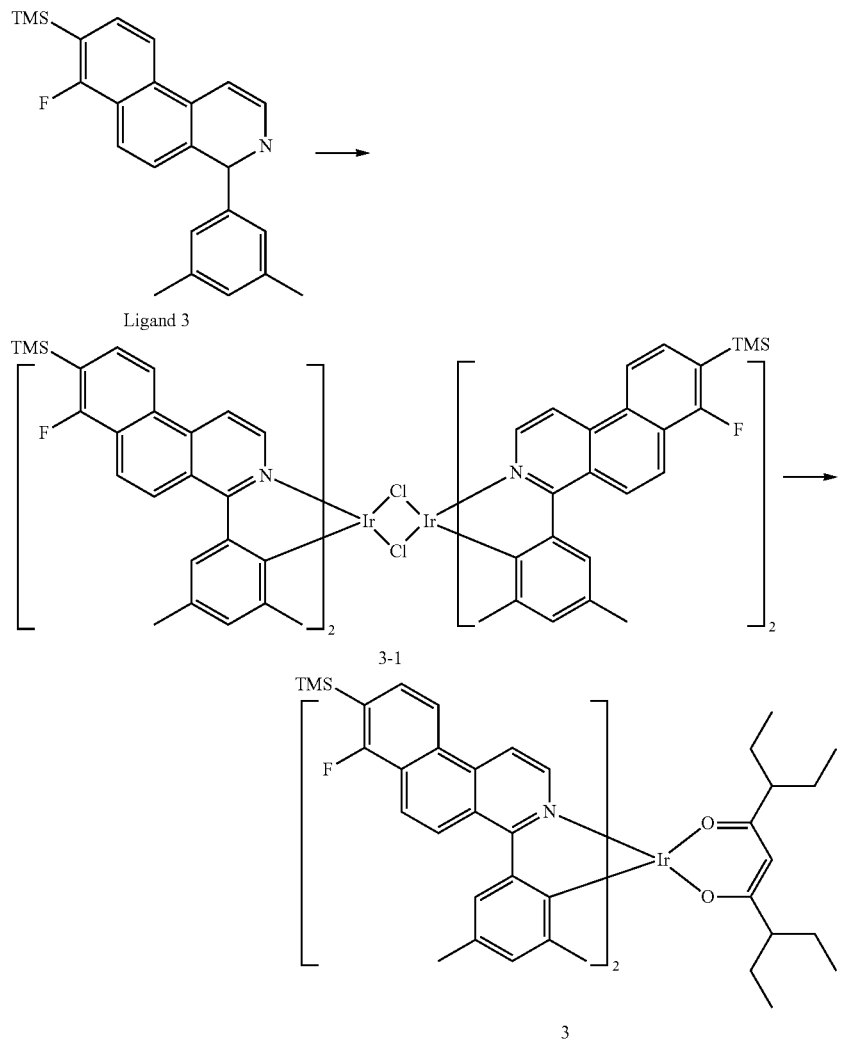

Synthesis of Intermediate 3-1

0.7 g of Intermediate 3-1 was obtained by using the same method as the synthesis method of Intermediate 1-1 of Synthesis Example 1, except that Ligand 3 was used instead of Ligand 1.

Synthesis of Compound 3

0.6 g (yield of 70%) of Compound 3 was obtained by using the same method as the synthesis method of Compound 1 of Synthesis Example 1, except that Intermediate 3-1 was used instead of Intermediate 1-1. Compound 3 was identified by LC-MS.

LC-MS m/z=1150(M$^+$H)$^+$

Synthesis Example 4 (Compound 4)

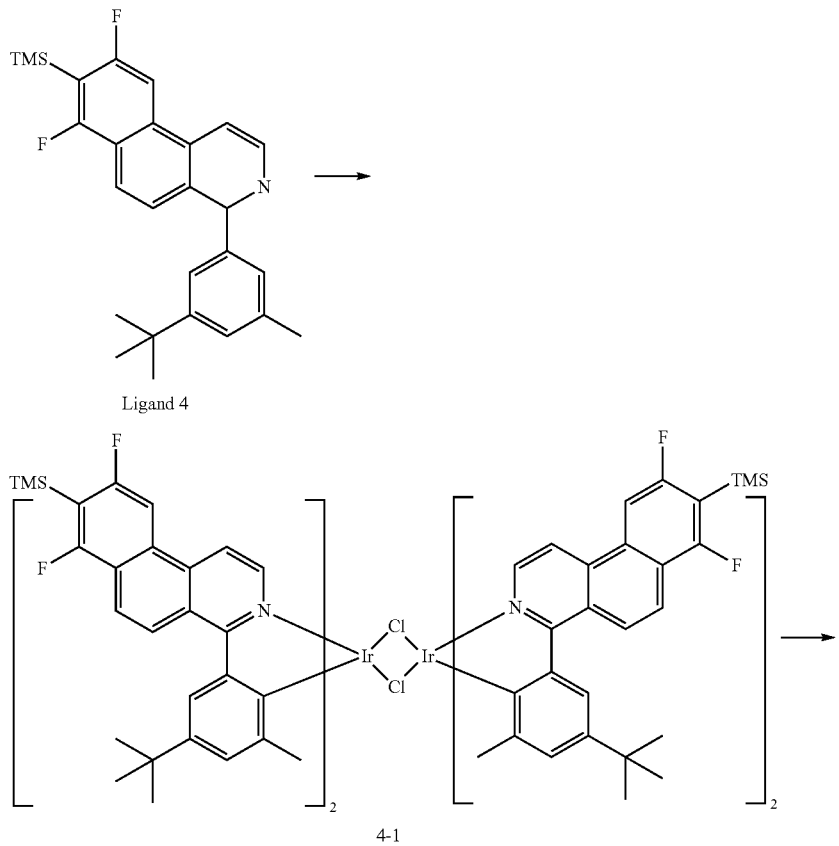

Ligand 4

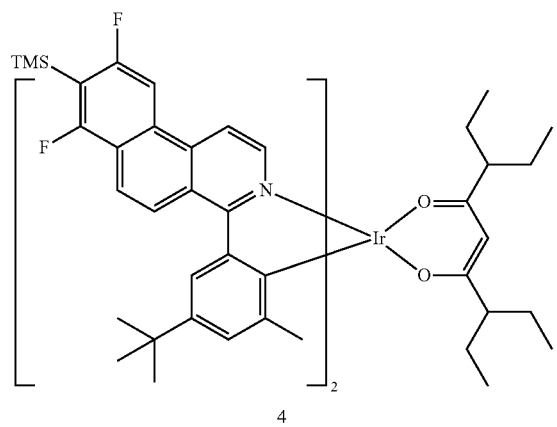

4-1

Synthesis of Intermediate 4-1

0.6 g of Intermediate 4-1 was obtained by using the same method as the synthesis method of Intermediate 1-1 of Synthesis Example 1, except that Ligand 4 was used instead of Ligand 1.

Synthesis of Compound 4

0.6 g (yield of 68%) of Compound 4 was obtained by using the same method as the synthesis method of Compound 1 of Synthesis Example 1, except that Intermediate 4-1 was used instead of Intermediate 1-1. Compound 4 was identified by LC-MS.

LC-MS m/z=1270(M$^+$H)$^+$

Synthesis Example 5 (Compound 5)

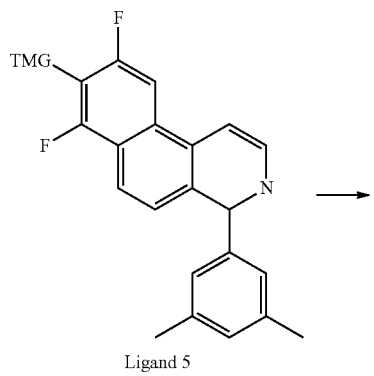

Ligand 5

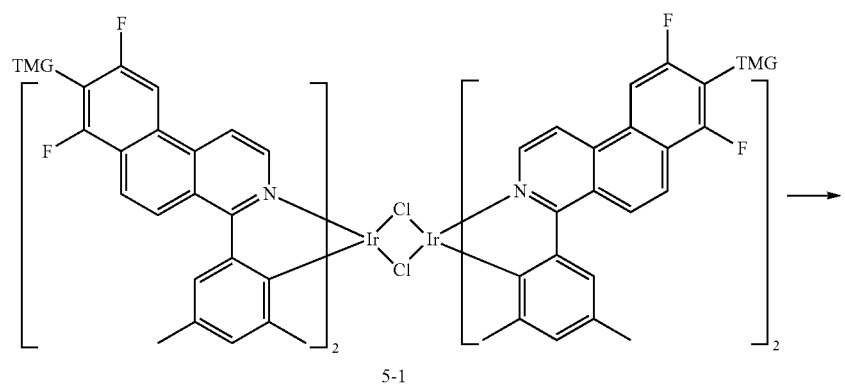

5-1

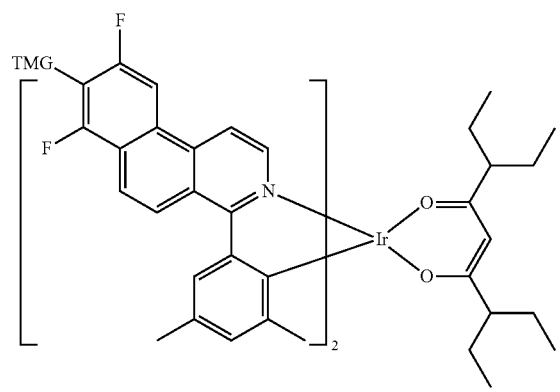

5

Synthesis of Intermediate 5-1

0.7 g of Intermediate 5-1 was obtained by using the same method as the synthesis method of Intermediate 1-1 of Synthesis Example 1, except that Ligand 5 was used instead of Ligand 1.

Synthesis of Compound 5

0.5 g (yield of 59%) of Compound 5 was obtained by using the same method as the synthesis method of Compound 1 of Synthesis Example 1, except that Intermediate 5-1 was used instead of Intermediate 1-1. Compound 5 was identified by LC-MS.

LC-MS m/z=1275(M$^+$H)$^+$

Synthesis of Intermediate 6-1

0.7 g of Intermediate 6-1 was obtained by using the same method as the synthesis method of Intermediate 1-1 of Synthesis Example 1, except that Ligand 6 was used instead of Ligand 1.

Synthesis of Compound 6

0.6 g (yield of 80%) of Compound 6 was obtained by using the same method as the synthesis method of Compound 1 of Synthesis Example 1, except that Intermediate 6-1 was used instead of Intermediate 1-1. Compound 6 was identified by LC-MS.

LC-MS m/z=1186(M$^+$H)$^+$

Synthesis Example 6 (Compound 6)

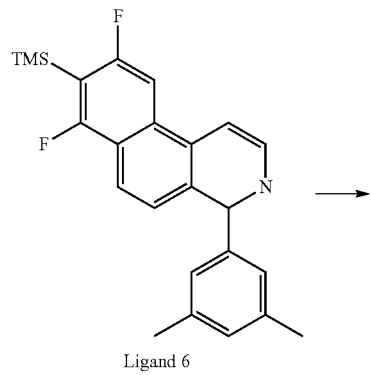

Ligand 6

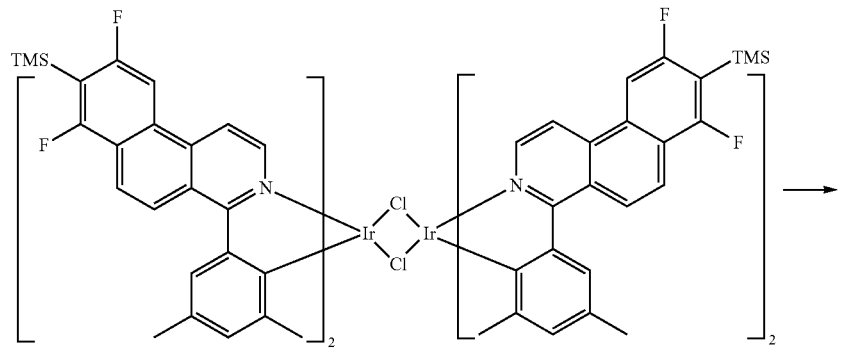

6-1

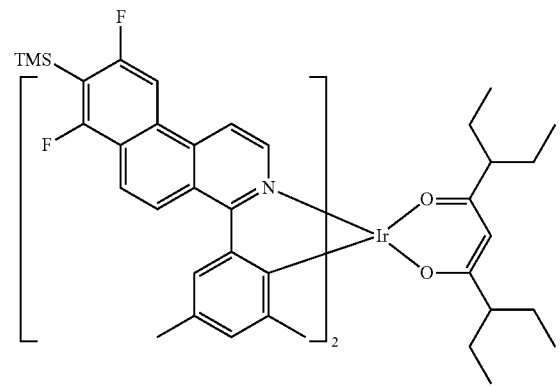

6

Synthesis Example 7 (Compound 16)

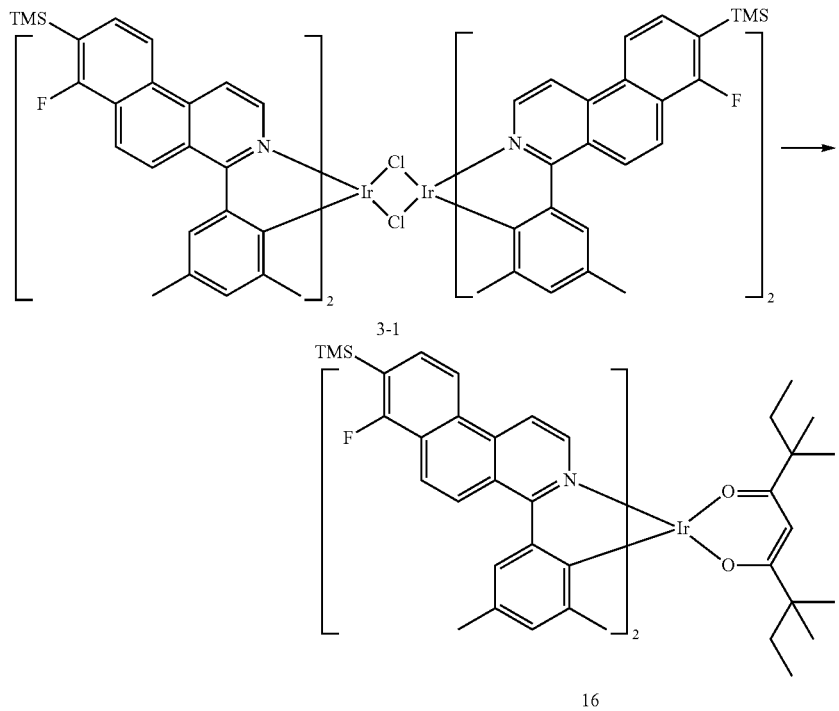

0.6 g (yield of 67%) of Compound 16 was obtained by using the same method as the synthesis method of Compound 3 of Synthesis Example 3, except that 3,3,7,7-tetramethylnonane-4,6-dione was used instead of 3,7-diethylnonane-4,6-dione. Compound 16 was identified by LC-MS.

LC-MS m/z=1150(M+H)$^+$

Evaluation Example 1: Evaluation of HOMO and LUMO Energy Level

According to the method of Table 2, HOMO and LUMO energy levels of Compounds 1 to 6 and 16 were evaluated, and results thereof are shown in Table 3.

TABLE 2

| HOMO energy level evaluation method | 1) Differential pulse voltammetry (DPV) (electrolyte: 0.1M Bu$_4$NPF$_6$ in MC, Pulse height: 50 mV, Pulse width: 1 sec, Step height: 10 mV, Step width: 2 sec, scan rate: 5 mV/sec, reference electrode: Ag/AgNO$_3$) is used to obtain a potential(V)-current(mA) graph of each Compound, and then E$_{peak}$(eV) which is an oxidation peak potential of the graph is evaluated (here, when a HOMO energy range exceeds a solvent window, a solvent is changed for measurement).<br>2) E$_{peak}$(eV) is substituted for E$_{peak}$ in the equation of HOMO(eV) = −4.8 − (E$_{peak}$ − E$_{peak}$(Ferrocene)) to evaluate HOMO energy level (eV) of each Compound. |
| --- | --- |
| LUMO energy level evaluation method | 1) Differential pulse voltammetry (DPV) (electrolyte: 0.1M Bu$_4$NPF$_6$ in dimethylformamide, Pulse height: 50 mV, Pulse width: 1 sec, Step height: 10 mV, Step width: 2 sec, scan rate: 5 mV/sec, reference electrode: Ag/AgNO$_3$) is used to obtain a potential(V)-current(mA) graph of each Compound, and then E$_{peak}$(eV) which is a reduction peak potential of the graph is evaluated (here, when a LUMO energy range exceeds a solvent window, a solvent is changed for measurement). |

TABLE 2-continued

2) E$_{peak}$(eV) is substituted for E$_{peak}$ in the equation of LUMO(eV) = −4.8 − (E$_{peak}$ − E$_{peak}$(Ferrocene)) to evaluate LOMO energy level (eV) of each Compound.

TABLE 3

| Compound No. | HOMO DPV (eV) | LUMO DPV (eV) |
| --- | --- | --- |
| 1 | −5.10 | −2.46 |
| 2 | −5.04 | −2.44 |
| 3 | −5.14 | −2.55 |
| 4 | −5.17 | −2.61 |
| 5 | −5.15 | −2.59 |
| 6 | −5.15 | −2.61 |
| 16 | −5.11 | −2.53 |

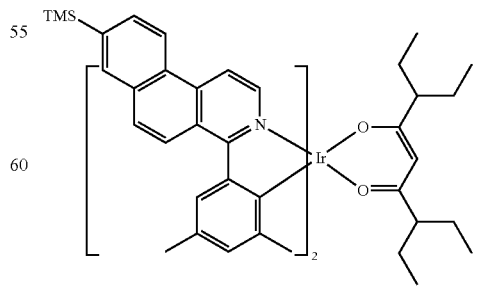

1

TABLE 3-continued

| Compound No. | HOMO DPV (eV) | LUMO DPV (eV) |
|---|---|---|
| 2 | | |
| 3 | | |
| 4 | | |
| 5 | | |
| 6 | | |
| 16 | | |

Referring to Table 3, it is confirmed that Compounds 1 to 6 and 16 have excellent electrical characteristics.

Evaluation Example 2: Decay Time Measurement

A quartz substrate washed by using chloroform and pure water was prepared, and then a predetermined material shown in Table 4 was vacuum(co)-deposited at a vacuum pressure of $10^{-7}$ torr to prepare Films 1 to 6 and 16 each having a thickness of 50 nm.

Subsequently, PL spectrum of each of Films 1 to 6 and 16 was evaluated at room temperature by using TRPL measurement system FluoTime 300 manufactured by PicoQuant and a pumping source PLS340 manufactured by PicoQuant (excitation wavelength=340 nm, spectral width=20 nm), and then the wavelength of main 340 repeated the measure of the number of photons emitted from each Film at the main peak by a photon pulse (pulse width=500 picoseconds) applied to each Film according to the time, based on time-correlated single photon counting (TCSPC), thereby obtaining a sufficiently fittable TRPL curve. Two or more exponential decay functions were fitted to the result obtained therefrom, thereby obtaining $T_{decay}$(Ex), that is, decay time, of each of Films 1 to 6 and 16 and results thereof are shown in Table 4. A function for fitting is as shown in Equation 1, and from among $T_{decay}$ values obtained from each exponential decay function used for fitting, the largest $T_{decay}$ was obtained as $T_{decay}$ (Ex). In this regard, the same measurement was performed during the same measurement time as that for obtaining TRPL curve in the dark state (in which pumping signals entering a film are blocked) to obtain a baseline or a background signal curve for use as a baseline for fitting.

$$f(t) = \sum_{i=1}^{n} A_i \exp(-t/T_{decay,i})$$ Equation 1

TABLE 4

| Film no. | Compound used in film production | Decay time (μs) |
|---|---|---|
| 1 | Compound H52:Compound 1 (weight ratio of 98:2) | 0.68 |
| 2 | Compound H52:Compound 2 (weight ratio of 98:2) | 0.63 |
| 3 | Compound H52:Compound 3 (weight ratio of 98:2) | 0.63 |
| 4 | Compound H52:Compound 4 (weight ratio of 98:2) | 0.78 |
| 5 | Compound H52:Compound 5 (weight ratio of 98:2) | 0.78 |
| 6 | Compound H52:Compound 6 (weight ratio of 98:2) | 0.73 |
| 16 | Compound H52:Compound 16 (weight ratio of 98:2) | 0.64 |

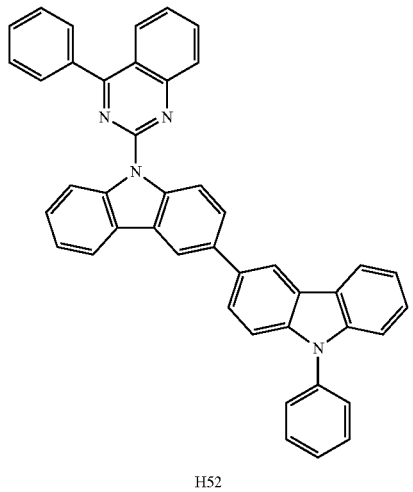 [SMILES: c1ccc(-c2nc(-n3c4ccccc4c4cc(-c5ccc6c(c5)c5ccccc5n6-c5ccccc5)ccc43)nc3ccccc23)cc1 ; "H52"]

H52

Referring to Table 4, Compounds 1 to 6 and 16 have relatively small decay time characteristics.

Evaluation Example 3: Horizontal Orientation Ratio (Optical Orientation Ratio)

In a vacuum deposition apparatus having a vacuum pressure of $1 \times 10^{-7}$ torr, Compound H52 and Compound 1 were co-deposited at a weight ratio of 98:2 on a fused silica layer (thickness: 1 mm) to form a film having a thickness of 40 nm, and then sealed with glass and glue under a nitrogen atmosphere.

Meanwhile, an angle-dependent PL measurement apparatus having the same structure as that shown in FIG. 3 of Korean Patent Application Publication No. 2013-0150834 was prepared. Detail specifications are as follows:
Excitation-light wavelength: 325 nm
Source of excitation-light: He—Cd laser of Melles Griot Inc.
Excitation-light irradiation member: optical fiber having a diameter of 1 mm of Thorlabs Inc.
Semi-cylindrical prism: a fused silica having a diameter of 100 mm and a length of 30 mm
Emitted-light detection member: photomultiplier tube of Acton Inc.
Polarizer mounted on emitted-light detection member: linear polarizer of Thorlabs Inc.
Recoder: SpectraSense of Acton Inc.
Incidence angle of excitation light: θP=45°, θH=0°
Distance from a sample to the emitted-light detection member (or a radius of a movement path of the emitted-light detection member): 900 mm Subsequently, the film was fixed on a semi-cylindrical lens and irradiated with 325 nm laser to emit light. The emitted light passed through a polarization film, and then, in order to measure a p-polarized photoluminescence intensity with respect to light in a Max wavelength of a spectrum in a range of 90 degree to 0 degree, the semi-cylindrical lens, on which the sample was fixed, was rotated by 1 degree with respect to an axis of the semi-cylindrical lens by using a charge-coupled device (CCD).

The p-polarized photoluminescence intensity (a first p-polarized photoluminescence intensity) in a case where each compound is vertically aligned and the p-polarized photoluminescence intensity (a second p-polarized photoluminescence intensity) in a case where each compound is horizontally aligned were respectively calculated within a range of 0 to 90 degrees. The p-polarized photoluminescence intensity obtained by multiplying the first p-polarized photoluminescence intensity and the second p-polarized photoluminescence intensity respectively by a weight value was obtained to obtain a weight value corresponding to the measured p-polarization photoluminescence intensity. Then, the horizontal orientation ratio of each compound shown in Table 5 was measured and results thereof are shown in Table 5. Here, the angle-dependent photoluminescence spectrum was analyzed using a classical dipole model which regards light emitted from excitons as dissipated power from an oscillating dipole, and the horizontal orientation ratio for Compound 1 was evaluated.

This was performed on each of Compounds 2 to 6, 16 and A and results thereof are shown in Table 5.

TABLE 5

| Co-deposition material | Horizontal orientation ratio (optical orientation rato) (%) |
|---|---|
| H52: Compound 1 (2 wt %) | 94 |
| H52: Compound 2 (2 wt %) | 93 |
| H52: Compound 3 (2 wt %) | 93 |
| H52: Compound 4 (2 wt %) | 92 |
| H52: Compound 5 (2 wt %) | 94 |
| H52: Compound 6 (2 wt %) | 94 |
| H52: Compound 16 (2 wt %) | 93 |
| H52: Compound A (2 wt %) | 87 |

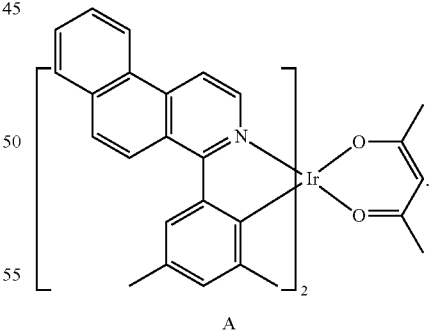

A

Referring to Table 5, it is confirmed that Compounds 1 to 6 and 16 have excellent optical orientation ratios, compared with Compound A. Example 1-1 (deposition process)

As an anode, an ITO-patterned glass substrate was cut to a size of 50 mm×50 mm×0.5 mm, sonicated with isopropyl alcohol and pure water each for 5 minutes, and then cleaned by exposure to ultraviolet rays and ozone for 30 minutes. The resultant glass substrate was loaded onto a vacuum deposition apparatus.

On the ITO anode, HT3 and F6TCNNQ were vacuum-codeposited at a weight ratio of 98:2 to form a hole injection layer having a thickness of 100 Å, HT3 was vacuum-deposited on the hole injection layer to form a hole transport layer having a thickness of 1,350 Å, and HT21 was vacuum-deposited on the hole transport layer to form an electron blocking layer having a thickness of 300 Å.

Subsequently, H52 (host) and Compound 1 (dopant) were co-deposited at a weight ratio of 98:2 on the electron blocking layer to form an emission layer having a thickness of 400 Å.

Thereafter, ET3 and ET-D1 were co-deposited at a volume ratio of 50:50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device having a structure of ITO (1,500 Å)/HT3+F6TCNNQ (2 wt %) (100 Å)/HT3 (1350 Å)/HT21 (300 Å)/H52+Compound 1 (2 wt %) (400 Å)/ET3+ET-D1 (50%) (350 Å)/ET-D1 (10 Å)/Al (1,000 Å).

HT3

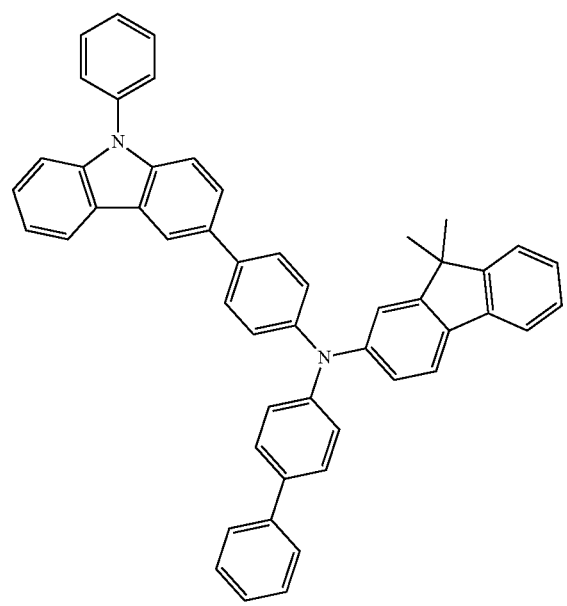

F6-TCNNQ

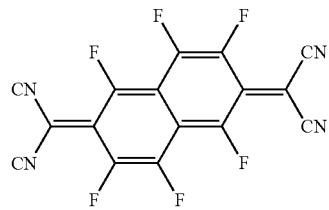

-continued

HT21

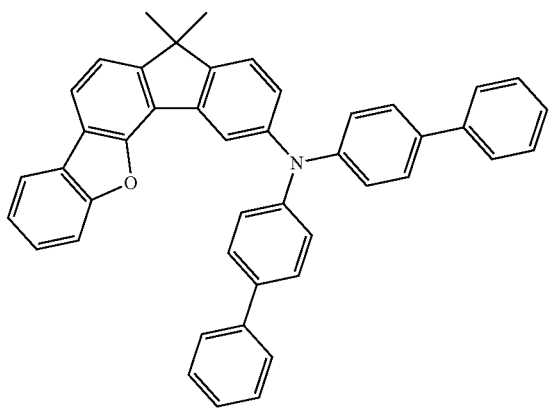

H52

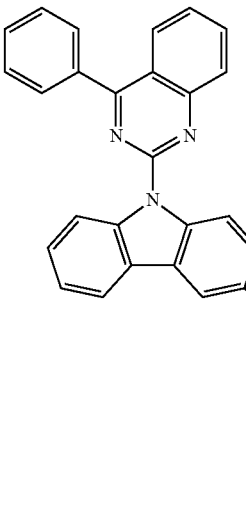

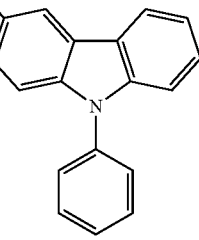

ET3

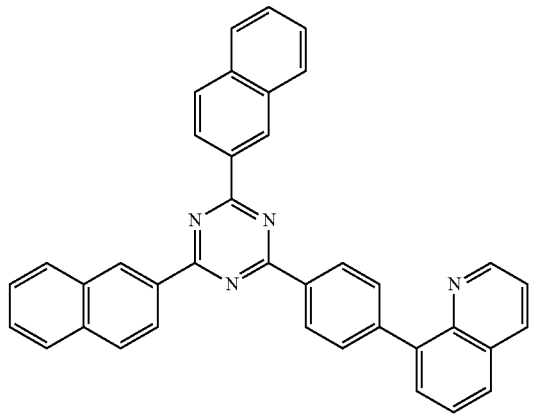

ET-D1

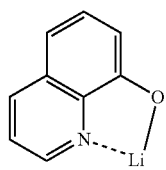

Examples 1-2 to 1-7 and Comparative Example 1-A

Organic light-emitting devices were manufactured in the same manner as in Example 1-1, except that Compounds shown in Tables 6 and 7 were each used instead of Compound 1 as a dopant in forming an emission layer.

Evaluation Example 4: Characteristics Evaluation of Organic Light-Emitting Device (Deposition Process)

The driving voltage, current density, current efficiency, external quantum efficiency (EQE), roll-off ratio, emission peak wavelength of an EL spectrum, full width at half maximum (FWHM) of an EL spectrum, and CIE x coordinate of each organic light-emitting device manufactured according to Examples 1-1 to 1-7 and Comparative Examples 1-A were evaluated, and results thereof were shown in Tables 6 and 7. As evaluation apparatuses, a current-voltage meter (Keithley 2400) and a luminance meter (Minolta Cs-1000A) were used. The roll-off ratio was calculated according to Equation 20 below.

Roll off ratio={1−(efficiency(at 3500 nit)/maximum emission efficiency)}×100%   Equation 20

TABLE 6

| | Dopant Compound No. | Driving Voltage Voltage (V) | Current density (mA/cm$^2$) | Max Current efficiency (cd/A) | Max EQE (%) | Roll-off ratio (%) | Maximum emission wavelength (nm) | FWHM (nm) | Color coordinate (CIEx) |
|---|---|---|---|---|---|---|---|---|---|
| Example 1-1 | 1 | 4.49 | 8.89 | 42.4 | 32.7 | 7 | 614 | 46.54 | 0.656 |
| Comparative Example 1-A | A | 4.80 | 10.19 | 37.4 | 27.8 | 8 | 612 | 60.00 | 0.647 |

TABLE 7

| | Dopant Compound No. | Driving Voltage Voltage (V) | Current density (mA/cm$^2$) | Max Current efficiency (cd/A) | Max EQE (%) | Roll-off ratio (%) | Maximum emission wavelength (nm) | FWHM (nm) | Color coordinate (CIEx) |
|---|---|---|---|---|---|---|---|---|---|
| Example 1-2 | 2 | 4.56 | 9.72 | 27.6 | 31.7 | 10 | 623 | 51.93 | 0.675 |
| Example 1-3 | 3 | 4.63 | 9.14 | 28.8 | 32.0 | 12 | 622 | 49.36 | 0.670 |
| Example 1-4 | 4 | 4.45 | 8.80 | 23.4 | 28.1 | 13 | 624 | 49.01 | 0.667 |
| Example 1-5 | 5 | 4.56 | 9.89 | 24.1 | 30.7 | 12 | 627 | 50.00 | 0.672 |
| Example 1-6 | 6 | 4.89 | 10.02 | 21.6 | 31.1 | 13 | 630 | 50.97 | 0.677 |
| Example 1-7 | 16 | 4.58 | 9.02 | 26.6 | 32.6 | 12 | 623 | 49.82 | 0.673 |

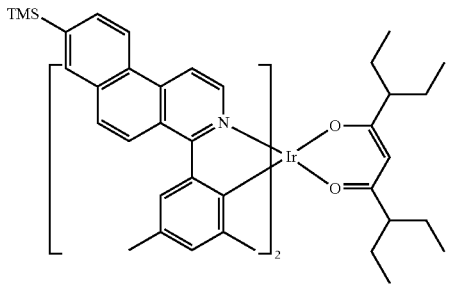

1

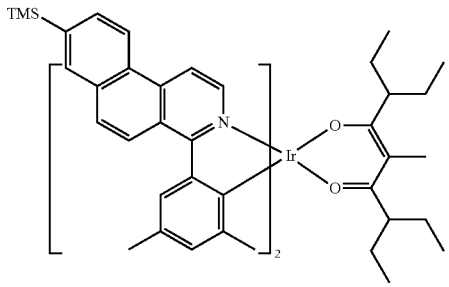

2

TABLE 7-continued
| Dopant Compound No. | Driving Voltage (V) | Current density (mA/cm²) | Max Current efficiency (cd/A) | Max EQE (%) | Roll-off ratio (%) | Maximum emission wavelength (nm) | FWHM (nm) | Color coordinate (ClEx) |
|---|---|---|---|---|---|---|---|---|
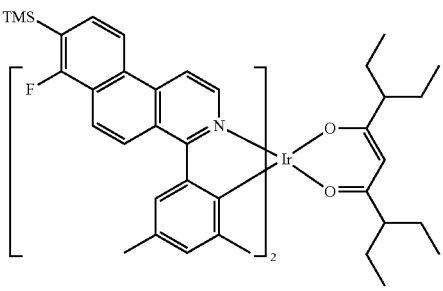
3
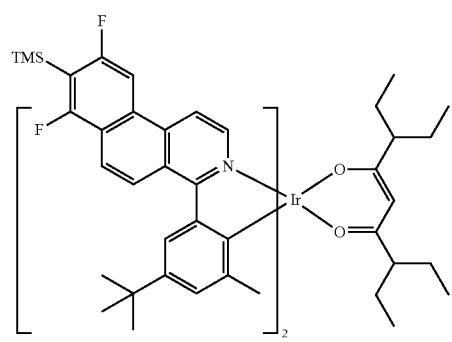
4
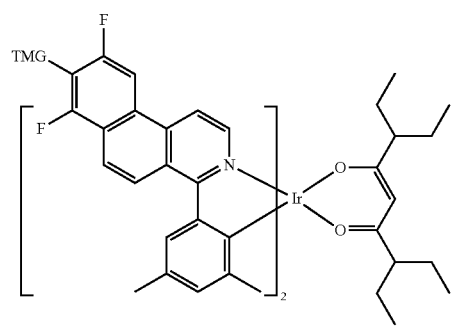
5
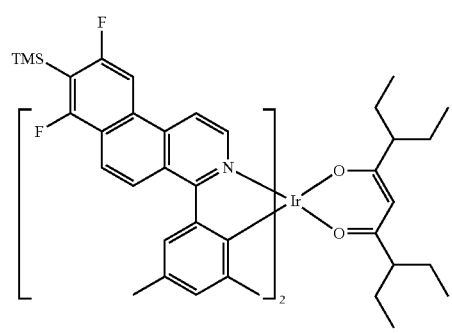
6

TABLE 7-continued

| Dopant Compound No. | Driving Voltage Voltage (V) | Current density (mA/cm²) | Max Current efficiency (cd/A) | Max EQE (%) | Roll-off ratio (%) | Maximum emission wavelength (nm) | FWHM (nm) | Color coordinate (CIEx) |
|---|---|---|---|---|---|---|---|---|

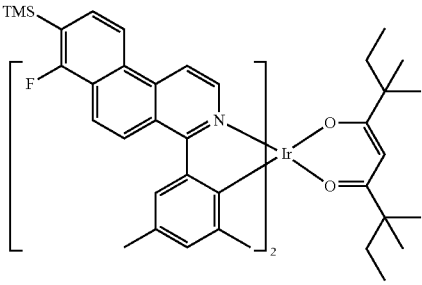

16

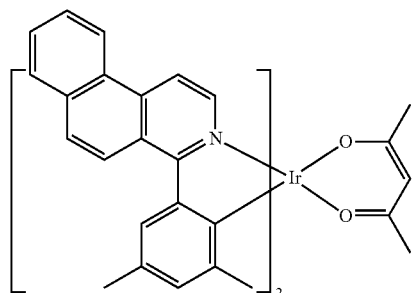

A

From Table 6, it is confirmed that a maximum emission wavelength of the organic light-emitting device manufactured according to Example 1-1 is similar to a maximum emission wavelength of the organic light-emitting device manufactured according to Comparative Example 1-A, and the organic light-emitting device manufactured according to Example 1-1 emits red light having excellent color purity and a relatively narrow FWHM and has excellent driving voltage, excellent current density, excellent current efficiency, excellent EQE, and excellent roll-off ratio, compared to the organic light-emitting device manufactured according to Comparative Example 1-A.

Additionally, from Table 7, it is confirmed that organic light-emitting devices manufactured according to Examples 1-2 to 1-7 emit red light having excellent color purity, a relatively narrow FWHM, and a maximum emission wavelength having 620 nm or more and have excellent driving voltage, excellent current density, excellent current efficiency, excellent EQE, and excellent roll-off ratio.

Example 2-1 (Solution Process)

As an anode, a hydrophobic pixel-defining pattern was formed on a glass substrate on which ITO was deposited to a thickness of 1,500 Å, cut to a size of 50 mm×50 mm×0.5 mm, sonicated using isopropyl alcohol and pure water each for 5 minutes, and then cleaned by exposure to ultraviolet rays and ozone for 1 minute.

On the ITO anode, 25 pl of HIL ink (PEDOT/PSS, CLEVIOS P JET 700N available from Heraeus) was provided using inkjet process and then dried in a vacuum condition, and baked for 15 minutes at 230° C. under air by using a hot plate to remove residual solvent therefrom, thereby forming a hole injection layer having a thickness of 150 Å.

On the hole injection layer, 90 pl of HTL ink (TFB, ADS259BE available from American Dye Source) was provided using inkjet process and then dried in a vacuum condition, and baked for 30 minutes at 230° C. under $N_2$ atmosphere by using a hot plate to remove residual solvent therefrom, thereby forming a hole transport layer having a thickness of 800 Å.

On the hole transport layer, 60 pl of EML ink (wherein methylbenzoate is included as a solvent, a total amount of a host and a dopant is 1 wt % per 100 wt % of EML ink, and a host and a dopant are mixed at a weight ratio of 95:5) including a mixture of Compound H53 and H54 (host) and Compound 1 (dopant) was provided using an inkjet process and then dried in a vacuum condition, and baked for 10 minutes at 130° C. under $N_2$ atmosphere by using a hot plate to remove residual solvent therefrom, thereby forming an emission layer having a thickness of 400 Å.

BCP was vacuum-deposited on the emission layer to form a hole blocking layer having a thickness of 50 Å, $Alq_3$ was vacuum-deposited on the hole blocking layer to form an electron transport layer having a thickness of 350 Å, LiF was vacuum-deposited on the electron transport layer to form an electron injection layer having a thickness of 10 Å, and Mg and Ag were co-deposited at a weight ratio of 90:10 on the electron injection layer to form a cathode having a thickness of 120 Å, thereby completing the manufacture of an organic light-emitting device (emitting red light).

Comparative Example 2-A

An organic light-emitting device was manufactured in the same manner as in Example 2-1, except that Compound A was used instead of Compound 1 as a dopant in forming an emission layer.

Evaluation Example 5: Characteristic Evaluation of Organic Light-Emitting Device (Solution Process)

The driving voltage, current efficiency, external quantum efficiency (EQE), emission peak wavelength of an EL spectrum, full width at half maximum (FWHM) of an EL spectrum, and CIE x coordinate of each organic light-emitting device manufactured according to Example 2-1 and Comparative Example 2-A were evaluated using the same method as the method described in Evaluation Example 4, and results thereof are shown in Table 8.

TABLE 8

| Dopant Compound No. | Driving Voltage (V) | Current Efficiency (cd/A) | Max EQE (%) | Maximum emission wavelength (nm) | FWHM (nm) | Color coordinate (CIEx) |
| --- | --- | --- | --- | --- | --- | --- |
| Example 2-1 | 1 | 8.0 | 15.5 | 15.12 | 617 | 47.0 | 0.665 |
| Comparative Example 2-A | A | 8.2 | 14.7 | 13.07 | 616 | 57.4 | 0.661 |

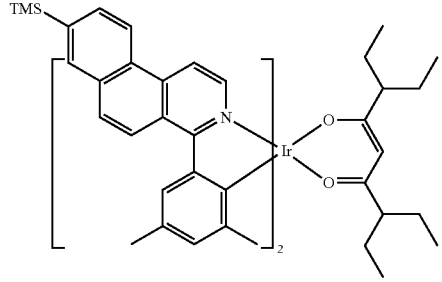

1

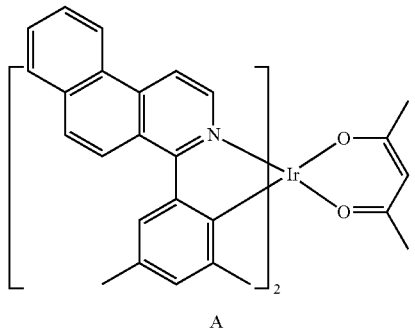

A

From Table 8, it is confirmed that organic light-emitting device manufactured according to Example 2-1 emit red light having excellent color purity and a relatively narrow FWHM and have excellent driving voltage, excellent current density, excellent current efficiency, excellent EQE, and excellent roll-off ratio, compared to organic light-emitting devices manufactured according to Comparative Example 2-A.

The organometallic compound has excellent electrical characteristics and stability. Thus, electronic device including the organometallic compound, for example, an organic light-emitting device, may have improved driving voltage, improved current efficiency, improved EQE, improved roll-off ratio, and a FWHM of an emission peak of a relatively narrow EL spectrum. Accordingly, a high-quality organic light-emitting device and electronic apparatus including the same may be implemented by using the organometallic compound.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the FIGURES, it will be understood by those of ordinary skill in the art that various changes in form and details may be made therein without departing from the spirit and scope as defined by the following claims.

What is claimed is:

1. An organometallic compound represented by Formula 1 below:

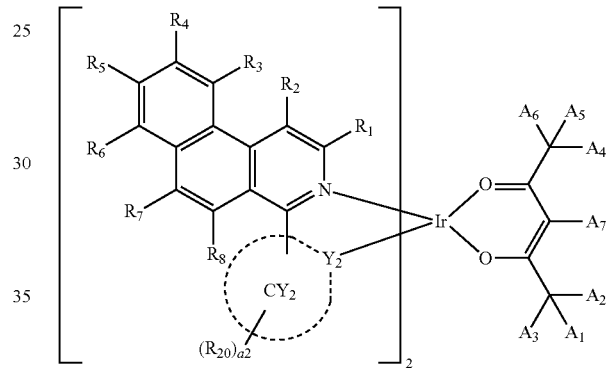

Formula 1 wherein, in Formula 1, $Y_2$ is C, a group represented by

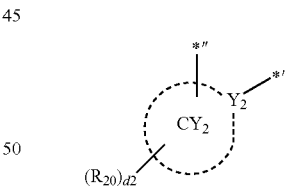

in Formula 1 is a group represented by one of Formulae A(1) to A(10),

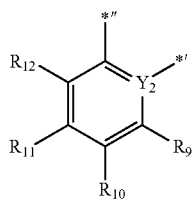

A(1)

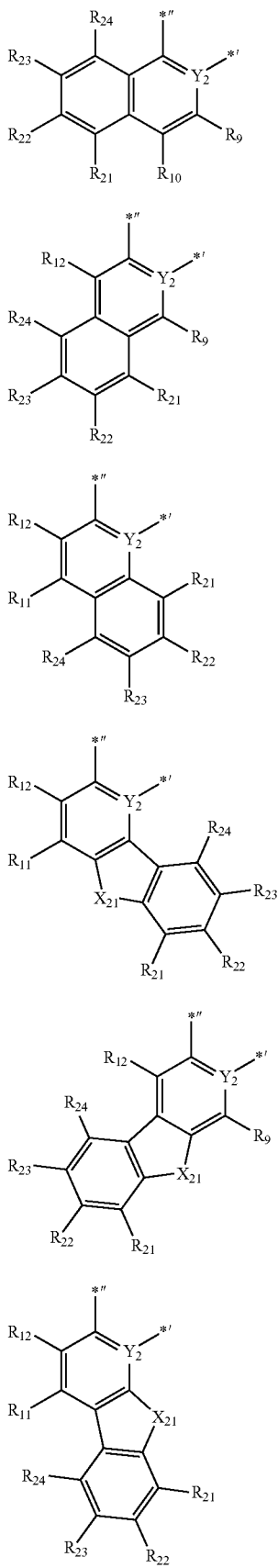

A(2)
A(3)
A(4)
A(5)
A(6)
A(7)

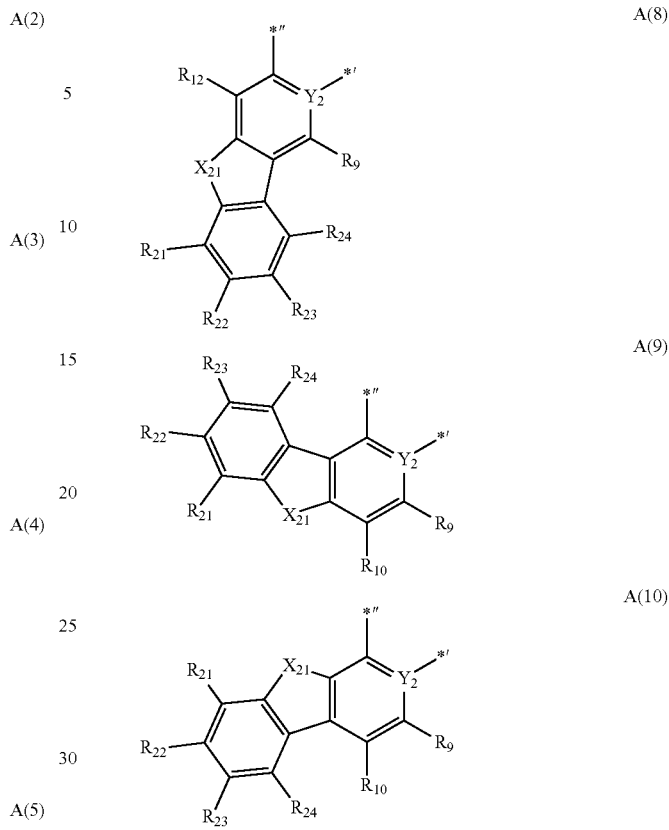

A(8)
A(9)
A(10)

wherein,

R₁₀ and R₁₂ in Formula A(1) are hydrogen,

R₉ and R₁₁ in Formula A(1) are each independently a group represented by Formula 2-2, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, $X_{21}$ in Formulae A(6) to A(10) is O, S, N($R_{25}$), or Si($R_{25}$)($R_{26}$), R₉ to R₁₂ and R₂₁ to R₂₆ in Formulae A(2) to A(10) are each independently a group represented by Formula 2-2, hydrogen, deuterium, —F, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, provided that, i) at least one of $R_9$, $R_{10}$, $R_{21}$ and $R_{24}$ in Formula A(2) is not hydrogen, ii) at least one of $R_9$, $R_{12}$, $R_{21}$ and $R_{24}$ in Formula A(3) is not hydrogen, and iii) at least one of $R_{11}$, $R_{12}$, $R_{21}$ and $R_{24}$ in Formula A(4) is not hydrogen,

*' in Formulae A(1) to A(10) is a binding site to Ir in Formula 1, and

*'' in Formulae A(1) to A(10) is a binding site to a neighboring atom in Formula 1, $R_1$ to $R_8$, and $A_1$ to $A_7$ are each independently a group represented by Formula 2-1, a group represented by Formula 2-2, hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —B(Q$_6$)(Q$_7$), —P(=O)(Q$_8$)(Q$_9$), or —P(Q$_8$)(Q$_9$),

*—Si(Z$_1$)(Z$_2$)(Z$_3$)  Formula 2-1

*—Ge(Z$_{11}$)(Z$_{12}$)(Z$_{13}$)  Formula 2-2

$Z_1$ to $Z_3$ and $Z_{11}$ to $Z_{13}$ in Formulae 2-1 and 2-2 are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$) or —P(Q$_8$)(Q$_9$), and * indicates a binding site to a neighboring atom, a2 is an integer of 0 to 20, wherein, when a2 is 2 or more, two or more of R$_{20}$(s) are identical to or different from each other, at least one of $R_3$ to $R_6$ is independently a group represented by Formula 2-1 or a group represented by Formula 2-2, two or more of $R_1$ to $R_8$ are optionally linked together to form a $C_5$-$C_{30}$ carbocyclic group unsubstituted or substituted with at least one R$_{1a}$ or a $C_1$-$C_{30}$ heterocyclic group unsubstituted or substituted with at least one R$_{1a}$, two or more R$_9$ to R$_{12}$ and R$_{21}$ to R$_{26}$ in Formulae A(2) to A(10) are optionally linked together to form a $C_5$-$C_{30}$ carbocyclic group unsubstituted or substituted with at least one Ria or a $C_1$-$C_{30}$ heterocyclic group unsubstituted or substituted with at least one R$_{1a}$, two or more of $A_1$ to $A_7$ are optionally linked together to form a $C_5$-$C_{30}$ carbocyclic group unsubstituted or substituted with at least one R$_{1a}$ or a $C_1$-$C_{30}$ heterocyclic group unsubstituted or substituted with at least one R$_{1a}$, R$_{1a}$ is the same as described in connection with $A_7$, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$) ($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The organometallic compound of claim 1, wherein $R_1$ to $R_8$, and $A_7$ in Formula 1 are each independently a group represented by Formula 2-1, a group represented by Formula 2-2, hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted phenyl group, or a substituted or unsubstituted biphenyl group, and $Z_1$ to $Z_3$ and $Z_{11}$ to $Z_{13}$ in Formula 2 are each independently hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted phenyl group, or a substituted or unsubstituted biphenyl group.

3. The organometallic compound of claim 1, wherein $R_1$ to $R_8$ and $A_7$ in Formula 1 are each independently:

a group represented by Formula 2-1 or a group represented by Formula 2-2;

hydrogen, deuterium, or —F; or a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, —F, $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated a phenyl group, a fluorinated a phenyl group, a ($C_1$-$C_{20}$ alkyl) phenyl group, a biphenyl group, a deuterated a biphenyl group, a fluorinated a biphenyl group, a ($C_1$-$C_{20}$ alkyl) biphenyl group, or any combination thereof, $R_9$ and $R_{11}$ in Formula A(1) are each independently:

a group represented by Formula 2-1 or a group represented by Formula 2-2; or a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl) $C_1$-$C_{10}$ heterocycloalkyl group, a phenyl group, a deuterated a phenyl group, a ($C_1$-$C_{20}$ alkyl) phenyl group, a biphenyl group, a deuterated a biphenyl group, a ($C_1$-$C_{20}$ alkyl) biphenyl group, or any combination thereof, and $R_9$ to $R_{12}$ and $R_{21}$ to $R_{26}$ in Formulae A(2) to A(10) are each independently:

a group represented by Formula 2-1 or a group represented by Formula 2-2;

hydrogen, deuterium, or —F; or a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, —F, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl) $C_1$-$C_{10}$ heterocycloalkyl group, a phenyl group, a deuterated a phenyl group, a ($C_1$-$C_{20}$ alkyl) phenyl group, a biphenyl group, a deuterated a biphenyl group, a ($C_1$-$C_{20}$ alkyl) biphenyl group, or any combination thereof.

4. The organometallic compound of claim 1, wherein at least one of $R_3$ to $R_6$ in Formula 1 is a group represented by Formula 2-2.

5. The organometallic compound of claim 1, wherein at least one of $R_3$ and $R_5$ in Formula 1 is independently a group represented by Formula 2-1 or a group represented by Formula 2-2.

6. The organometallic compound of claim 1, wherein, at least one of the $R_3$ to $R_6$ which is not the group represented by Formula 2-1 or Formula 2-2 is independently:

—F; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, or a fluorinated a biphenyl group, each unsubstituted or substituted with deuterium, —F, $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated a phenyl group, a fluorinated a phenyl group, a ($C_1$-$C_{20}$ alkyl)phenyl group, a biphenyl group, a deuterated a biphenyl group, a fluorinated a biphenyl group, a ($C_1$-$C_{20}$ alkyl) biphenyl group, or any combination thereof.

7. The organometallic compound of claim 1, wherein, at least one of $R_3$ to $R_6$ which is not the group represented by Formula 2-1 or Formula 2-2 is each independently:

deuterium; or a deuterated $C_1$-$C_{20}$ alkyl group, a deuterated $C_3$-$C_{10}$ cycloalkyl group, a deuterated $C_1$-$C_{10}$ heterocycloalkyl group, a deuterated a phenyl group, or a deuterated a biphenyl group, each unsubstituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl) $C_1$-$C_{10}$ heterocycloalkyl group, a phenyl group, a deuterated a phenyl group, a ($C_1$-$C_{20}$ alkyl) phenyl group, a biphenyl group, a deuterated a biphenyl group, a ($C_1$-$C_{20}$ alkyl) biphenyl group, or any combination thereof.

8. The organometallic compound of claim 1 wherein, at least one of $R_3$ to $R_6$ which is not the group represented by Formula 2-1 or Formula 2-2 is each independently:

hydrogen; or a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with a $C_1$-$C_{20}$ alkylgroup, a $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a ($C_1$-$C_{20}$ alkyl)$C_1$-$C_{10}$ heterocycloalkyl group, a phenyl group, a ($C_1$-$C_{20}$ alkyl) phenyl group, a biphenyl group, a ($C_1$-$C_{20}$ alkyl)biphenyl group, or any combination thereof.

9. The organometallic compound of claim 1, wherein the organometallic compound satisfies at least one of Condition 1 to Condition 3:

Condition 1

$A_1$ to $A_6$ in Formula 1 are each independently a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group, Condition 2 at least one of $A_1$ to $A_6$ in Formula 1 is a substituted or unsubstituted $C_2$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group, and Condition 3

$A_7$ in Formula 1 is deuterium, —F, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

10. The organometallic compound of claim 1, wherein the organometallic compound satisfies at least one of Condition 4 and Condition 5:

Condition 4 two or more of $A_1$ to $A_3$ in Formula 1 are linked together, and thus a group represented by *—C($A_1$)($A_2$)($A_3$) is a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, and Condition 5 two or more of $A_4$ to $A_6$ in Formula 1 are linked together, and thus a group represented by *—C($A_4$)($A_5$)($A_6$) is a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$.

11. The organometallic compound of claim 1, wherein a group represented by

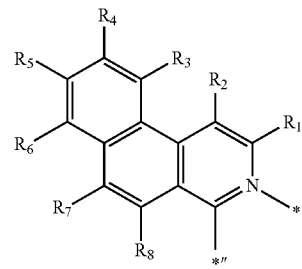

in Formula 1 is a group represented by one of Formulae CY1 to CY24, CY41 to CY48 and CY57 to CY108

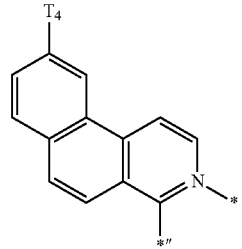

CY1

CY2 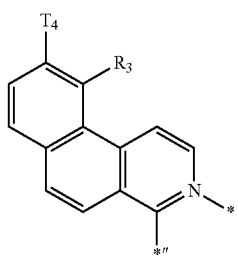
CY3 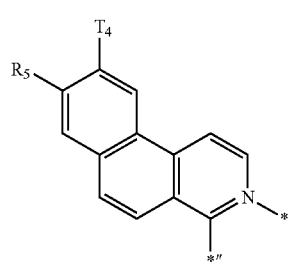
CY4 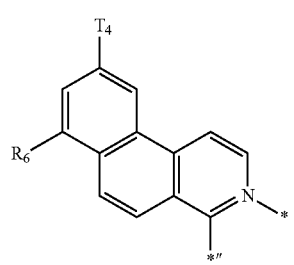
CY5 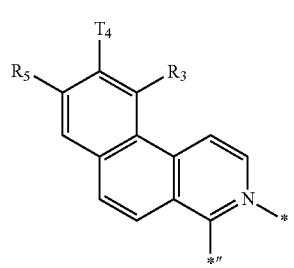
CY6 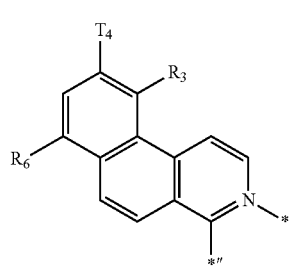
CY7 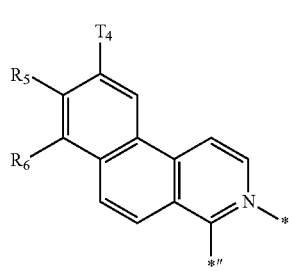
CY8 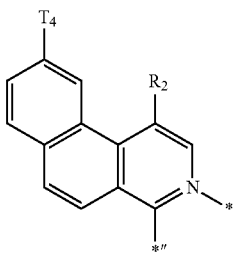
CY9 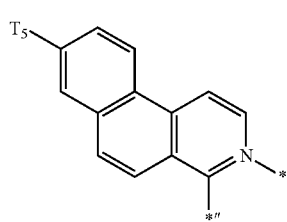
CY10 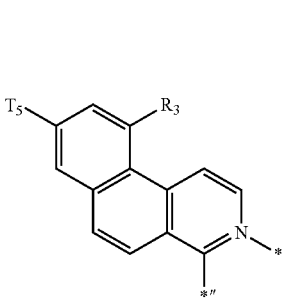
CY11 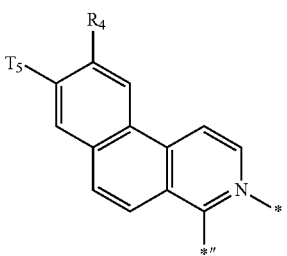
CY12 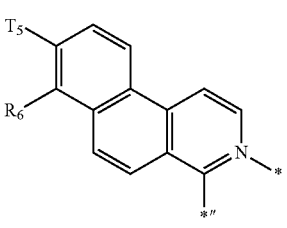
CY13 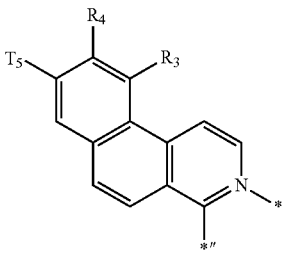

-continued
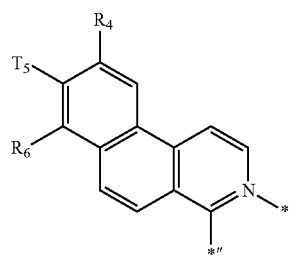
CY14
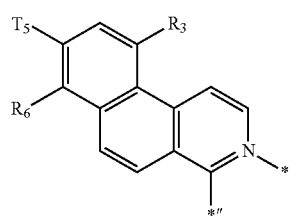
CY15
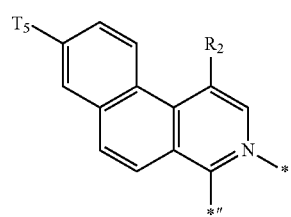
CY16
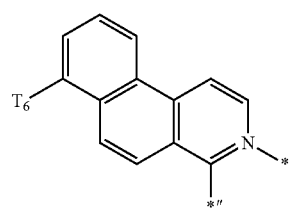
CY17
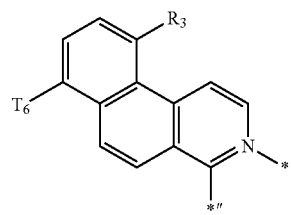
CY18
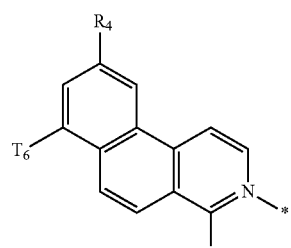
CY19
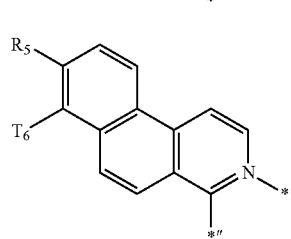
CY20
-continued
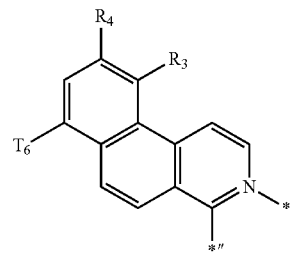
CY21
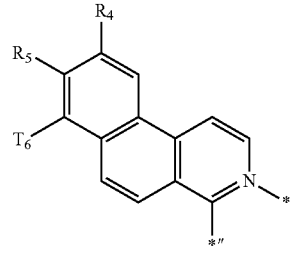
CY22
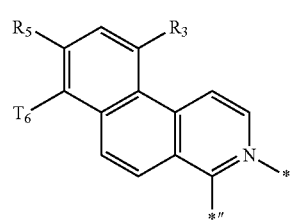
CY23
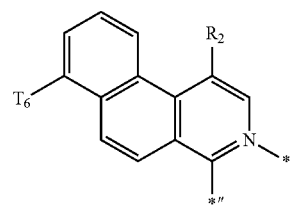
CY24
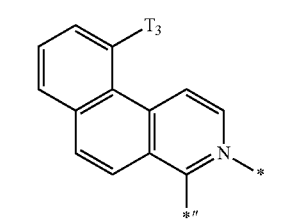
CY41
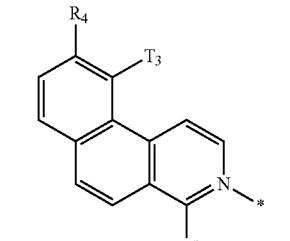
CY42
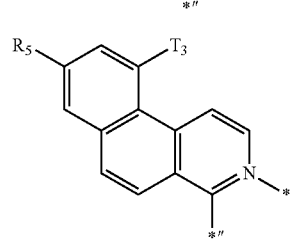
CY43

CY44, CY45, CY46, CY47, CY48, CY57, CY58, CY59, CY60, CY61, CY62, CY63

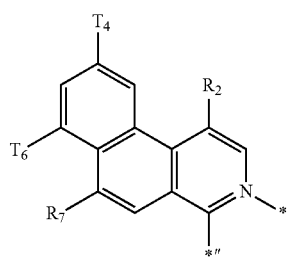
CY64
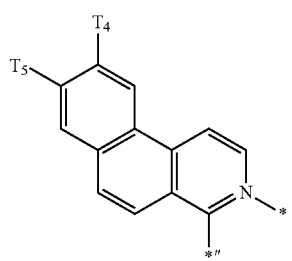
CY65
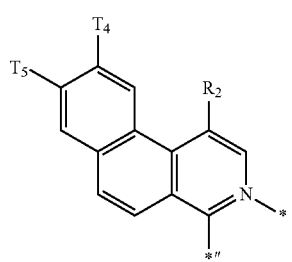
CY66
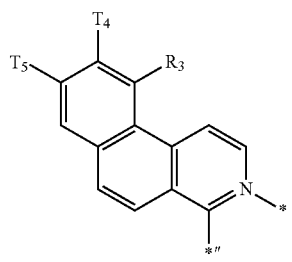
CY67
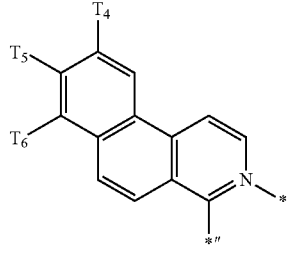
CY68
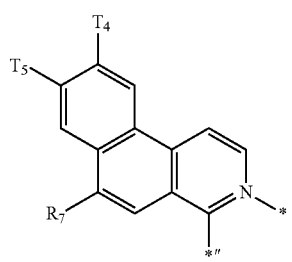
CY69
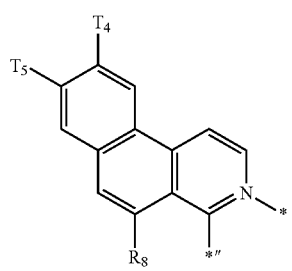
CY70
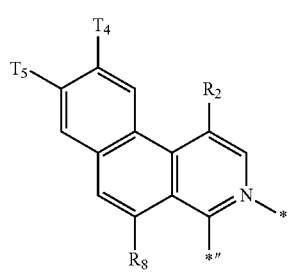
CY71
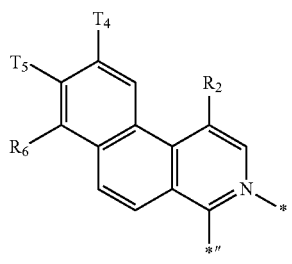
CY72
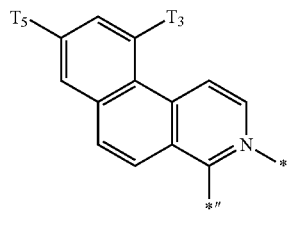
CY73
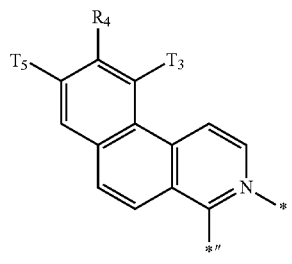
CY74
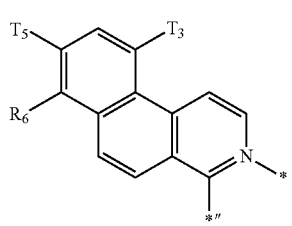
CY75

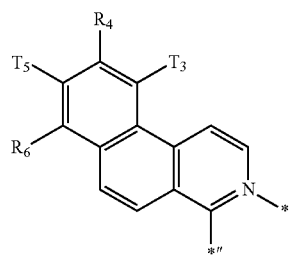 CY76
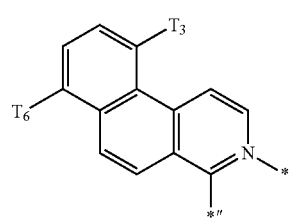 CY77
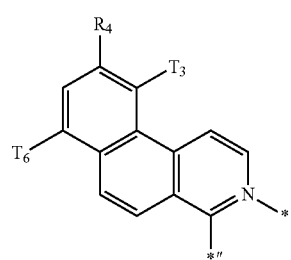 CY78
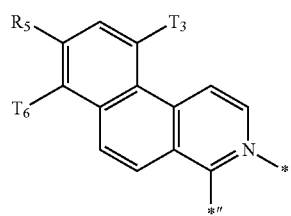 CY79
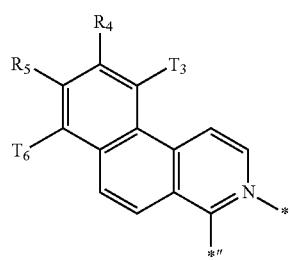 CY80
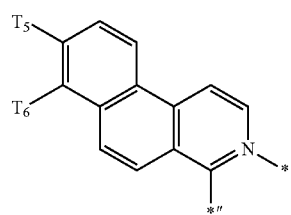 CY81
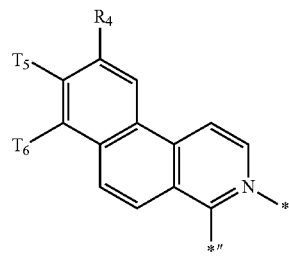 CY82
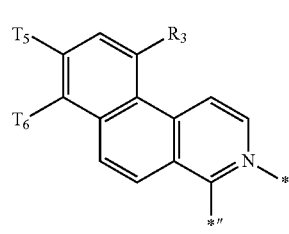 CY83
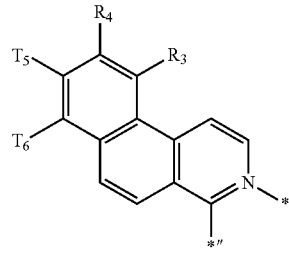 CY84
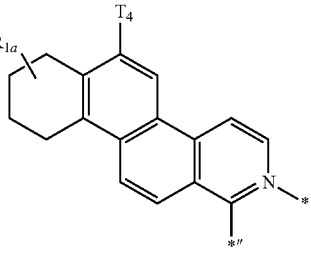 CY85
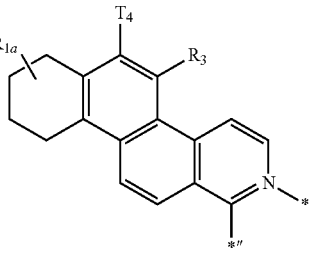 CY86
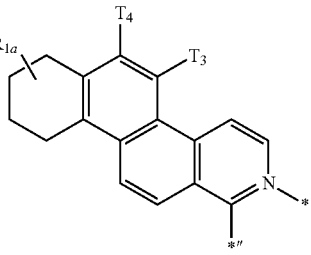 CY87

CY88 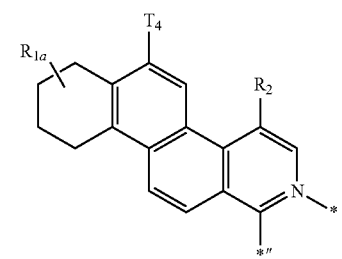
CY89 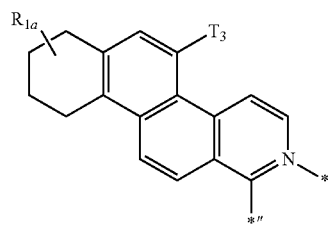
CY90 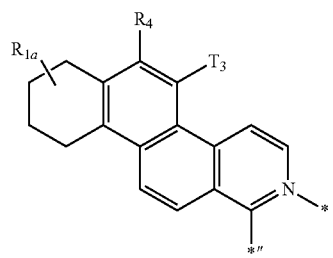
CY91 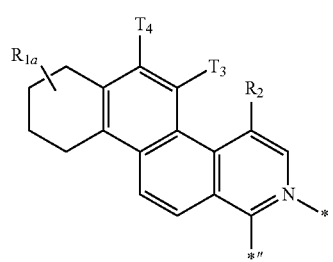
CY92 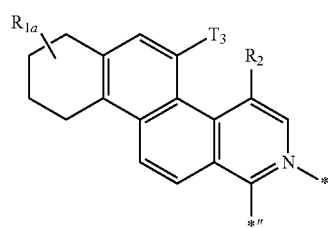
CY93 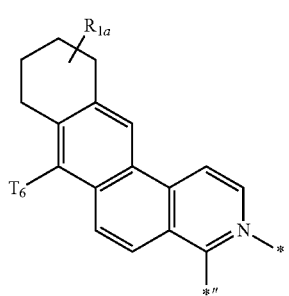
CY94 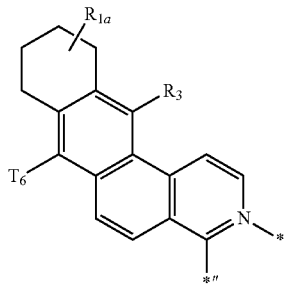
CY95 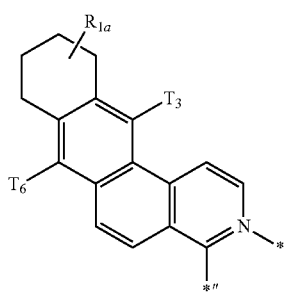
CY96 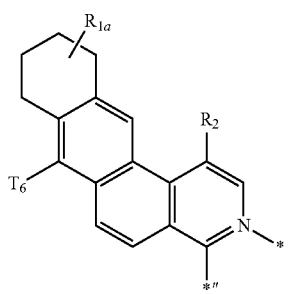
CY97 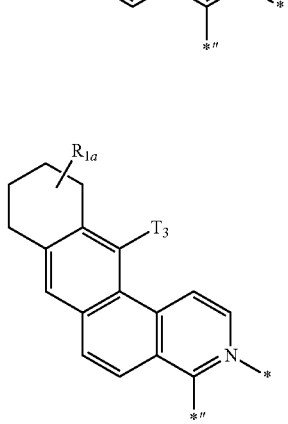
CY98 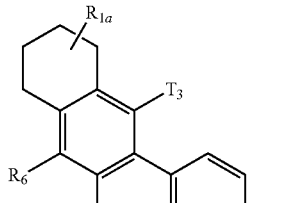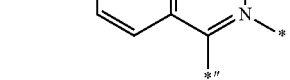

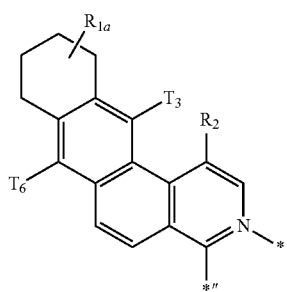
CY99
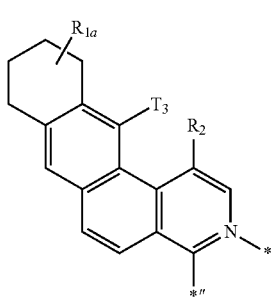
CY100
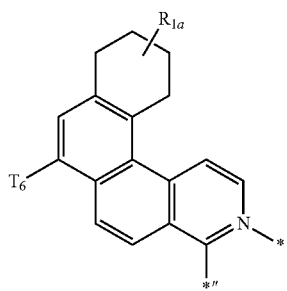
CY101
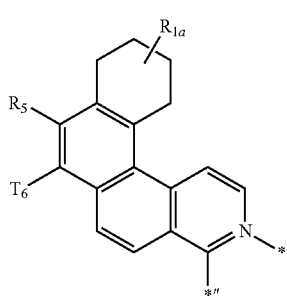
CY102
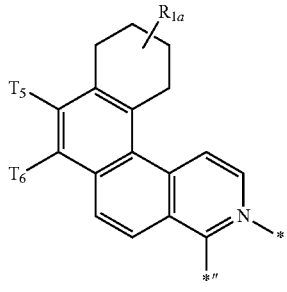
CY103
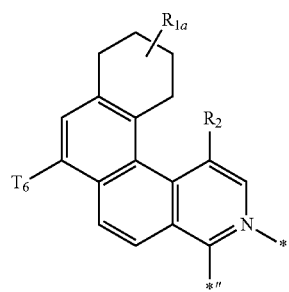
CY104
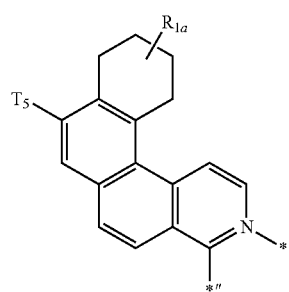
CY105
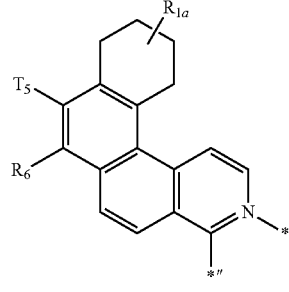
CY106
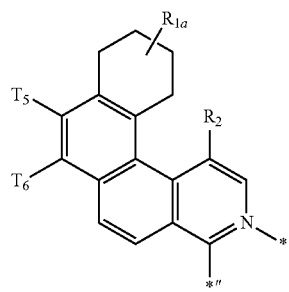
CY107
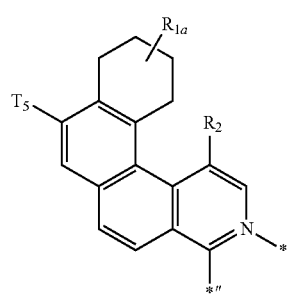
CY108
wherein, in Formulae CY1 to CY24, CY41 to CY48, and CY57 to CY108,
$T_3$ to $T_6$ are each independently a group represented by Formula 2-1 or a group represented by Formula 2-2, $R_2$ to $R_{22}$ and $R_{1a}$ are the same as described in claim 1, and $R_2$ to $R_8$ are not hydrogen, \* is a binding site to Ir in Formula 1, and \*''' is a binding site to a neighboring atom in Formula 1.

12. The organometallic compound of claim 11, wherein a group represented by

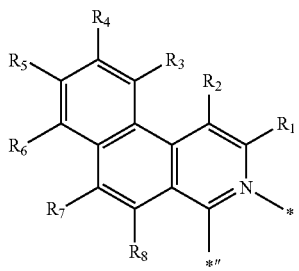

in Formula 1 is a group represented by Formula CY9, CY11, CY12, CY14, or CY76.

13. The organometallic compound of claim 1, wherein $R_9$ and $R_{11}$ in Formula A(1) are each independently: a $C_1$-$C_{20}$ alkyl group or a deuterated $C_1$-$C_{20}$ alkyl group.

14. The organometallic compound of claim 1, wherein the organometallic compound is at least one of Compounds 1 to 8, 10 and 12 to 16 below:

1

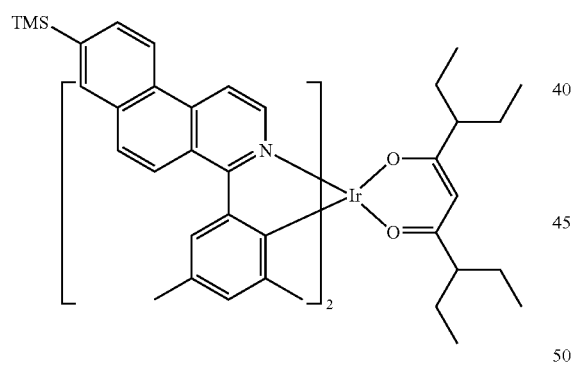

2

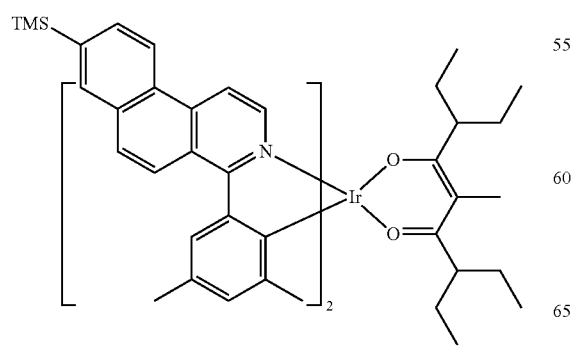

3

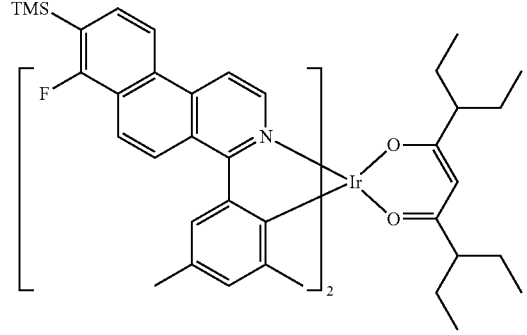

4

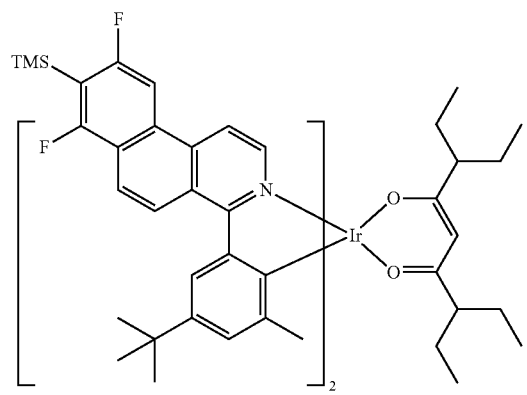

5

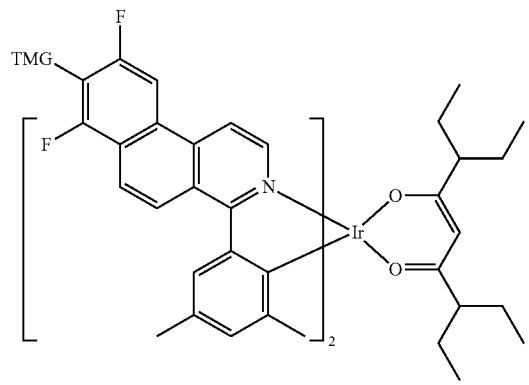

6

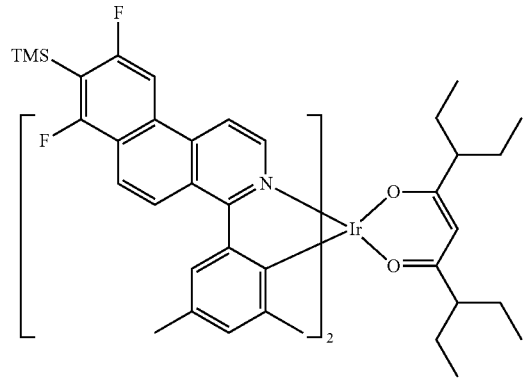

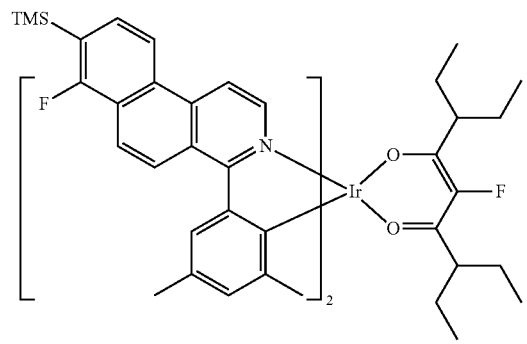
7
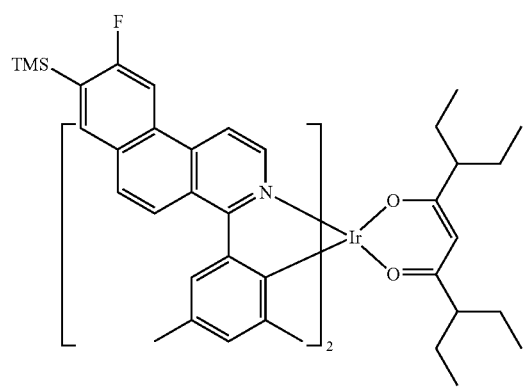
8
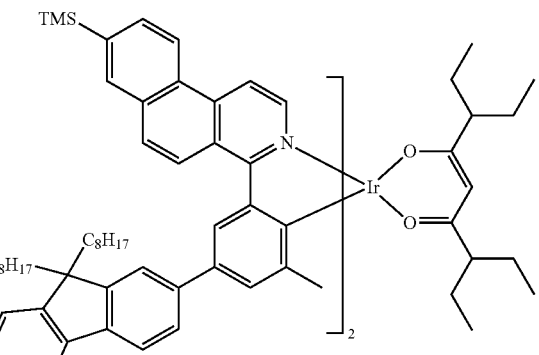
10
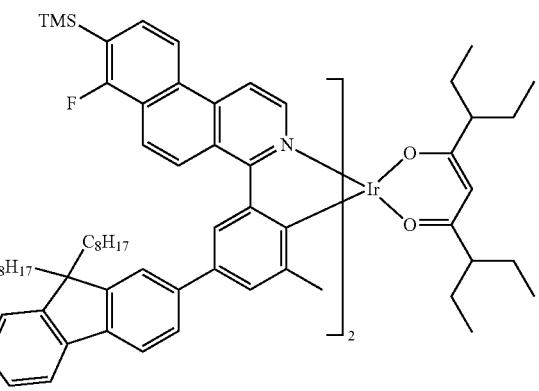
12
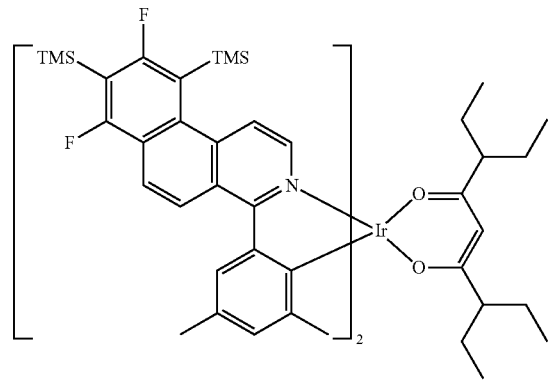
13
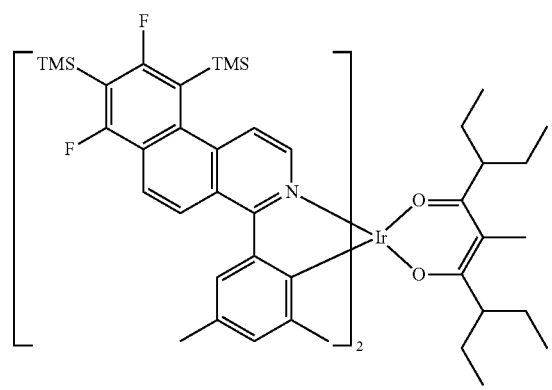
14
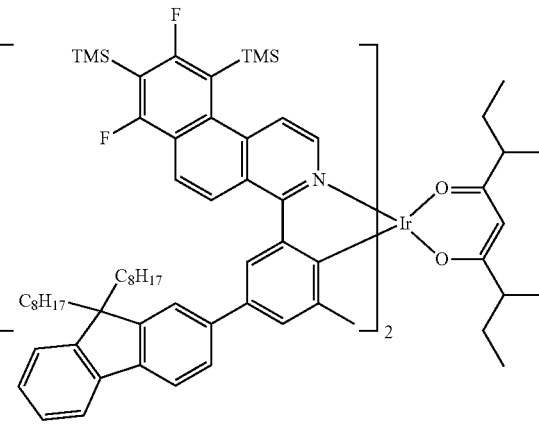
15
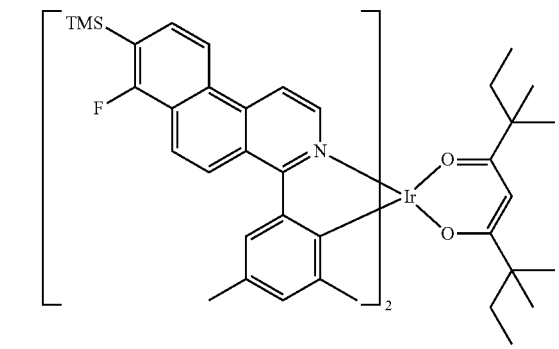
16

15. An organic light-emitting device comprising:
a first electrode;
a second electrode; and
an organic layer disposed between the first electrode and the second electrode and comprising an emission layer,
wherein the organic layer comprises at least one organometallic compound of claim 1.

16. The organic light-emitting device of claim 15, wherein
the first electrode is an anode,
the second electrode is a cathode,
the organic layer further comprises a hole transport region between the first electrode and the emission layer and an electron transport region between the emission layer and the second electrode,
the hole transport region comprises a hole injection layer, a hole transport layer, an electron blocking layer, a buffer layer, or any combination thereof, and
the electron transport region comprises a hole blocking layer, an electron transport layer, an electron injection layer, or any combination thereof.

17. The organic light-emitting device of claim 15, wherein the organometallic compound is included in the emission layer.

18. An electronic apparatus comprising the organic light-emitting device of claim 15.

* * * * *